United States Patent [19]

Holcomb

[11] Patent Number: 4,910,859
[45] Date of Patent: Mar. 27, 1990

[54] CIRCUIT ASSEMBLY SYSTEM

[76] Inventor: Gregory W. Holcomb, 13 Viento, Irvine, Calif. 92714

[21] Appl. No.: 326,459

[22] Filed: Mar. 20, 1989

Related U.S. Application Data

[63] Continuation of Ser. No. 734,964, May 16, 1985, abandoned, which is a continuation-in-part of Ser. No. 597,477, Apr. 6, 1984, abandoned.

[51] Int. Cl.$^4$ .......................... B21F 1/02; H05K 3/30
[52] U.S. Cl. .................... 29/564.2; 29/741; 29/838; 140/147; 901/41
[58] Field of Search .............. 140/105, 140, 147; 29/34 D, 566.1, 566.2, 564.2, 739, 741, 838, 844, 845; 227/76, 84; 83/580, 925 R; 901/41

[56] References Cited

U.S. PATENT DOCUMENTS

| | | | |
|---|---|---|---|
| 2,893,010 | 7/1959 | Stuhre | 1/210 |
| 3,167,779 | 2/1965 | Ahearn | 1/120 |
| 3,396,758 | 8/1968 | Hall | 140/1 |
| 3,414,024 | 12/1968 | Anderson et al. | 140/1 |
| 3,429,170 | 2/1969 | Romeo | 72/325 |
| 3,435,857 | 4/1969 | Ragard et al. | 140/71 |
| 3,515,175 | 6/1970 | Hudson | 140/1 |
| 3,519,033 | 7/1970 | Pepin | 140/1 |
| 3,664,016 | 5/1972 | Sevc et al. | 29/407 |
| 3,779,291 | 12/1973 | Yeo | 140/147 |
| 3,852,865 | 12/1974 | Ragard | 29/56.6 |
| 3,986,533 | 10/1976 | Woodman | 140/105 |
| 4,125,136 | 11/1978 | Olcese et al. | 140/105 |
| 4,135,558 | 1/1979 | Ragard et al. | 140/105 |
| 4,138,785 | 2/1979 | Dearborn | 29/741 |
| 4,151,637 | 5/1979 | Zemek et al. | 29/566.1 |
| 4,153,082 | 5/1979 | Foley | 140/105 |
| 4,218,817 | 8/1980 | Takano | 29/741 |
| 4,245,385 | 1/1981 | Zemek et al. | 29/564.8 |
| 4,288,914 | 9/1981 | Vancelette | 29/741 |
| 4,309,808 | 1/1982 | Dean et al. | 29/566.3 |
| 4,356,619 | 11/1982 | Snyder et al. | 29/566.3 |
| 4,377,026 | 3/1983 | Whitley | 29/564.1 |
| 4,387,506 | 6/1983 | Wright et al. | 29/741 X |
| 4,403,406 | 9/1983 | Foley | 29/721 |
| 4,425,947 | 1/1984 | Maxner et al. | 140/105 |

(List continued on next page.)

FOREIGN PATENT DOCUMENTS

| | | |
|---|---|---|
| 83306996.6 | 5/1984 | European Pat. Off. . |
| 86303711 | 10/1986 | European Pat. Off. . |
| 2120583 | 12/1983 | United Kingdom ................. 29/741 |

OTHER PUBLICATIONS

Printed Circuit Assembly, Apr. 1987, vol. 1, No. 3, p. 8.

*Primary Examiner*—Z. R. Bilinsky
*Attorney, Agent, or Firm*—Roberts and Quiogue

[57] ABSTRACT

A circuit board assembly system is disclosed. One aspect of the system is the robotic end effector for gripping and inserting each component into the circuit board. The end effector includes a compliance mechanism which compensates for variations in body-to-lead configurations to permit components to be precisely placed without damage to the component body or leads. Another aspect of the system is a programmable lead clinching system for clinching leads of each component as the component is inserted into the circuit board. The clinching system includes a clinch element and a drive system for driving the clinch element through a predetermined series of strokes to clinch the component leads.

The system further includes a component presentation module, with a plurality of component feeder devices for feeding a number of different component types, and a presentation robot for sequentially selecting each component to be inserted in the board and delivering the component to a part presentation station. The system further includes a component lead straightening and cutting system. This latter system operates in combination with the presentation robot to straighten the leads of each component and cut the leads to a predetermined length.

The disclosed system provides a flexible component insertion capability for inserting a wide variety of component types into different types of circuit boards. The system is reconfigurable to a different product without substantial mechanical retooling.

51 Claims, 12 Drawing Sheets

U.S. PATENT DOCUMENTS

| | | | |
|---|---|---|---|
| 4,462,435 | 7/1984 | Whitley | 140/105 |
| 4,464,829 | 8/1984 | Whitley et al. | 29/741 |
| 4,481,984 | 11/1984 | Linker | 29/838 X |
| 4,500,032 | 2/1985 | Ackerman | 228/180 A |
| 4,539,740 | 9/1985 | Scranton et al. | 29/564.1 |
| 4,548,111 | 10/1985 | Tarbuck | 83/580 |
| 4,557,043 | 12/1985 | Starski | 29/741 |
| 4,610,084 | 9/1986 | Anderson et al. | 29/834 |
| 4,631,812 | 12/1986 | Young | 29/741 X |
| 4,633,584 | 1/1987 | Wright et al. | 29/741 X |
| 4,789,292 | 12/1988 | Holcomb | 414/226 |

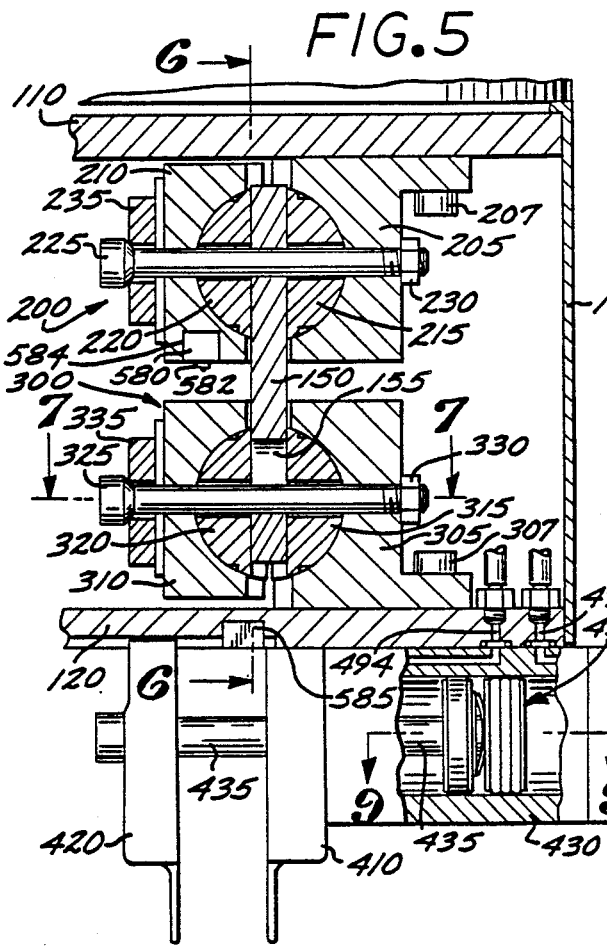
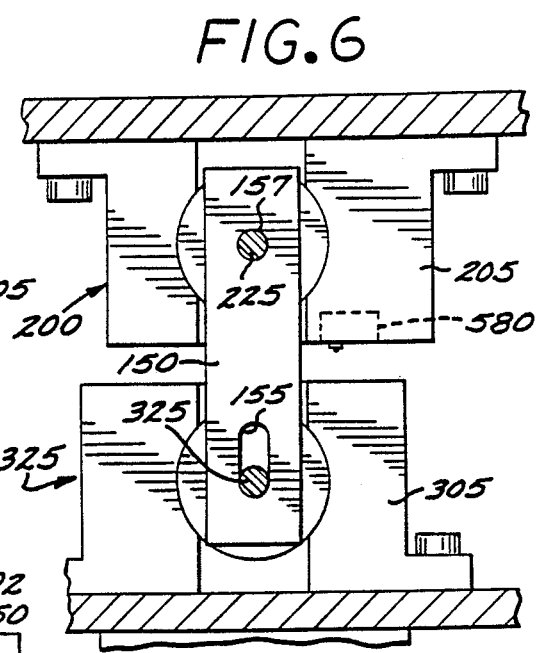
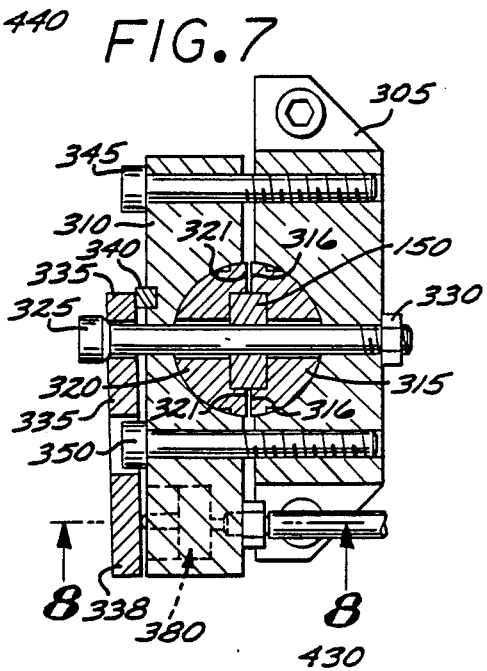
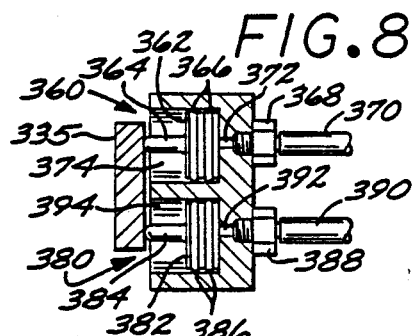
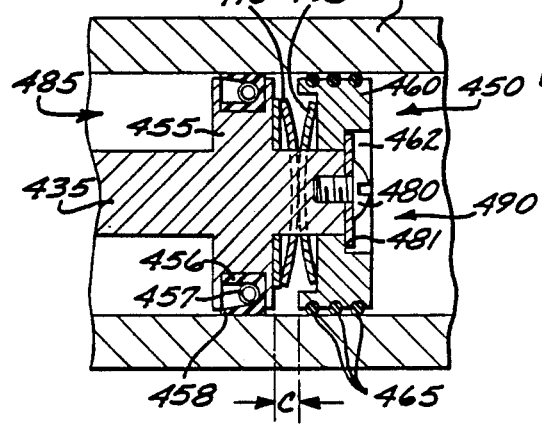
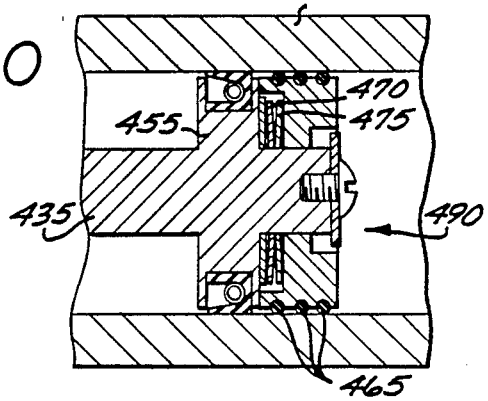

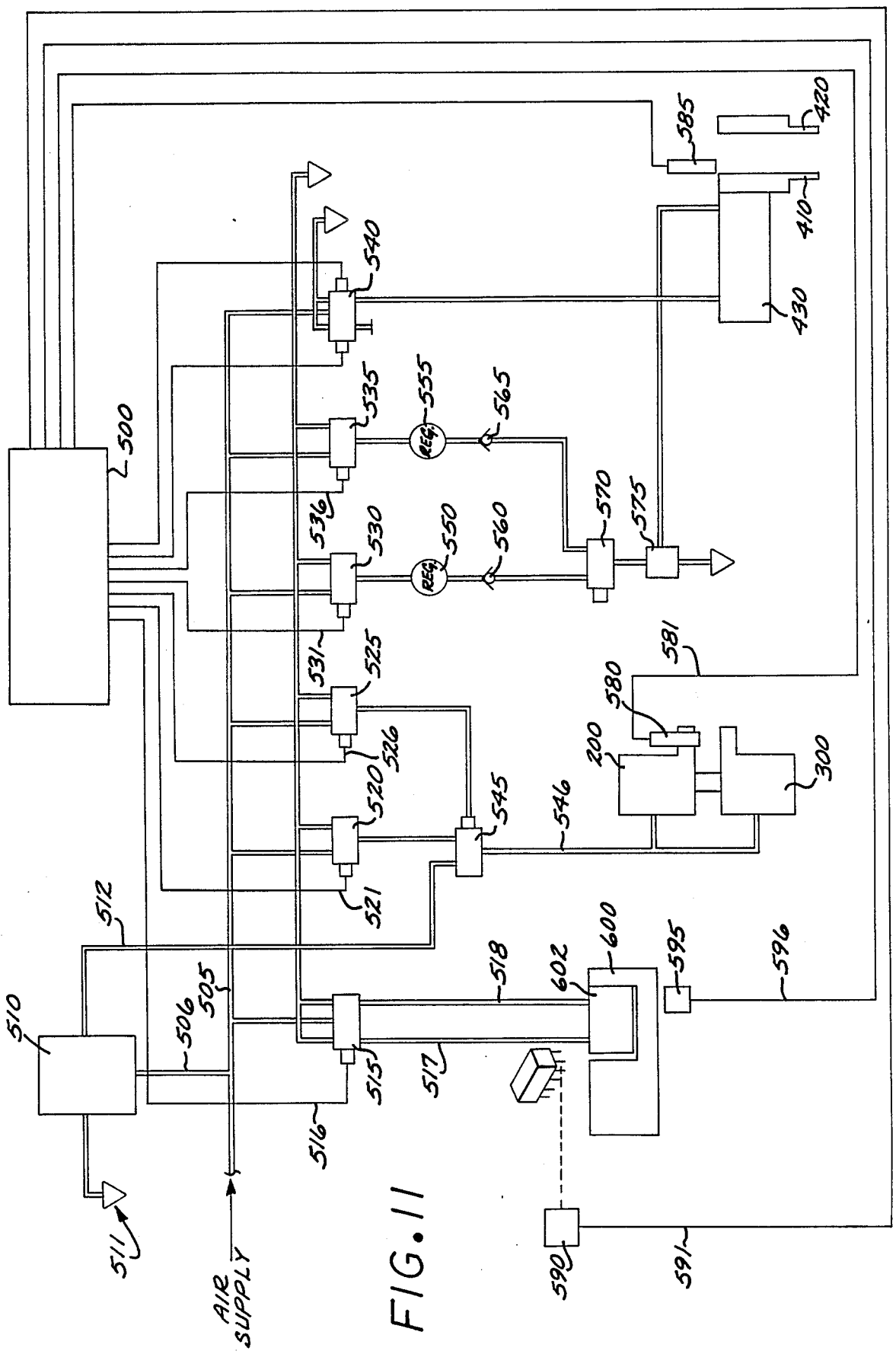

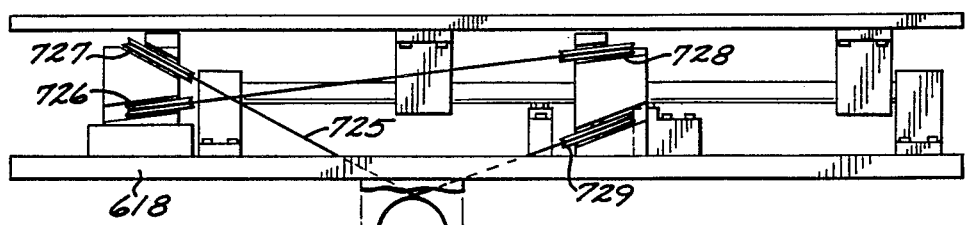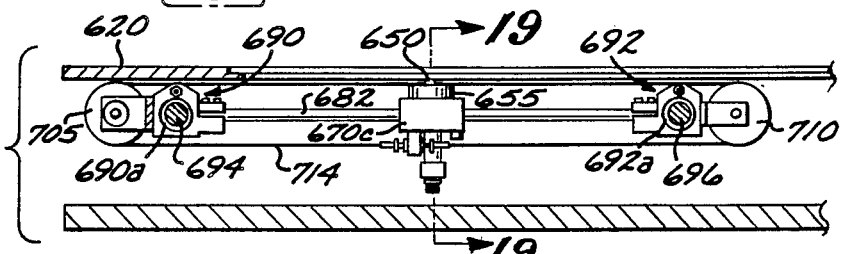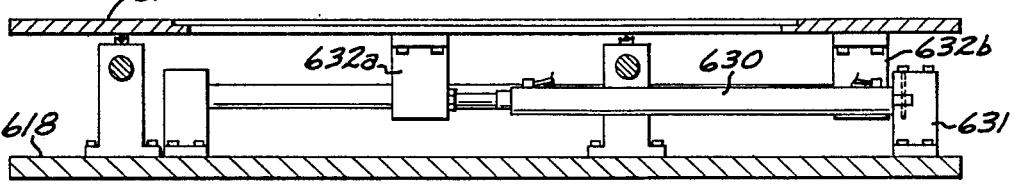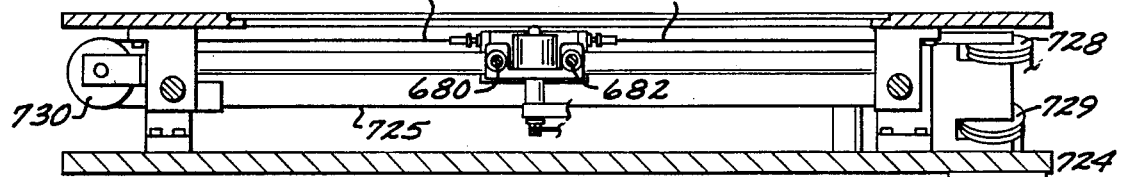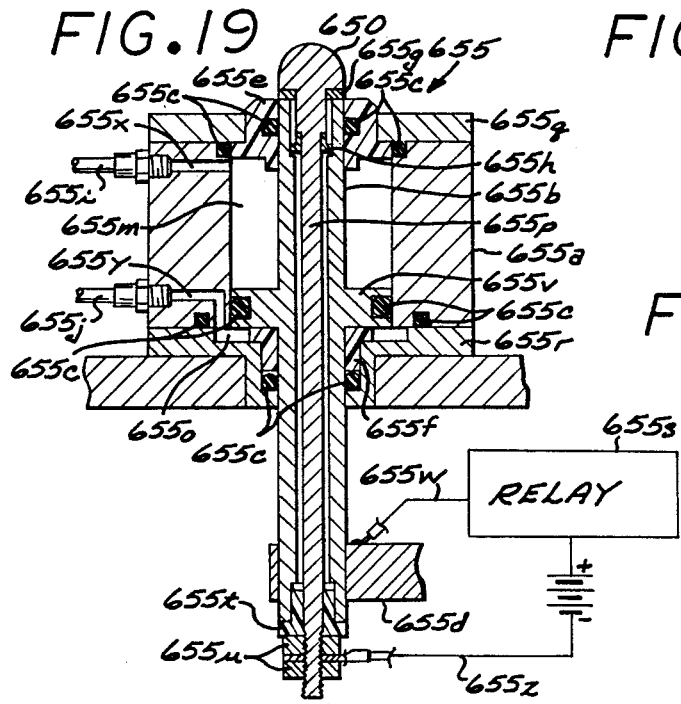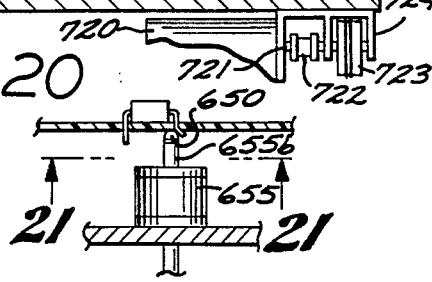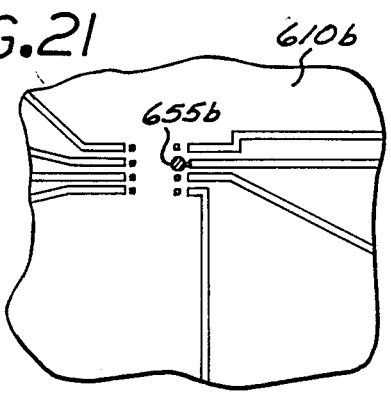

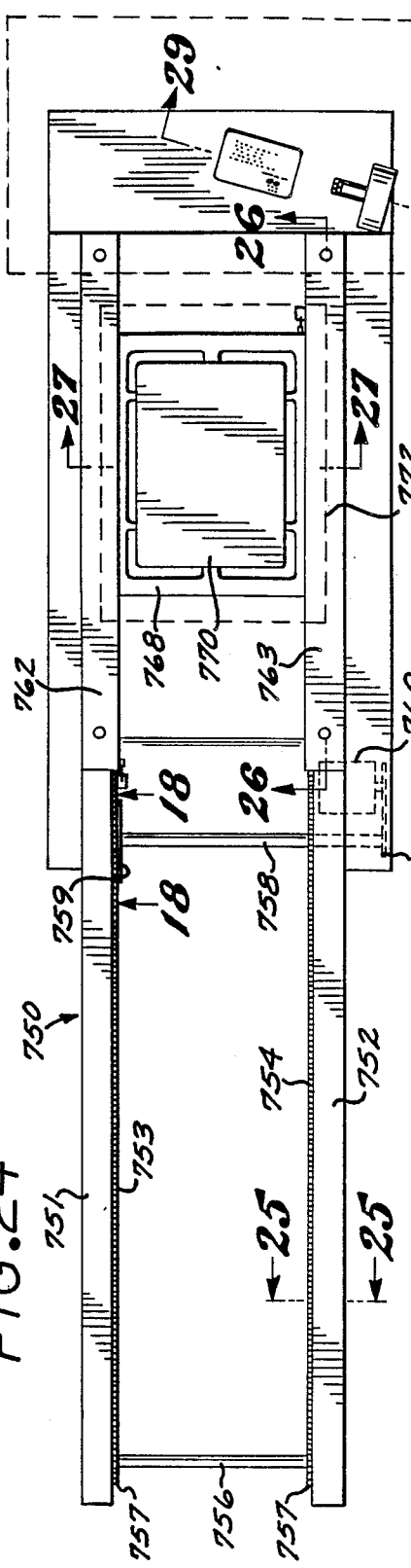
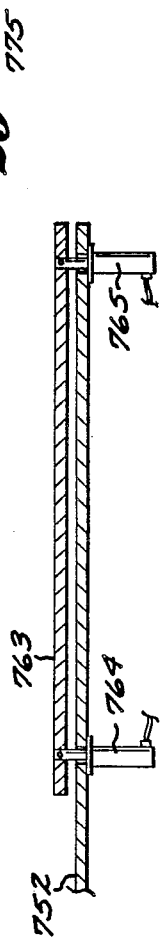
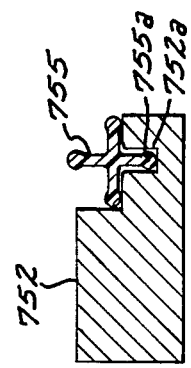

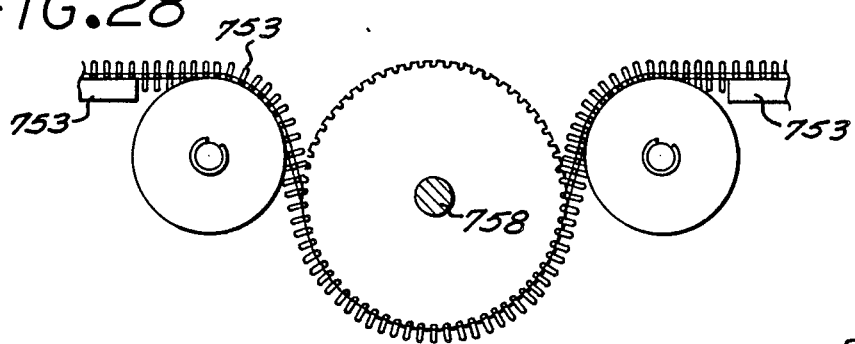
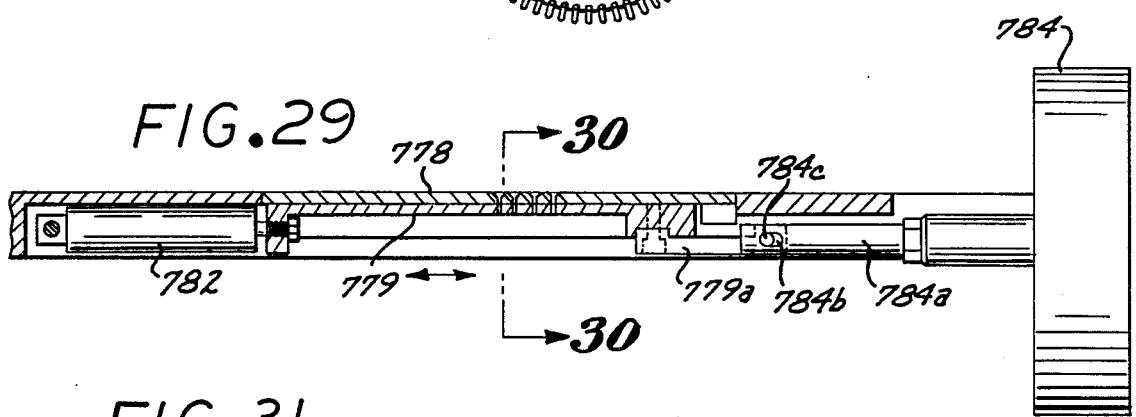
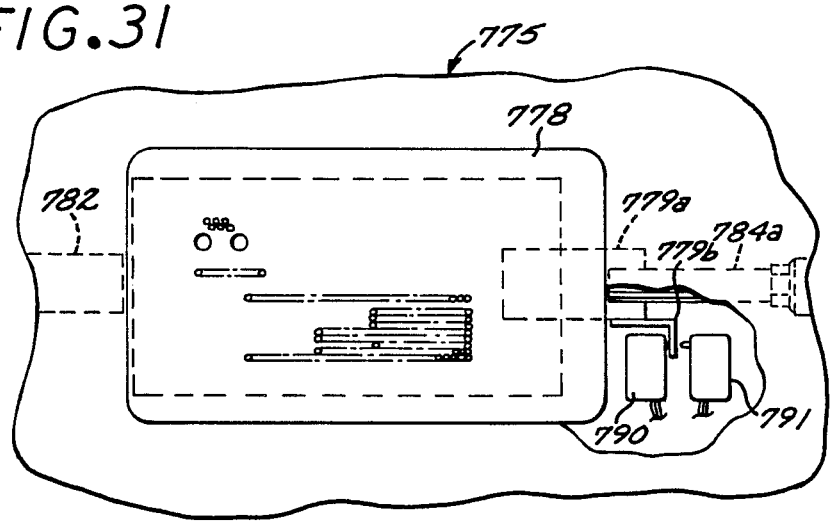
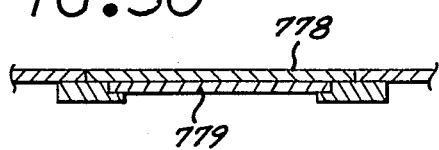
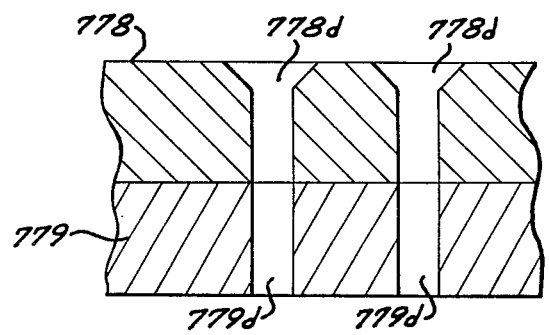

४,910,859

CIRCUIT ASSEMBLY SYSTEM

This is a continuation of co-pending application Ser. No. 06/734,964 filed on May 16, 1985, now abandoned, which is a continuation-in-part of application Ser. No. 597,477 for "End Effector for Robotic Equipment," filed Apr. 6, 1984 now abandoned.

TECHNICAL FIELD

The present invention pertains to the field of robotic equipment, and more particularly to robotic systems for assembly of electrical components with printed circuit boards.

BACKGROUND OF THE INVENTION

Robotic equipment is commonly employed in many industrial applications. In one important application, robotic equipment inserts electronic components into predetermined locations on printed circuit boards. Commonly, the boards are passed along an assembly line on a conveyor. At separate stations along the line, insertion machines insert components of the same type. The robotic equipment of the prior art are generally unable to handle more than one size or shape of components without changing or modifying the machine to accommodate the different part. Thus, a different machine station may typically be employed to insert each different sized or shaped component. This of course, greatly increases the capital equipentcost of the product insertion line, and increases the physical space needed to house and support the assembly line. For components which have nonstandard shapes and sizes and/or for which small quantities are used in the circuit, hand labor is typically employed to finish the insertion process for each board, thus further reducing the speed and efficiency by which the boards may be assembled.

The typical prior robotic equipment employs a robot arm which is adapted to be moved through a predetermined sequence of motions. An end effector is connected to the robotic arm and comprises a gripper unit which is adapted to grip each component when the robot arm moves to the component supply location, hold the component while the robot arm traverses from the supply location to the circuit board, and then to release the component when its leads have been inserted through the formed holes in the circuit board. Typically, once all the components have been inserted in the board, either by machine or by hand, the board is moved to a soldering station where the components are soldered to the board.

The prior art robotic equipment known to applicant is unable to handle components of significantly varying sizes and shapes. Thus, a different end effector may typically be required for each different type of component. Moreover, such equipment may typically have problems handling components of the same type, due to variations in the component body from the nominal size and relative to the leads. Since many components are formed from a molded or dipped material, substantial size and shape variations may be encountered, as well as variations of body to lead relationships. Thus, when substantial variations from nominal dimensions are encountered, automatic insertion may not be accomplished and rejection of the component may occur, even though the component is electrically acceptable. Another factor causing rejection of parts is bent leads. Such rejection of electrically acceptable components increases the cost of assembling the board.

Numerous mechanisms are known for automatically clinching component leads which have been inserted through apertures in printed circuit boards. Passive systems are known which move the part so that the leads strike a bending surface, to bend the leads in a manner analogous to the manner in which a paper stapler operates. Active clinchers hold the electrical component stationery, but move a die to deflect the leads in a predetermined direction. The dies employed are often jaw-like members which open and close to bend the leads. Typically, the die is particularly adapted to clinching the leads of a predetermined part type, e.g., for a dual inline integrated circuit package, and to bend or clinch all the leads aligned in a row.

In large part, the known clincher systems are expensive to manufacture and maintain, and are specialized systems for performing a single predetermined function.

SUMMARY OF THE INVENTION

A system for automatic insertion of electrical components into printed circuit boards is disclosed. The system comprises a component presentation robot for delivering a predetermined component to a presentation station, and a component insertion robot for gripping the presented component at the presentation stage, and inserting the component into the circuit board at an insertion station.

The presentation robot selects a predetermined electrical component type from one or more component storage areas, and presents the component to a presentation station, which also serves as a lead straightening and cutting station. This station comprises a pair of plates through which an opening pattern of funnel shaped openings have been formed. The lower plate is movable laterally with respect to the upper plate to provide a lead clamping and cutting function. The component presentation robot is adapted to deliver the selected component to the presentation station. The robot then inserts the component leads into corresponding opening patterns formed in the plates and oscillates the component body through a series of predetermined movements, repetitively exercising the leads in relation to the component body. The oscillatory movement is adapted to cause the lead positions to assume an averaged, straightened position.

Once the predetermined series of lead straightening movements have been carried out, the presentation robot releases the component, and the lower plate is shifted slightly with respect to the upper plate to clamp the component leads. The component insertion robot then grips the body of the component and a lead cutting operation may be performed, wherein the lower plate is shifted through a shearing movement to shear the leads extending below the first plate. The component insertion robot then inserts the component at a predetermined position on the printed circuit board.

One aspect of the invention is a programmable clinching system for clinching leads of inserted components. The clinching system comprises a retractable clinching element mounted on a motor driven carriage assembly for passing the clinching element through a predetermined path of travel adjacent the lower surface of the printed circuit board. The clincher element operates in combination with the component insertion robot so that, as each component is inserted into the board, the clincher element is passed beneath the inserted component in a clinching movement to clinch one or more of the component leads and thereby secure the inserted component in position.

The cycle comprising component presentation, lead straightening and cutting, board insertion, and lead clinching is then repeated until all components have been inserted in the board. A conveyor system is employed to transport the fully inserted board away from the insertion station, and to transport an empty board to the insertion station.

BRIEF DESCRIPTION OF THE DRAWINGS

The various, features and advantages of the disclosed invention will be readily appreciated by those skilled in the art from the following detailed disclosure when read in conjunction with the drawings, wherein:

FIG. 5 is a side cross-sectional view of the end effector of the preferred embodiment, taken along line 5—5 of FIG. 2, and a broken-away view of the air cylinder of the gripper assembly.

FIG. 6 is a cross-sectional view, taken along line 6—6 of FIG. 5 and illustrating the linkage connected upper and lower split-ball-and-socket assemblies as employed in the preferred embodiment.

FIG. 7 is a cross-sectional view of the lower split-ball-and-socket assembly, taken along line 7—7 of FIG. 5.

FIG. 8 is a cross-sectional view illustrating the dual air cylinder piston arrangement employed in the preferred embodiment to actuate the split-ball-and-socket assembly.

FIG. 9 is a cross-sectional view, taken along line 9—9 of FIG. 5, of the air cylinder actuating the gripper mechanism as employed in the preferred embodiment of the invention with the air piston assembly in the expanded position.

FIG. 10 is a cross-sectional view illustrating the gripper mechanism air piston assembly in a compressed position.

FIG. 11 is a function block diagram illustrating the pneumatic and electrical systems of the robot system of the preferred embodiment.

FIG. 15 is a front view of the apparatus of FIG. 14, in the direction of arrows 15—15 in FIG. 14.

FIG. 16 is a cross-sectional view of the apparatus of FIG. 14 taken along line 16—16 in FIG. 14.

FIG. 17 is a cross-sectional view of the apparatus of FIG. 14 taken along line 17—17 in FIG. 14.

FIG. 18 is a cross-sectional view of the apparatus of FIG. 14, taken along line 18—18 in FIG. 14.

FIG. 19 is a cross-sectional view of the clincher cylinder assembly, taken along line 19—19 of FIG. 16.

FIG. 20 is a side view of a printed circuit board with inserted component in position on the top plate of the apparatus, illustrating the clincher cylinder assembly clinching one lead of the component.

FIG. 21 is a bottom view of the printed circuit board of FIG. 20, showing the clincher rod in cross-section.

FIG. 24 is a simplified top view illustrative of the conveyor system employed in the third embodiment, showing the relationship of the insertion station and the lead straightening and cutting station.

FIG. 25 is a cross-sectional view of the side rail and conveyor chain taken through line 25—25 of FIG. 24.

FIG. 26 is a cross-sectional view, taken along line 26—26 of FIG. 24, illustrative of the clamping means for securing the position of the printed circuit board.

FIG. 27 is a cross-sectional view, taken along line 27—27 of FIG. 24, showing a printed circuit board on the conveyor in relation to the clamping means.

FIG. 28 is a cross-sectional view, taken along line 28—28 of FIG. 24, illustrating the conveyor drive sprocket and motor.

FIG. 29 is a cross-sectional view, taken along line 29—29 of FIG. 24, illustrating the lead straightener and cutting apparatus.

FIG. 30 is a partial cross-sectional view, taken along lines 30—30 of FIG. 29, showing the upper and lower lead straightening and cutting plates.

FIG. 31 is a top partial broken-away view of the lead straightening and cutting plates.

FIG. 32 is a cross-sectional view, taken along line 32—32 of FIG. 31, illustrating a pair of lead funnels defined in the lead straightening and cutting plates.

DETAILED DESCRIPTION OF THE PREFERRED EMBODIMENT

The present invention comprises a novel robotic system for insertion of electrical components into printed circuit boards. The following description of the preferred embodiment is provided to enable any person skilled in the art to make and use the invention. Various modifications to the disclosed embodiment will be readily apparent. The invention is not intended to be limited to the embodiment shown, but is to be accorded the widest scope consistent with the principles and novel features of the invention.

Figure 1:
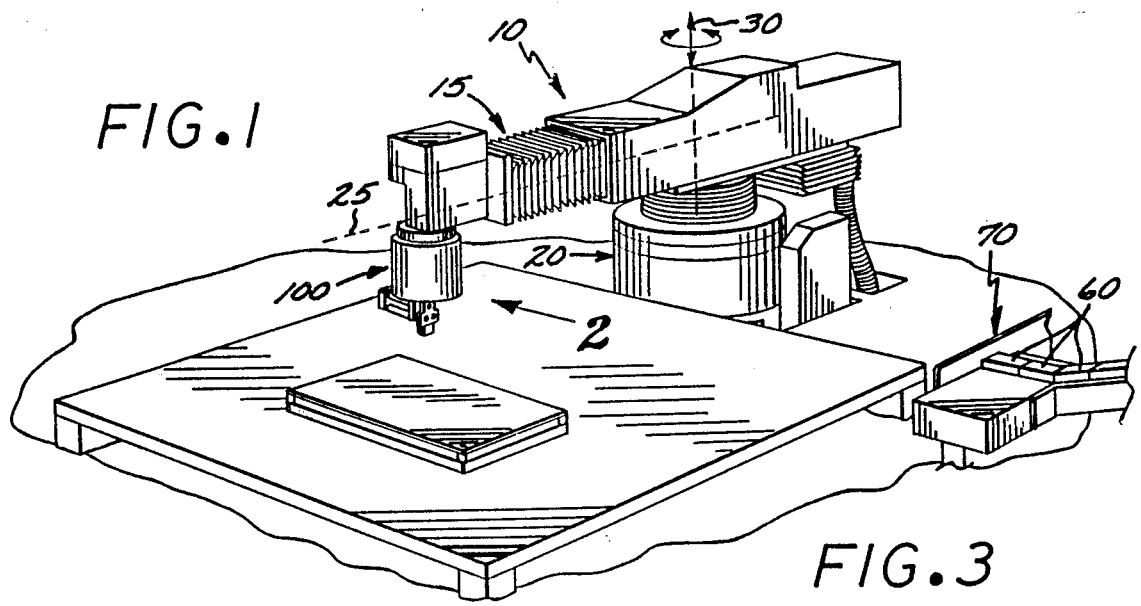
FIG. 1 is a perspective view illustrating a robotic system employing the preferred embodiment.

Referring now to FIG. 1, a perspective view is shown of components of a robotic system in accordance with the present invention. In this embodiment, robot 10 comprises a model RT-3000 robot marketed by Seiko Instruments USA Inc. This robot is a programmable, 4 axis DC servo robot with nominal positional repeatability of ±0.001 inches. Robot arm 15 extends from the robot body 20 along axis 25. The arm is selectively extensible and retractable along axis 25, and is rotatable about the center axis 30 of the robot body 20. The body 20 is also selectively extensible and retractable along axis 30 to raise and lower the arm 15.

The robot 10 also includes a central controller and a keyboard interface (not illustrated in FIG. 1) which allows the system operator to interface with the central controller. As is well known to those skilled in the art, the system controller is programmed to carry out predetermined movements and operational sequences. Thus, the controller is programmed to relate the known position of the leads of the component held at a pickup station to the known location on the circuit board at which the component is to be inserted.

The end effector is attached to the extensible end of arm 15. As is well known to those skilled in the art, the end effector is employed to interface with the components to be handled by the robotic system. The components 60 are delivered to a pick-up station 70. The robot controller is programmed to cause the robot arm to move the end effector to above the pick-up station 70, and then to lower the end effector so as to grip the next component in the conveyor line.

The pick-up station employs a pneumatically operated component lead clamping vise 600, which clamps the component leads to fix the component at the predetermined pick-up point. Thus, the position of the leads of the component at the pick up station is a known parameter. The end effector grips the component by its body, not by its leads and, therefore, any dimensional variation in the component body by the end effector will, for the prior art effector devices known to applicant, be translated into either a preload tensioning on the component leads, or bending of the leads. The result may be a failure to insert the component by the robotic system, since the leads may be offset from their nominal position a sufficient amount to prevent insertion.

The end effector in accordance with the present invention alleviates this problem. The end effector gripping mechanism is coupled to the robot arm mounting plate by a novel compliance mechanism, which allows the gripping mechanism to move through a predetermined range of movement relative to the mounting plate while the component is gripped and the gripping mechanism settles to a clamping equilibrium position on the component. The compliance mechanism is then fixed in the equilibrium position while the component is inserted in the board. The novel end effector thus provides a means for maintaining a component lead to robot mounting flange relationship, allowing accurate placement of the component leads.

Figure 2:
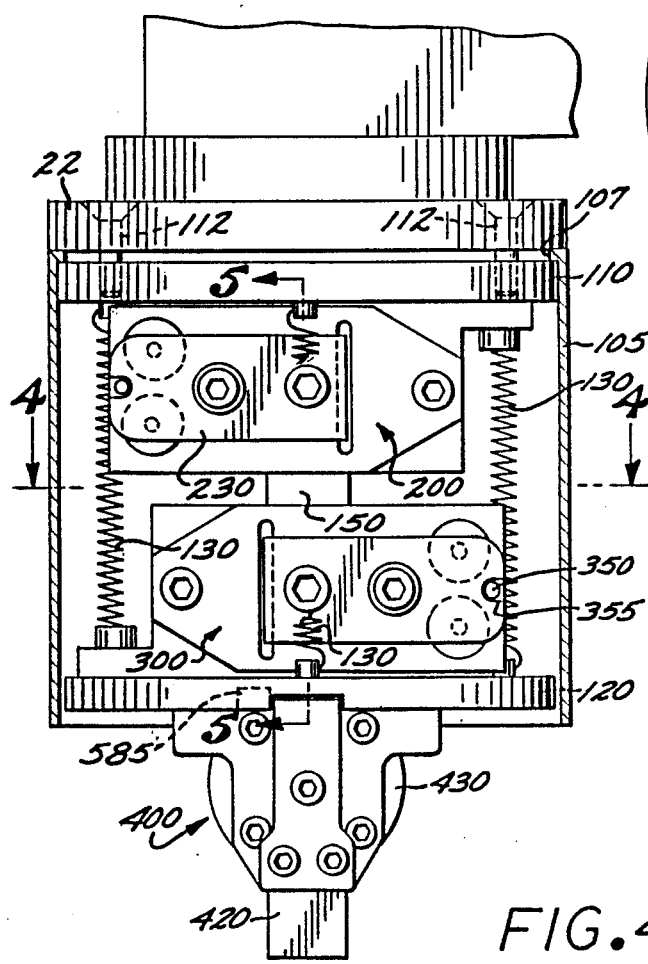
FIG. 2 is a broken away side view of the end effector unit of the preferred embodiment, taken in the direction of arrow 2 of FIG. 1 with the cylindrical cover of the effector broken away.
Figure 3:
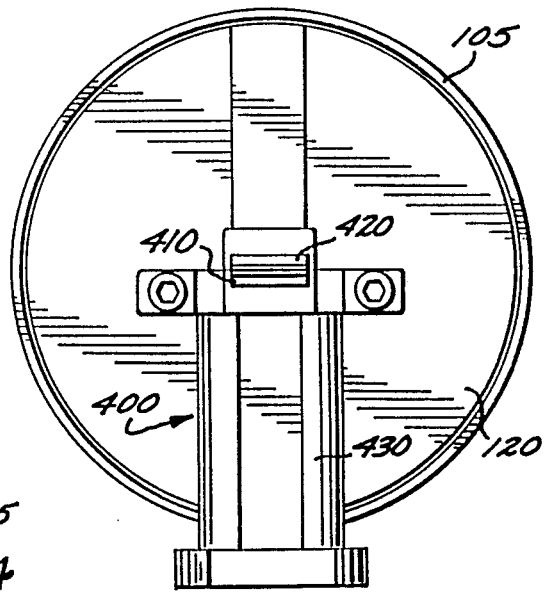
FIG. 3 is a bottom view of the end effector of the preferred embodiment.
Figure 4:
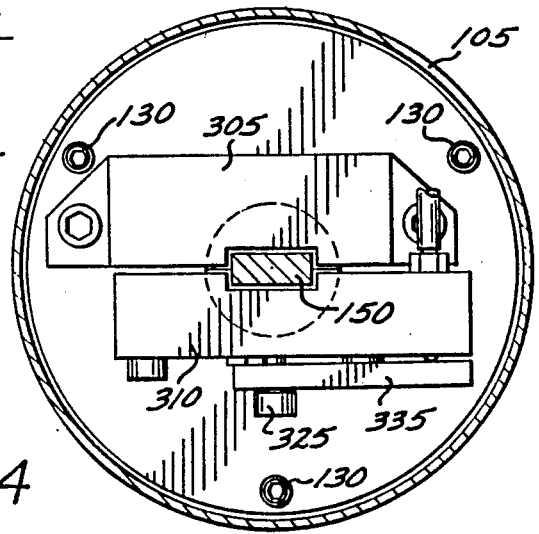
FIG. 4 is a cross-sectional top view of the end effector of the preferred embodiment, taken along line 4—4 of FIG. 2.

The novel end effector 100 is shown in greater detail in FIGS. 2-10. FIG. 2 is a side view taken in the direction of arrow 2 shown in FIG. 1, with the cylindrical shroud 105 broken away to illustrate various aspects of the device. As shown in FIG. 2, the effector comprises a circular interface plate 110 which is fastened to the robot arm mounting flange 22 by threaded fasteners 112. Shroud 105 is formed with an inwardly turned lip 107. The lip 107 fits between flange 22 and interface plate 110 and is held in compression therebetween by fasteners 112 to secure the shroud in place.

The effector also comprises circular lower plate 120. Three counter balance springs 130 are coupled between the interface plate 110 and the lower plate 120, and are disposed at 120° spacings around the peripheries of plates 110,120. Springs 130 take up some of the weight of the gripping mechanism 400, lower plate 120 and lower assembly 300 to reduce the insertion force exerted by the effector device on the components and to reduce friction to allow the gripping mechanism 400 to more freely "float" when the compliance mechanism is in its first or floating state.

Upper split ball-and-socket assembly 200 is fastened to the lower surface of interface plate 110. Lower split-ball-and-socket assembly 300 is fastened to the upper surface of lower plate 120. Assemblies 200,300 are coupled together by connecting link 150.

Gripping mechanism 400 is fastened to the lower surface of plate 120. Also shown in the effector bottom view, FIG. 3, the gripping mechanism comprises fixed grip jaw and movable grip jaw 420, which translates linearly along a slot formed in the lower surface of plate 120, actuated by double acting air cylinder 430.

It will be apparent from FIG. 2 that bottom plate 120 is allowed some range of movement without contacting the inner surface of shroud 105. As will be described in more detail below, the upper and lower assemblies 200,300 are adapted to allow, when the compliance mechanism is in a first state, a freedom of movement of lower plate 120 with respect to upper plate 110 throughout a predetermined range.

Referring now to FIG. 5, a cross-sectional view of the end effector 110 is shown, taken along line 5—5 of FIG. 2, which further shows the air cylinder 430 with its outer shroud partially broken away. Upper ball-and-socket assembly 200 comprises fixed ball socket 205, floating ball socket 210, and split ball members 215,220. Fixed ball socket 220 is secured to the bottom surface of interface plate 110 by threaded fasteners 207. Tension bolt 225 is passed through aligned bores formed in sockets 205,210, split ball members 215,220 and connecting link 150. Nut 230 secures bolt 225 in the assembled position. Bolt 225 closes ball sockets 205,210 on the ball members 215,220 when actuated by lever 230, shown in cross-section in FIG. 5.

Lower assembly 300 corresponds to assembly 200. Thus, fixed socket 305 is secured to the upper surface of lower plate 120 by threaded fasteners 307. Tension bolt 325 is fitted through aligned bores formed in floating ball socket 310, split ball members 315,320, fixed socket 305 and a slot 155 formed in connecting link 150. Nut 330 secures tension bolt 325 in the assembled position. Actuating lever 335 tensions bolt 325 to close the ball sockets on the split ball members and the connecting link 150.

Further details of the upper and lower assemblies 200,300 are shown in FIGS. 6-8. The cross-sectional view of FIG. 6 shows the connecting link 150 with bore 157 for receiving tension bolt 225 of upper assembly 200, and elongated slot 155 for receiving tension bolt 325 of lower assembly 300. Slot 155 allows assembly 300 to move in vertical relationship with assembly 200 along the length of slot 155. The purpose of this additional freedom of movement will be discussed below.

FIG. 7 is a cross-sectional view taken along lower assembly 300, illustrating the actuating mechanism of the assembly. The lower assembly 300 is also shown in the cross-sectional view of FIG. 4. The actuating lever 335 is held in position by tension bolt 325, with end 336 held against wear block 340. In the preferred embodiment, the split socket members are fabricated of aluminum, and a steel wear block is used to reduce wear caused by the repetitive contacting of the socket member 310 by lever arm end 336. At the opposite end 338 of the lever arm, a pin 350 protrudes from socket 310 and fits into slot 355 formed in lever 335 (see FIG. 2) to further constrain the lever arm.

A pair of threaded retaining bolts 345,350 pass through bores in socket member 310 and are threadingly engaged in threaded bores formed in fixed socket member 305. Bolts 345,350 are not tightened down so that adjacent surfaces of sockets 305,310 are in constrained contact, but rather allow movement of the adjacent surfaces away from each other.

Referring to FIGS. 7 and 8, a pair of air cylinders are fitted into floating ball socket 310. Rods 364,384 extend respectively from air pistons 362,382, which are in turn carried in cylindrical bores 374,394 formed in floating socket member 310. Air lines 370,390 are respectively brought in to fixtures 368,388 which communicate with bores 374,394 by passages 372,392. To minimize air leakage between the pistons 362,382 and the bore walls, each piston is fitted with O-ring gaskets seals 366 and 386, respectively.

By pressurizing lines 370 and 390, the resulting air pressure forces the respective pistons 366,386 to move away from passages 372,392 so that rods 364,384 contact end 338 of actuating lever 335 to push it away from socket member 310. Tension bolt 325 provides a fulcrum point, causing a force to be applied by lever end 335 against wear block 340, and also by nut 330 against socket 305. These forces against the two socket members are translated into opposing forces against split ball members 315,320, thereby fixing the ball members in relation to the socket members.

The split ball members are adapted so that surfaces 316 of ball member 315 contact adjacent surfaces 321 of ball member 320 when lever 335 is actuated. The split ball members are further constructed so that there is a clearance of about 0.0005 inches between connecting link 150 and the adjacent surfaces of the split ball members, so that even with lever 335 actuated, the connecting link may slide freely with respect to the ball-and-socket assembly 300 along the extent of slot 155 in link 150.

In the preferred embodiment, a valve is provided to switch lies 370,390 between a source of air pressure to fix or lock the assembly 300, and a source of vacuum to withdraw the air pistons 362,382 and release the assembly 300 from its fixed position. The vacuum overcomes the friction resistance to piston withdrawal caused by the O-ring seals. Other suitable means for overcoming the resistance, such as springs, will be readily apparent to those skilled in the art.

Upper assembly 200 operates in a manner similar to that described with respect to lower assembly 300 except that substantial vertical movement of the link 150 in relation to the assembly 200 is not provided, since there is no slot but rather a bore formed in the link through which the tension bolt is fitted.

The double acting air cylinder which actuates the gripping mechanism is illustrated in the broken-away view of FIG. 5 and the cross-sectional view of FIG. 5 and the cross-sectional views of FIGS. 9 and 10. Air cylinder 430 comprises a piston assembly 450 mounted at one end of rod 435. Rod 435 fits through an opening formed in fixed gripper jaw 410. Sliding gripper jaw 420 is fastened to the other end of rod 435.

FIG. 9 is a cross-sectional view of the compound piston assembly 450. The assembly comprises a first piston member 455 which is integrally formed with rod 435. The piston 450 includes a complaint U-seal 456 with tensioning spring 457 fitted therein. Spring 457 urges outer lip 458 of seal 456 outwardly into contact with the inner periphery of cylinder 430.

Second piston member 460 is slidably secured to the end of piston 435 by button screw 480 and washer 481. Screw 480 is secured in a threaded bore formed in the end of rod 435. Bore 462 is formed in piston 460. Movement of piston 460 on rod 435 is constrained in one direction by screw 480 and washer 481. A pair of washer wave springs 470 and 475 are concentrically mounted on rod 435 between first piston 455 and second piston 460. Springs 470,475 urge second piston 460 to the separated location shown in FIG. 9, with piston 460 fully extended in abutting relationship with 481.

Air cylinder 430 is a double acting cylinder, with pressurized air being coupled through air passages 492,494 to either the cap end 440 of the cylinder in the direction of arrow 490, or into the rod end of the cylinder in the direction of arrow 485. To close the gripping mechanism, pressurized air is admitted into the rod end of the cylinder, causing rod 435 and gripper jaw 420 to move in the direction of arrow 485 until jaw 420 closes against a component or fixed jaw 410. Because O-ring seals 465 exert a greater frictional drag on piston 460 than the frictional drag exerted by U-cup seal 456 on piston 455 or the spring force exerted by the two wave springs 470,475, the wave springs will be compressed through the compound movement stroke indicated in FIG. 9 as distance "C" to the compressed configuration shown in FIG. 10.

Compound piston assembly 450 provides a novel gripper release means. One of the problems inherent in known effector gripper apparatus is that when air pressure to the pneumatic gripper assembly is released to release the component from the effector after insertion, frictional drag on the component may be sufficient such that the component is carried away or perturbed from its inserted position as the effector is lifted away. If the gripping mechanism is opened after insertion, before the effector is lifted away, the grip jaw as it moves through its opening stroke may contact other components on the board, and thereby cause damage and/or dislocation of such components. For densely populated circuit boards, the gripper jaw may not be moved to a fully opened position.

The compound piston assembly 450 solves this problem. When air pressure is released from the rod end of the cylinder, the compressed wave springs are released, exerting an expansive force against pistons 455 and 460. Since the frictional drag exerted on piston 455 by U-cup seal 456 is less than the drag exerted by O-ring seals 465 on piston 460, piston 460 remains substantially stationary while piston 455, rod 435 and gripper jaw 420 move in the direction of arrow 490 a distance substantially equal to distance "C." With the jaw mechanism opening by distance "C" there is no longer any drag to be exerted on the component as the gripper mechanism is lifted away from the inserted component, yet the opening movement has been relatively small, protecting adjacent components. Once the gripping mechanism has been lifted away from the circuit board, pressurized air may be admitted to the cap end of the air cylinder 430 to fully open the gripper jaws 410,420. In the preferred embodiment, this feature allows insertion of components to within 0.05 inches of adjacent components.

A pair of vent holes (not shown) are formed in second piston 460 such that the cap end of the air cylinder communicates with the space between the first and second pistons. The vent holes prevent this space from becoming pressurized, and preventing compression of the two pistons.

Referring now to FIG. 5, an insertion fault sensor 580 is provided on socket member 210, and is adapted to sense the presence of socket member 310 of the lower assembly 300. Sensor 580 comprises a spring-loaded plunger 582 which fits into counterbore 584 formed in socket member 210. The plunger acts as the target for sensor 580.

The purpose of the sensor is to sense the failure to insert a component into the board. Since the leads are not inserted into the pre-formed holes in the board during such a failure, the leads contact the surface of the board. As the effector is lowered, the component, the lower assembly 300, lower plate 120 and the gripping mechanism will remain stationary, with assembly 200 and link 150 descending along the extent of slot 155. As upper assembly 200 is lowered, the plunger of the proximity sensor contacts the upper, adjacent surface of socket member 310 and is forced upwardly. In the preferred embodiment, 0.07 inches of upwardly travel of the plunger will trigger proximity sensor 580, indicating that a failure to insert the component has occurred. The robot controller may then either determine whether to make another attempt to insert the component, or to jettison that component and pick up a new component.

Referring now to FIG. 5, a second proximity sensor 585 is attached to lower plate 120 and is adapted to sense the condition of failure to pick up a component. The sensor is adapted to be triggered when the grip jaws 410,420 are fully closed. Triggering of the second proximity sensor provides an indication to the robot controller that the gripping mechanism is not gripping a component, so that a decision can be made to pick up another component.

Referring now to FIG. 11, a function block diagram illustrative of the interconnection of the electrical and pneumatic systems of the preferred embodiment is illustrated. Robot controller 500 is adapted to control the pneumatic system via a plurality of electrically actuated pneumatic valves. The controller 500 receives input data from the several sensor transducers which are provided in the system. As is well known to those skilled in the art, the robot controller is programmable for causing the robot to operate in accordance with a predetermined sequence of steps and movements. The program will depend upon the particular controller and the application.

Pressurized air which has been regulated and filtered is supplied to the system via line 505. Pneumatic vacuum generator 510 is driven by the pressurized air via line 506. In the preferred embodiment, generator 510 comprises a model M16 generator, marketed by PIAB USA Incorporated, 65 Sharp St., Hingham, Mass. 02043. This device develops a vacuum on line 512, which is coupled to valve 545. Arrow 511 indicates a pneumatic exhaust outlet for generator 510. It is to be understood that such arrows are generally employed throughout FIG. 11 to indicate pneumatic exhaust outlets.

The pressurized air is provided from line 505 to valves 515, 520, 525, 530, 535 and 540. Valve 515 is a five port, two-way valve which is adapted to operate the double acting air piston of the pick up station lead clamping vise 600. Electrical line 516 is coupled between the electric actuator valve 515 and the output section of controller 500. The valve 515 has two high pressure output ports to supply the ends of the air piston 602 of clamp 600 via air lines 517, 518. Two ports of the valve 515 are connected to a pneumatic exhaust outlet. Thus, in dependence upon electrical control signals from controller 500, the component lead clamp vise is opened or closed.

The pick up station further comprises component lead sensor 590 which is adapted to sense the presence of the leads of the component at the lead clamping vise 600. In the preferred embodiment, sensor 590 comprises a model 52005-3LED photoelectric sensor marketed by Skan-A-Matic Corp., P.O. Box S, Elbridge, N.Y. 13060. The sensor comprises a LED which generates light which is transmitted coaxially to the target through an outer diameter of fiber optic fibers. Light is reflected by the component leads back through an inner fiber optic bundle to a phototransistor transducer. The sensor 590 output is coupled to the controller 500 via electrical line 591 to provide a signal indicative of the presence of a component lead in the vise.

The pick up station also includes a "vise open" sensor adapted to provide a signal to the controller to indicate the "vise open" condition. This sensor comprises a Hall effect proximity sensor, model 37XL31-003, marketed by the Microswitch Division of Honeywell Corporation, Marlborough, Mass.

It will be readily apparent to those skilled in the art that, with the information provided by sensors 590, 595, the controller may cause the vise to grip the leads of a component which has been delivered to the vise along a conveyor or other conventional means, and thereafter to release the component leads.

Pneumatic valves 520, 525, 530, and 535 comprise three port valves marketed by SMC Pneumatics, Inc., 5538 W. Raymond St., Indianapolis, Ind. 46241, as model NVS4114-00520. Each valve is supplied with pressurized air via line 505, and each valve also comprises a port which is coupled to a pneumatic exhaust outlet. The high pressure output port of valve 520 is coupled to one input port of valve 545; the output of vacuum generator 510 is coupled to the other input port of valve 545. The output of valve 525 is coupled to the pilot or control port of valve 545.

Valve 545 comprises a model VA125A valve marketed by Humphrey Products, P.O. Box 2008, Kalamazoo, Mich. 49003. It operates to switch output line 546 between the high pressure source and the vacuum source, in dependence upon the pressure at the valve pilot port. Pneumatic line 546 is coupled to the four single-acting air cylinders provided in upper and lower assemblies 200,300. Thus, the controller may cause either pressurized air or a vacuum to be applied to the air cylinders which actuate the assemblies 200,300 by controlling valves 525 and 545.

Insertion fault sensor 580, as described above, is disposed in floating socket member 210. In the preferred embodiment, this sensor comprises a model FY-GE/M10-0 proximity sensor marketed by the Microswitch Division of Honeywell Corporation. Its output signal is provided to controller 500 via electrical line 581 to provide a sensor signal which indicates an insertion fault, as described above.

The gripping mechanism air cylinder 430 is actuated by valves 530, 535, 540, 570 and 575. The outputs of valves 530,535 are respectively passed through pressure regulators 550,555 and check valves 560,565 to valve 570. Regulators 550,555 may be separately adjusted to provide separate air pressure levels (e.g. 10 or 10 psi) to valve 570. The purpose of using two regulators is to allow the controller the capability of selecting between two grip pressures. The controller is adapted to select the grip pressure by actuating valve 570, which in the preferred embodiment comprises a model 3E1 valve marketed by Humphrey Products.

The output of valve 570 is passed through quick exhaust valve 575 to the rod end of air cylinder 430. Valve 575 comprises a model SQE valve marketed by Humphrey Products, and is adapted to rapidly vent the pressurized air provided to it as the air pressure from valve 570 begins to drop. Valve 575 increases the system cycle time.

Valve 540 comprises the robot output valve (internal to the Seiko RT-3000 robot) whose output is coupled to the cap end of double acting air cylinder 430.

Valves 570,540 are actuated simultaneously by controller 500 to actuate cylinder 430. Thus, to close the grip, valve 570 is opened and valve 540 closed. To fully open the grip, valve 540 is opened and valve 570 closed. To release a component, valves 570 are closed, thereby removing the pressurized air supply from both the cap and rod ends of air cylinder 530.

Sensor 585 is provided to sense the "jaws closed" position of the gripper assembly. In the preferred embodiment sensor 580 is a proximity sensor, model FY-GE/M10-0, marketed by the Microswitch Division of Honeywell Corporation.

As will be apparent to those skilled in the art, other electrical and/or pneumatic system layouts may be employed to implement the invention. Additional lead clamping vises and pick up stations may be readily incorporated into the system to increase the system capacity. The types of valves and sensors may be readily changed to suit the particular application.

From the foregoing description, it will be apparent that the compliance mechanism of the preferred embodiment is adapted to allow the connecting link 150 to move through a predetermined range of movement with respect to upper ball-and-socket assembly 200 when the compliance mechanism is in the first floating state. The range of movement is generally about the tension bolt 225, and is defined by the amount of the clearances between the link and adjacent surfaces of the socket members 205,210, and between the tension bolt 225 and the bores through which it is inserted in split ball members 215,220 and socket members 205,210. The requisite range of movement for the application of the preferred embodiment is relatively small, and indeed the respective clearances shown in the Figures are somewhat exaggerated for illustrative purposes. The actual required range of movement is a function of the particular application.

The compliance mechanism is further adapted to allow the lower plate 120 and lower assembly 300 to move through a predetermined range of movement with respect to the connecting link when the compliance mechanism is in the first state. The range of movement is generally about tension bolt 330, and is also defined by the clearances between the link and adjacent surfaces of the socket members 305, 310, and between the tension bolt and the bores through which it is inserted in split ball members 315,320 and socket members 305,310. An additional degree of freedom is provided by slot 155 formed in link 150, which allows vertical movement of the assembly 300 with respect to the link 150 along the extent of the slot 155.

The multiple ranges of movement provided by the compliance mechanism is one novel feature of the invention. With the compliance mechanism in its first state, the gripping mechanism is allowed to find a clamping equilibrium position on the component which is held in the clamping vise at the pick up station. This equilibrium point may deviate from a nominal clamping point, due to variations in the body or body-to-lead relationship of the component. Because of the degrees of movement of the compliance mechanism, the lower plate may, for example, shift slightly from a horizontal position to a slightly cocked position, or the gripping jaws may be offset slightly from the effector center axis. The ability to allow the effector to freely find this clamping equilibrium means that the compliance mechanism accommodates the offsets or deviations in the component size. Without the compliance mechanism, the offset would be translated into a preload force on the leads, which would either bend the leads or, once the component leads are released from the pick-up station, be translated into an offset in the position of the leads relative to the robot arm.

After a predetermined "float time" sufficient to allow the clamping equilibrium position to be found, the compliance mechanism is actuated into the second or fixed state. In this state, the lateral position of the gripping mechanism with respect to the robot mounting flange is fixed; upward vertical movement is still possible due to the slot 155 in link 150, as discussed above. With the compliance mechanism in the fixed state, the component may be released from the lead clamping vise at the pick-up station, and the robot arm moved from the pick-up station to a point above the predetermined location on the circuit board where the component is to be inserted. The robot arm is then lowered to insert the leads of the component in pre-formed holes in the board.

To further facilitate the insertion process, the robot controller may be programmed to cause the robot arm to lower the component above its board position a predetermined distance, usually until the leads contact the board, and then cause the robot arm to oscillate or dither. The oscillatory motion moves the leads back and forth across the respective board holes to facilitate lead insertion. The arm then finishes its downward stroke.

The degree of oscillation or dithering will be dependent upon the requirements for the particular application. In the preferred embodiment, the oscillatory, i.e., lateral, movements range in size from 0.002 inches to 0.02 inches.

The typical insertion cycle time of the robotic system in accordance with the preferred embodiment is about 2.5 seconds. Of this cycle time, the compliance mechanism "float" time, i.e., the time in which the compliance mechanism is in the first state, after the gripping mechanism has closed on the component, is typically less than 50 milliseconds. The cycle time and float time may obviously be varied in accordance with the particular application.

A typical insertion cycle comprises the following steps. The component to be inserted is positioned at a predetermined pick up point and fixed in position at that point, for example, by a pneumatic clamping vise. The robot arm is brought to a point above the component to be picked up. With the compliance mechanism in its first, floating state, and the gripping mechanism fully opened, the gripper jaws are lowered to a point so that the jaws are disposed on opposing sides of the component. Typically, the arm is lowered with the fixed jaw disposed about 1/32 inch from the adjacent side of the component. The arm is then moved laterally to bring the fixed jaw up against the side of the component, and the gripping mechanism is actuated to close the movable jaw up against the opposing side of the component to grip the component.

Since the compliance mechanism is in the first floating state, the component is gripped without preloading or bending its leads.

After the predetermined float time has elapsed, the compliance mechanism is actuated to the second, fixed state to lock the compliance mechanism. This actuation causes substantially no preload force to be applied to the component leads. The pneumatic clamp of the pick up station is then actuated to release the component from its grip.

The robot arm then lifts the component, moves it to a location above its predetermined board location, and commences its downward insertion stroke. During the insertion stroke, the oscillation described above may be employed. Once the component has been inserted in the board, air pressure to the gripper air cylinder is released, allowing the rod of the gripper air cylinder to withdraw through its expansion stroke to release the component. The robot arm is then lifted and the gripper jaws fully opened. With the robot arm moved back to its position above the component pick up point, the system is ready to commence another cycle.

The above-described invention may be used to insert standard as well as nonstandard components. By way of example only, the invention may be employed in applications wherein a dozen or more different types of components, both standard and nonstandard, are inserted in a closely packed relationship on a printed circuit board. With the compliance mechanism of the invention, the system adapts to each type and size of component. With the novel release mechanism of the invention, the system is capable of insertion in a closely packed relationship.

Figure 12:
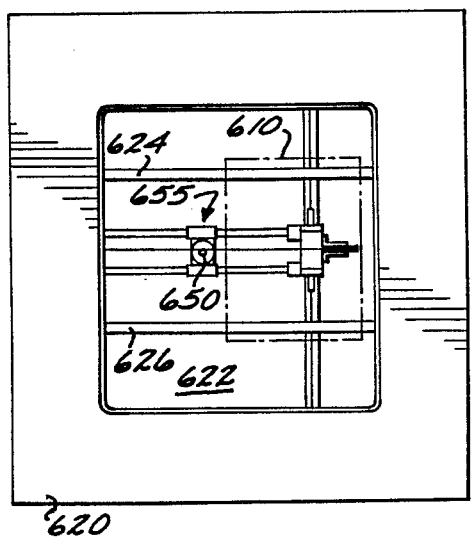
FIG. 12 is a top plan view of an a second embodiment, comprising a component lead clinching apparatus.
Figure 13:
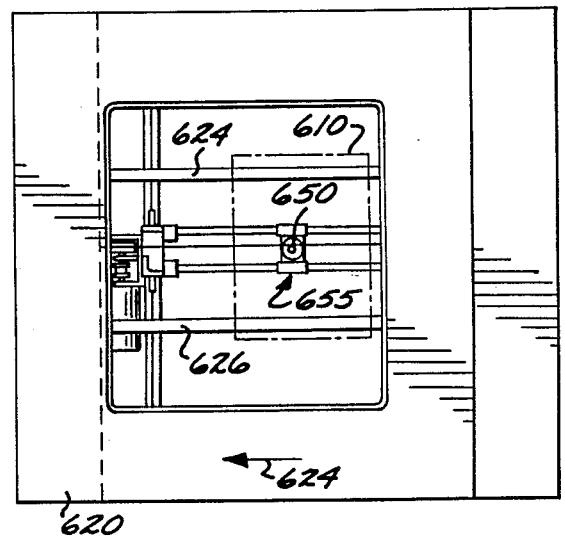
FIG. 13 is a top plan view of the apparatus of FIG. 12, with the top plate of the work surface displaced in accordance with the invention to increase the effective board area which may be accessed by the clincher tool.

Illustrating another aspect of the invention, FIGS. 12 and 13 are top plan views of an apparatus which is advantageously employed to clinch the leads of components which have been inserted into a printed circuit board, for example, by the above-described component insertion robot. In this embodiment, the apparatus comprises a table surface 620 having a large aperture 622 formed therein. A printed circuit board 610 (shown in phantom) is suspended over the aperture 622 by attachment to elongated support ribs 624, 626. The ribs 624, 626 are preferably adjustable in their position over the aperture 622 so as to accommodate variously sized circuit boards.

The surface 620 is translatable along the axis of arrow 624 shown in FIG. 13. As will be described in more detail below, this embodiment comprises means for translating the table surface 20 between the respective positions illustrated in FIGS. 12 and 13.

With at least one electrical component, inserted in the circuit board 610 and gripped by the insertion robot, a retractable clincher element 650 mounted for translational movement throughout a plane which is parallel to and beneath the printed circuit board travels through a controlled series of predetermined movements to selectively contact and clinch individual leads of the component.

As used herein, "clinching" a component lead refers to the bending of a component lead away from the nominal lead position, perpendicular to the printed circuit board, to a bent or clinched location adjacent the printed circuit board.

The clincher element movement is controlled by a processor which is programmed with information defining the desired path the clincher element is to travel. Thus, the system user is able to adapt the system to the clinching requirements for virtually any circuit board and any type of inserted component.

To achieve the capability for controllable movement, the clincher element 650 is mounted in an assembly 655, which in turn is carried by an upper carriage assembly 670 supported for lateral movement on a pair of lateral rods 680, 682. The ends of the lateral rods 680, 682 are in turn mounted in first and second lower carriage assemblies 690, 692, respectively, carried for longitudinal movement on opposed longitudinal rods 694, 696.

Lateral drive means are provided for driving the upper carriage assembly 670 to traverse the lateral extent of the lateral rods 680, 682. Similarly, longitudinal drive means are provided for driving the lower carriage assemblies 690, 692, which carry the lateral rods 680, 682 and upper carriage assembly 670, to traverse the longitudinal extent of rods 694, 696.

Figure 14:
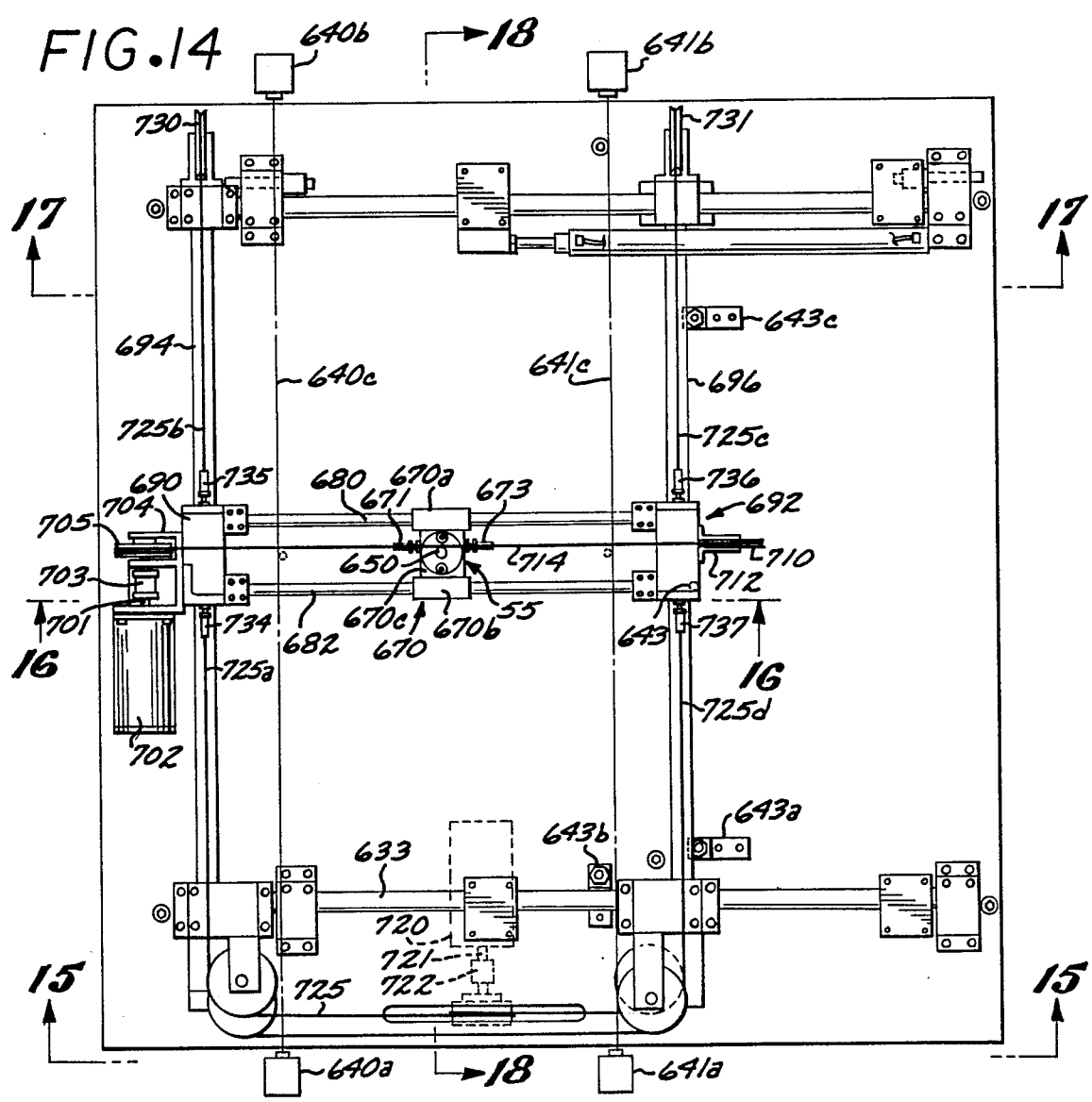
FIG. 14 is a top plan view illustrating the apparatus shown in FIG. 12 without the top plate to show the clincher tool and x-y drive mechanisms.

The lateral drive means comprises the upper stage stepper motor 702, mounted to carriage 690 by bracket 704. Motor 702 comprises a stepper motor, model M063, marketed by the Superior Electric Company. As shown in FIG. 14, the motor 702 is coupled through motor coupler 703 to the drive shaft of drive pulley 705. Pulley 705 is mounted on bracket 704 for rotation about an axis in line with the axis of the motor 702.

Idler pulley 710 is carried by pulley bracket 712 mounted on carriage assembly 692. Idler pulley 710 and drive pulley 705 are mounted for rotation about respective pulley axes which are substantially parallel. A stainless steel cable 714 having a diameter of 0.065 inches is reeved around the drive pulley 705 and the idler pulley 710, and its ends are secured in cable fixtures 671, 673, which are respectively secured in opposite sides of the upper carriage 670.

Rotation movement of the motor shaft causes the drive pulley 705 to rotate. Rotational movement of the drive pulley 705 imparts a driving force to the cable 714, resulting in movement of the upper carriage 70 along the rods 680, 682. So long as there is no cable slippage, the extent of the movement of carriage 70 is precisely related to the rotation of the motor shaft. Thus, each angular movement step by the motor shaft can be translated to a translational movement by the carriage 670. In the disclosed embodiment, each step of the motor 702 results in the translation by 0.001 inch of carriage 70.

The carriage 670 comprises a pair of ball bushing members 670a, 670b and a center carriage bracket 670c fixedly coupling the bushing members and supporting the clinch ball assembly 655. In this embodiment, ball bushing members 670a, 670b comprise Thompson ball bushings, model Super-6, which are mounted on rods 680, 682, which have a diameter of 0.375 inches. The ball bushings 670a, 760b and the rods 680, 682 are adapted to provide extremely low friction, facilitating linear travel of the carriage along the rods 680, 682.

With reference to FIG. 14–16 and 18, the longitudinal drive means comprises the lower stage stepper motor 723, secured to lower surface 618 by a mounting bracket 724, as shown in FIG. 19. In the disclosed embodiment, motor 620 comprises a model M093 stepper motor marketed by the Superior Electric Company. The motor shaft 721 is coupled to drive pulley 723 by coupler 722. Drive pulley 723 is rotatably mounted for rotation about the motor shaft axis.

As illustrated in FIGS. 14 and 15, idler pulleys 726, 727, 728 and 729 are mounted for rotational movement adjacent the motor 720 and ends of longitudinal rods 694 and 696. Idler pulleys 730 and 731 are mounted for rotational movement adjacent the other end of the rods 690 and 692.

Cable 725 is reeved about the drive pulley 723 and about upper pulley 727, and end 725a is secured to the carriage 90 by cable bracket 734. On the side of carriage 690 opposite from bracket 735, end 725b of cable 725 is secured to carriage 90 by cable bracket 735.

Cable 725 is reeved about idler pulley 729 from drive pulley 723, and is passed to the other end of rod 692 to idler pulley 731. The cable 725 is reeved about pulley 731, and end 725c is secured to carriage 692 by cable bracket 736. On the side of carriage 692, opposite from bracket 736, end 725d of cable 725 is secured by cable bracket 737. From bracket 737, the cable 725 is reeved about idler pulley 728, and passes diagonally downwardly to pulley 726. From pulley 726, the cable 725 passes to the opposite end of rod 690, where it is reeved about pulley 730 and passed to cable bracket 735.

The lower carriage assemblies 690, 692 respectively comprise bushing members 690a, 692a, which respectively encircle longitudinal rods 694, 696. In this embodiment, ball bushing members 690a, 692a comprise Thompson ball bushings, model Super-12, and the rod 694, 696 have a diameter of 0.75 inches. The ball bushings 690a, 692a and the rods 694, 696 are adapted to provide extremely low friction, facilitating linear travel of carriages 690, 692 along the longitudinal extent of the rods 694, 696.

The cable and pulley system shown in FIGS. 14 and 15 thus provides a means of converting rotational movement of the motor shaft 721 into translational cable movement. Both carriages 690 and 692 are driven by the cable 725, in response to rotations of the motor shaft 721. As with the lateral drive system, the longitudinal movement of the carriages 690 and 692 is precisely related to the rotational shaft movement of motor 720, with each step of motor 720 resulting in 0.001 inches of longitudinal movement of the carriages 690, 692 along the rods 694, 696. Thus, by controlling motor 720, clincher ball assembly 655 can be longitudinally positioned.

Stepper motors 702 and 720 are controlled by motor drivers, which receive digital drive signals from a system controller. The system controller generates appropriate drive signals to cause the stepper motors to drive the clincher element assembly through a desired path of travel and/or to a desired position. In the disclosed embodiment, the clinching element is driven at velocities up to 100 inches per second.

Referring now to FIG. 19, the clincher assembly 655 comprises a double-acting air cylinder assembly, mounted to the carriage 670. Such air cylinders are commercially available, and in the disclosed embodiment, a Fabco-Air model F-7-X, with a ¾ inch bore and ⅝ inch stroke, is employed.

The air cylinder assembly 655 comprises cylinder wall 655a and hollow outer piston rod assembly 655b. The outer piston rod 655b is integrally formed with a piston 655v. A pair of ports 655c, 655y are formed through the wall of the cylinder 655a to communicate with opposing chambers 655m, 655o defined by cylinder 655a, bushings 655e, 655f and piston 655v.

The air cylinder assembly is fitted with O ring seals 655c at appropriate locations to prevent air leaks. A pair of air lines 655i and 555j communicate with chamber 655m and 655o, respectively through the ports 655x, 655y, and are respectively coupled to sources of air pressure or vacuum. The piston rod assembly 655b is forced upwardly or downwardly in dependence upon the relative pressurization of chambers 655m and 655o.

The stroke of the piston rod assembly is nominally five-eighth inches in the disclosed embodiment. Thus, by selective pressurization of the respective chambers, the piston rod assembly, to which the clinching element 650 is attached, is forced either into the upward state for clinching or the downward retracted state. In the extended clinching position, the clinching element is directly adjacent the lower surface of the circuit board, almost in contact with the surface. In the retracted position, the clinching element 605 is disposed well beneath the lower surface of the board so as not to contact downwardly extending leads.

The clinching element 650 comprises a rounded ball element, having as nominal diameter of 5/16 inches, and is secured to inner rod 655p by threaded securing means or the like. The inner rod member 655p is biased in a concentric relationship with outer rod 655b by elastic centering ring 655h and plastic insulating bushing 655t. A pair of plastic insulating bushings 655e and 655f are employed to located the otter piston rod assembly 655b with respect to the cylinder housing members 655q and 655r.

One aspect of the invention is the provision of a tactile sensing means for detecting whether the clinch operation has been successfully performed. The sensor comprises means for sensing for electrical continuity between the outer piston 655b and inner rod member 655p. Due the elasticity of the centering ring 655h, the inner rod may be deflected from its normal concentric position in relation to the outer rod member 655b. When it is deflected, for example, by the deflection force resulting from the collision of a component lead with clinching element 650, electrical continuity is achieved between the inner rod 655p and the end outer member 655b in the region between plastic insulating washer 655g and the elastic centering ring 655h.

A monitoring circuit, shown generally in FIG. 19 as circuit 655s, is coupled between the outer rod 655b and the inner rod 655p by wires 655r and 655z, respectively. The clinch system controller monitors the circuit output.

Plastic insulating bushing 655t secures the lower ends of the respective inner and outer rod members in electrical isolation in their concentric relationship. Wire 655z is secured to the inner rod member by a pair of lock nuts 655u. The wires 655r, 655z and the two air lines 655i and 655j are brought away from the air cylinder assembly 655 as an umbilical line, which is trailed or dragged behind the air cylinder as it is moved about by the carriage assemblies.

Referring now to FIG. 20, the air cylinder assembly 655 is shown with the clinching element in the extended or clinch state in contact with the lead of an inserted electrical component. The electrical lead exerts a deflection force on the ball 655, which deflects the inner rod 655p with respect to the outer rod 655b so as to achieve electrical continuity between the two members, resulting in a clinching signal from the monitoring circuit. Of course, the clinch ball 655 also exerts a clinch force on the lead, such that the lead is clinched or bent along the underside of 610b of the board 610.

FIG. 21 is a cross-sectional view taken along line 21—21 of FIG. 20 illustrating the relative position 610b of the clinch ball in relation to the leads of the electrical component and the printed conductors on the underside of the printed circuit board 610.

FIG. 17 illustrates one of the two air cylinders which serves to position the table surface 620 in one of the position shown in FIG. 12 or FIG. 13. The upper table surface 620 is supported by conventional means (not shown), such as a slide mechanism, for lateral movement with respect to lower table surface 618. Bracket 631 is affixed to table 618 and supports one end of air cylinder 630. Bracket 632a is affixed to the underside of table surface 620, and supports the other end of air cylinder 630.

Actuation of the air cylinder 630 exerts a force tending to separate the bracket 632a and the bracket 631, causing the upper surface to slide laterally toward the position illustrated in FIG. 13. A second air cylinder 633, shown in FIG. 14, is configured to provide an oppositely directed force to slide the surface 620 toward the position shown in FIG. 12. Alternatively, a single double-acting air cylinder may be employed to slide the table surface between the two positions illustrated in FIGS. 12 and 13.

The provision of means to translate the table surface 620, which carries the circuit board, with respect to the clinch element drive system, increases the maximum board size which may be accommodated by the clinch system. A particular board can be disposed at one of the two surface 620 positions, and the components inserted and clinched in the portion of the board accessible to the clinch element. The surface 620 with the board may then be shifted to the second position, and components inserted and clinched in the portion of the board now available to the clinch element.

A plurality of position sensors are employed to accurately determine a reference position for the clincher element 650, for example, in relation to the insertion robot system, and provide end-of-travel information to prevent the clincher element from accidental out-of-limit contact with other structural elements.

Left and right upper stage travel limit sensors 640, 641 comprise photoelectric sensors. The sensors comprise LED light source 640a, 641a and photodetectors 640b, 641b. The sources project respective light beams along axis 640c, 641c which are detected by the respective detectors 640b, 641b. Lateral movement of upper carriage assembly 670 so as to interrupt the light beam on either side causes an out-of-limit signal to be generated by the appropriate detector 604b or 641b. In the disclosed embodiment, the photoelectric sensors comprise two miniature LED pairs, models L33 and P33 marketed by the Skan-A-Matic Corporation.

The lower stage travel limit sensors comprise Hall effect sensors. A magnet 643 is mounted to lower carriage 692. Hall effect sensors 643a, 643b are mounted to the lower table surface 618 in appropriate locations relating to the upper and lower end-of-travel limits for the lower carriage 692. As the carriage 692 is passed in close proximity to the one of the Hall effect sensors, its magnetic field triggers the sensor. Sensor 643c is the "home" or reference position sensor. This position is the reference or start position to which the clinch element is typically set at the commencement of clinch operations for each board. The controller references the various clinch element movements from the "home" position.

Figure 34:
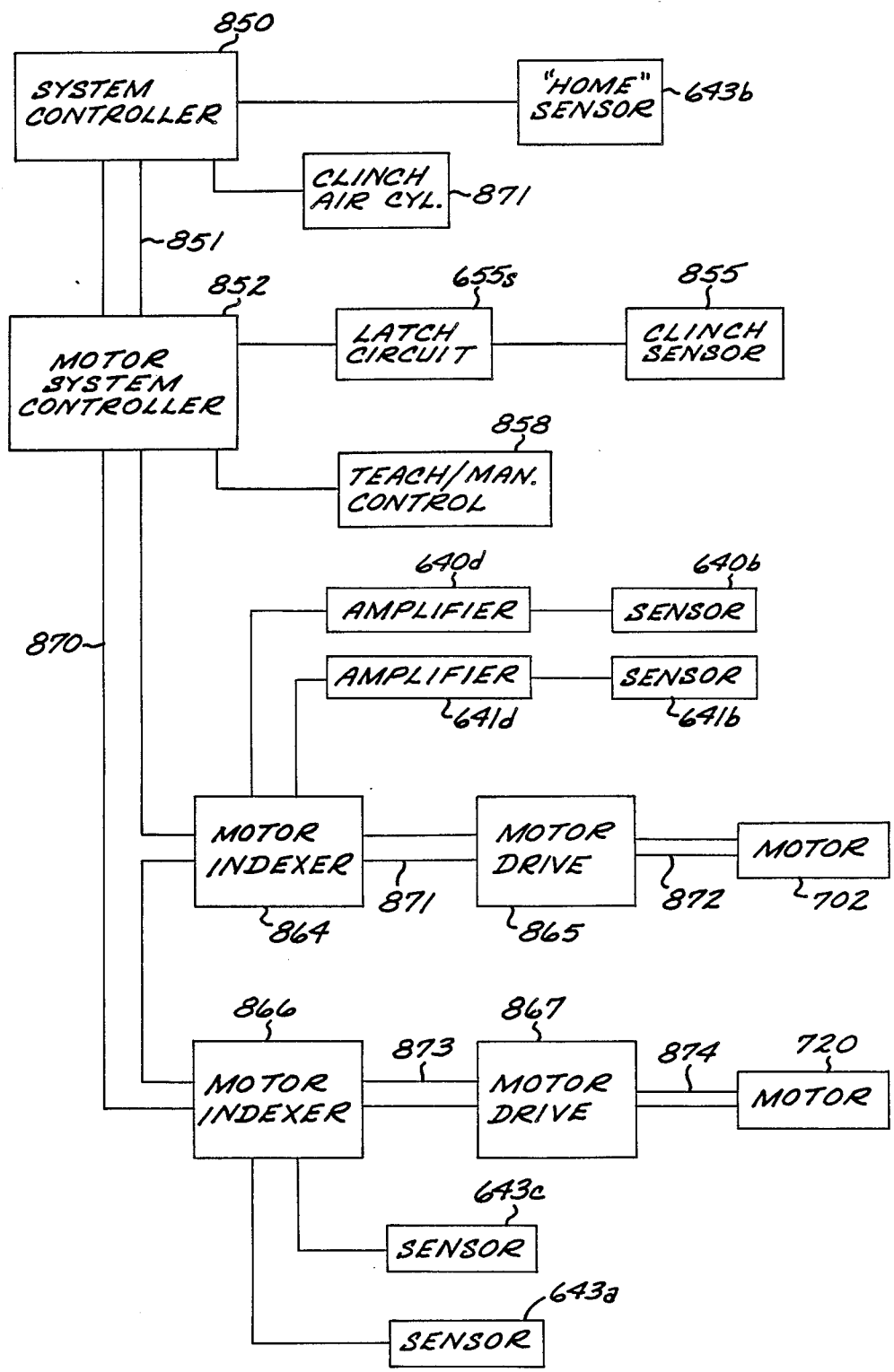
FIG. 34 is a block diagram of the lead clincher system.

FIG. 34 is a control block diagram illustrative of the clincher control system. A system controller 850, which comprises a personal computer system such as the IBM PC personal computer with memory display and keyboard peripherals, provides overall system control.

The system controller is coupled to interface device 852 by an RS232 interface bus 851. For the disclosed embodiment, the interface device is part of a motor control and drive system for the Superior Electric motors 702, 720 described above. The interface device 852 comprises the Modulynx system controller card, model number 10D 009 marketed by the Superior Electric Company.

The interface device 852 is coupled by 50 pin bus 870 to the upper and lower stage drive systems. The upper stage drive system comprises indexer circuit 864, the Modulynx indexer card model number IMD 128 and driver card 865, the Modulynx driver card model number DRD 002A. Both devices 864, 865 are marketed by the Superior Electric Company. The driver card 865 drives the stepper motor 702.

The upper stage travel limit sensors 640b, 641b are coupled through the respective amplifiers 640d, 641d to the indexer card 864. An out-of-limit signal from one of the sensors provides an interrupt signal stopping the motor 702 from further operation in the out-of-limit direction. This interrupt provides a "soft stop," i.e., the system controller may drive the clincher assembly 655 up to a travel limit, where the motor is stopped, and then drive the assembly 655 away from the limit.

The lower drive system comprises index card 866, also a Modulynx index card model IMD 128, and motor driver 867, a Modulynx driver card, model DRD 003. Bus 873 couples the index card 866 to motor driver 867. Bus 874 couples the motor driver 874 to motor 720.

The lower stage travel limit sensors 643a, b are coupled to indexer card 866. An out-of-limit signal from one of the signals provides an interrupt signal providing a "soft stop" which stops the motor 720 from further operation in the respective out-of-limit direction.

The "home" position sensors 643c is coupled to the system controller 850. The system controller 850 also controls the operation of air valves (not shown) controlling the operation of the air cylinder of the clinch assembly 650. The air valves and air cylinder are indicated in FIG. 34 as block 871.

The interface device 852 is further coupled to the clinch tactile sensor circuit 855 through latch circuit 855, comprising a relay, and to the teaching and manual control pendant 858. The sensor 855 provides a feedback signal to the controller 850 indicating whether a desired clinch has occurred.

The pendant 858 enables manual operation of the clinch system and, in combination with an operator keyboard comprising the controller 850, provides a means of manually teaching or entering a desired clinch path. The pendant includes four separate switches for +X, −X, +Y, −Y movement, a "clinch up" switch for extending the clinch element 650 into he extended clinch state, a "step/jog" switch to select signal step or jog movement modes, a emergency stop switch and a switch for selecting between manual or processor control.

In a typical manual teaching sequence, an identifying number for the component to be clinched is entered into the controller 850 via the keyboard. Then the operator by manually manipulating the +X, −X, +Y, −Y controls appropriately, moves the clinch element 650 to the appropriate start position required to initiate the desired clinch path. The start position of the clinch element for this component, in relation to the "home" position, is then stored in the memory of the controller 850. The controller 850 is adapted to keep track of the position of the clinch element in relation to the system "home" position by monitoring the number of motor steps and their direction from the "home" position.

If, during the next move, it is desired to clinch a lead of the component, the operator activates the "clinch up" control on the pendant 858. The appropriate movement controls (+X, −X, +Y, −Y) are then activated to execute the desired clinch path. If the leads are not be clinched during this sequence of moves, the "clinch up" switch is not activated.

In the next step of the teach sequence, the final position of the clinch head and clinch element (up or down) are stored in the controller memory.

The preceding two steps are then repeated to perform all desired clinching movements for the particular component. The entire sequence is then repeated for each of the components on the board requiring clinching.

Once the teaching mode is completed for the components inserted on a particular board, the processor 850 will have been provided, for each component, with a component identification number, a clinch path start position, and a plurality of successive intermediate clinch element positions, each with corresponding clinch element positions (extended or retracted). These data enable the processor to automatically repeat the clinch element path pattern for each component in a "run" operation.

In a simple run operation, the operator may manually enter into the processor 850 the identification number of the component to be clinched, and then signal to the processor to execute the stored clinch cycle for that component. Under control of the processor 850, the previously stored or "taught" clinch path of the clinch element will be executed while the element 650 moves up and down as required to clinch the desired leads of the component.

The clinch system will typically be operated in cooperation with a component insertion robot, as described above. As each component is inserted into the board, the clinching system will be operated to clinch one or more of the leads of the inserted component. Typically, the entire insertion and clinch operation will be coordinated and executed automatically under control of the processor 850. Moreover, it is expected that the system will be data driven by positional data and cycle instructions provided as a result of computer-aided design techniques, rather than by manually teaching each of the movements of the cycle.

Figure 22:
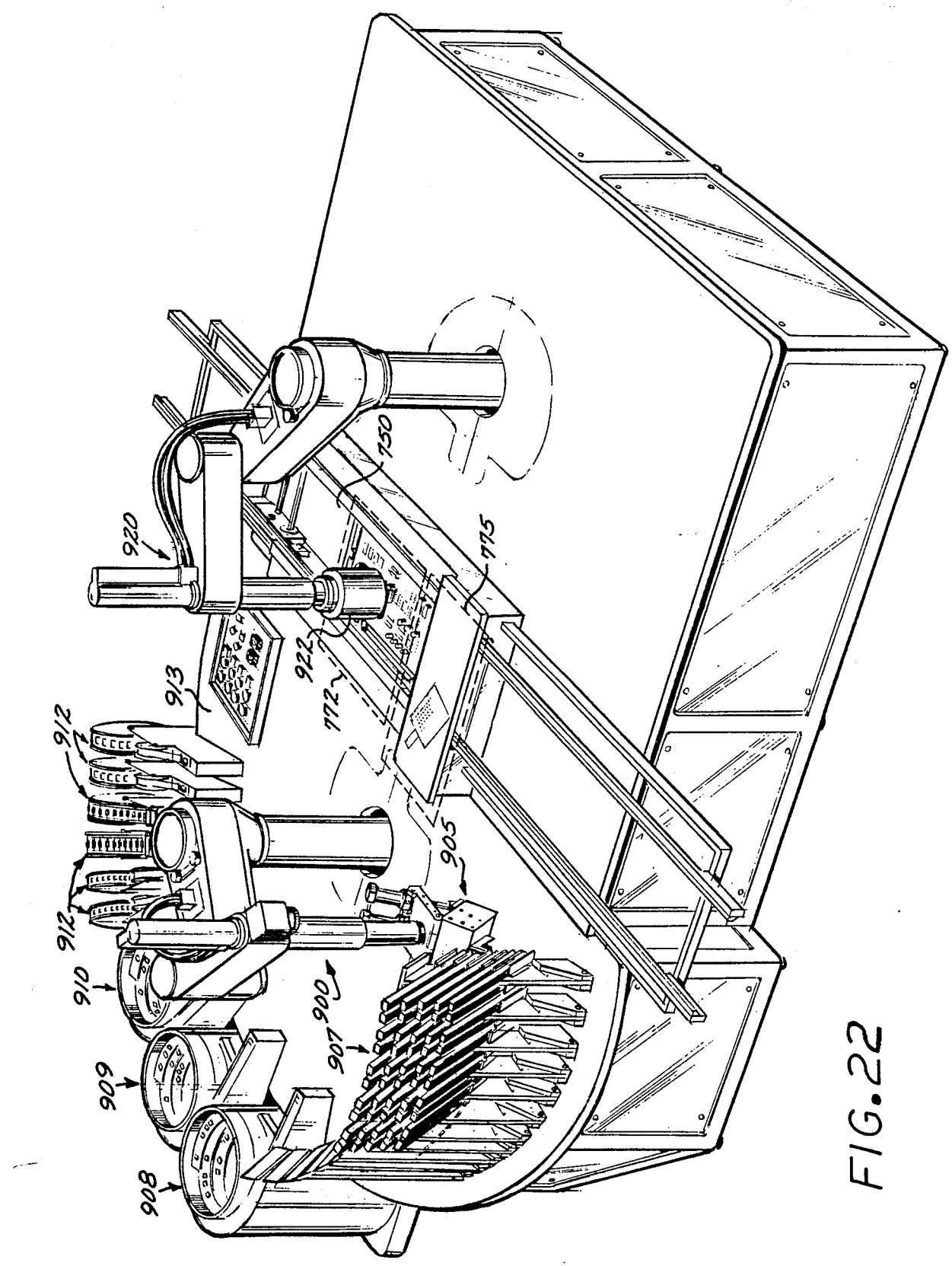
FIG. 22 is a perspective view of a third embodiment of a component insertion system including apparatus for component lead straightening, component insertion, and lead clinching.

Referring now to FIG. 22, a perspective view is shown of an embodiment of a component insertion system embodying the invention. In general, the component insertion system comprises a component presentation module which includes a presentation robot 900 for selecting a component from one of a plurality of component feeder devices and providing the selected component to a presentation station for lead straightening and cutting. A component insertion module includes an insertion robot, which retrieves the component at the presentation station and inserts it into the printed circuit board. The component insertion module further comprises a clinching system as described above for clinching the leads of the inserted component.

The component presentation module comprises a presentation robot 900 and one or more component feeder devices. Thus, for example, the component presentation module may include tube or stick feeders 907, vibratory bowl feeders 908–910, tape feeders 912, and tray feeders 913. The feeder devices per se are well known and need not be described in further detail.

The component presentation robot 900 is adapted to pick up a component from one of the feeder devices and present the component to the presentation station 775. The presentation robot 900 comprises a 4-axis servo robot, marketed by Adept Technology, Inc., Sunnyvale, Calif., as in the "Adept One" robot.

The system further comprises a printed circuit board locating and transfer system (the "BLT system") which automatically transfer the board into and out of the system work cell. The printed circuit board is precisely located at the insertion station 772 by the BLT system during the assembly cycle so that the board position is precisely registered with respect to the component insertion and clinching operations. In the disclosed embodiment, the board locating and transfer system comprises a printed circuit board conveyor system 750. The conveyor system is adapted to automatically convey the printed circuit board which is mounted on the conveyor into position to and from the insertion station 772.

Another aspect of the invention is a means for straightening the component leads and cutting them to a predetermined length. The lead straightening and cutting means comprises a pair of plates disposed at the presentation station, in combination with the presentation robot 900. In accordance with the invention the presentation robot 900 inserts the component leads into oversized lead openings formed in the straightener/cutter plates, and then oscillates the component body through a predetermined series of movements, bending the leads back and forth in a repetitive exercising motion so as to straighten the leads.

The presentation robot 900 then releases the component body, with its leads clamped in the lead straightening and cutting plates. At this point the component insertion robot 920 moves to the presentation station 775 and its end effector 922 grips the body of the component. If the leads are not to be cut, the lead clamp is released and the part is inserted. However, if the leads are to be cut, the lower plate is moved by a powerful shear cylinder to shear the leads.

The component is then inserted by the insertion robot system 920. In this embodiment, robot 920 comprises the Seiko robot system and the novel end effector described hereinabove with respect to FIGS. 1–11.

Another facet of this embodiment is to employ the clinching apparatus described hereinabove to clinch the leads of the components as they are inserted into the printed circuit board. Thus, as each part is inserted into the board, the clincher element is operated through a preprogrammed clinching movement to clinch its leads.

The insertion robot then releases that component and returns to the next station.

For the embodiment shown in FIG. 22, the rectangular upper table surface 602 as described with respect to the clinching system embodiment shown in FIG. 12 is replaced by elements of the conveyor system.

Thus, the system described in FIG. 2 is a general purpose and flexible system adapted to efficiently select a part to be inserted, straighten and cut the leads, and then insert and subsequently clinch the leads to the printed circuit board. The system is highly flexible in that it is not limited to a single board application, but rather is programmable to accommodate a wide variety of printed circuit boards, components, and assembly operations. Moreover, no mechanical changes are required to shift from one type of board to another. So long as the required components are made available at the feeder devices, the system can accommodate different board products simply by modifying the system software. This is a substantial advantage over systems which require mechanical retooling to change over from one product to another.

Referring now to FIG. 24, a top view of the conveyor system 750 is illustrated. The conveyor comprises a pair of flexible chains comprising a plurality of linked chain elements which are reeved about idler and drive pulleys disposed along the longitudinal extent of the conveyor.

In the disclosed embodiment, the conveyor 750 comprises a pair of elongated side rails 751, 752 mounted in substantially parallel relationship. Each of the side rails 51, 752 comprises a channel whose width is adapted to receive an extending leg of the respective chain element. This is shown, for example, in FIG. 25, a cross-sectional view taken along line 25—25 of FIG. 24, wherein an element of chain 755 is shown with a leg member 755a disposed in a receiving channel 752a formed in the side rail 752. In the FIGS. 24 and 28, idler shaft 756 and idler pulleys 757 and 757a, as well as drive shaft 758, drive pulley 759 and drive motor 760 are visible or shown in phantom.

The printed circuit boards 770 are received in a board bracket 768 for transport along the conveyor 750. The conveyor 750 is fitted with clamping means for clamping the board bracket 768 in fixed position. The clamping means is illustrated in FIGS. 26 and 27. In the longitudinal cross-section of FIG. 26, the upper rail 763 is shown in relation to the elongated side rail 752. The upper rail 763 is mounted for vertical movement on shafts of the air cylinders 764 and 765. Thus, by actuation of the air cylinders 764, 765 the rail 763 may be moved vertically upwardly or downwardly so that in the downward position the board bracket is clamped between the adjacent surfaces of rails 752 and 763. Upper rail 762 is supported in a similar fashion by a corresponding pair of air cylinders.

In the horizontal cross-sectional view of FIG. 27, the bracket 768 is shown as it is supported between the two conveyor chains 754, 753. The upper rails 763, 766 are illustrated in the raised position with respect to the bracket 768. Thus, by actuation of the pairs of air cylinders supporting the upper rails 763, 766, these rails may be brought into clamping relationship so as to clamp the bracket 768 in a fixed position.

The component insertion station is generally indicated by phantom line 772 in FIG. 24. With the printed circuit board 770 held in bracket 768, which is in turn clamped in position by the rail clamp as described above, a clinching system such as has been described with respect to FIGS. 12–21 may be constructed in relation to the insertion station 772. In this application, the table surface 620 of the previous embodiment is replaced with the conveyor system 750 and the bracket 768.

The component presentation station 775 (FIG. 24) receives the selected component from the presentation robot 900. At this station, the component leads are straightened and cut to a predetermined length. Referring now to FIGS. 29–32, the elements at station 775 comprising the component lead straightener and cutting system are disclosed in simplified form.

The lead straightening and cutting system comprises a pair of plates operated in combination with the component presentation robot 900. Straightener plate 778 and shear plate 779 are arranged in a parallel, contiguous relationship. The lateral position of upper plate 778 is fixed. The thickness of straightener plate 778 determines the length of the component leads after the shearing operation. This thickness will depend on the particular application; in the disclosed embodiment, plate 778 has a thickness of 3/16 inches.

A plurality of funnel-shaped openings are formed in the plates 778, 779, defining one or more opening patterns respectively corresponding to the component lead pattern of one or more components. The hole patterns employed in the preferred embodiment extend over a 2 inch by 4 inch rectangular area, to accommodate components as large as 2 inches by 4 inches. There is formed in the plates 778, 779 a plurality of opening patterns which will collectively accommodate the various types of components to be inserted into the particular board, or into a plurality of board types. The system is programmed with information defining the respective position of each opening pattern, and the robot 900 is adapted to insert the respective component into the corresponding opening pattern.

The openings formed in straightening plate 778 are funnel-shaped, as illustrated in the cross-sectional view of FIG. 32. The size of the openings will depend on the diameters of the component leads to be inserted, and the component lead spacing. For components having in-line leads, the respective funnel openings may be arranged as series of tangential openings to maximize the ability to insert bent leads into the openings in the straightening plate. A typical opening size is 0.120 inches at the top of the funnel opening in plate 778, and 0.067 inches at the bottom of the funnel.

Shear plate 779 is mounted in a sliding relationship with respect to straightener plate 778. The position of lower plate 779 in relation to plate 778 is determined by the opposing clamp and shear air cylinders 782 and 784. The air cylinders 782, 784 are secured to opposing ends of lower plate 779 in an axially aligned relationship, as shown in phantom in FIG. 31.

With the plates 778, 779 aligned so that the respective openings in each plate are aligned, the presentation robot is adapted to insert the component leads into the appropriate opening pattern in plates. Air cylinder 782 has a diameter of about ½ inch, to which a supply of pressurized air at 100 psi is selectively coupled through a valve (not shown), to exert a laterally clamping force, typically about 20 pounds on plate 779. The purpose of cylinder 782 is to clamp the leads in position by slightly moving the lower plate in relation to upper plate 778. The clamping force is not sufficient to shear the component leads.

The purpose of shear cylinder 784 is to exert a shearing force on the lower plate 779 so as to forceably move the lower plate 779 in relation to upper plate 778 so as to shear the component leads as they extend below the plate 778. In the disclosed embodiment, the air cylinder 784 has a diameter of 4 inches and a ⅛ inch stroke, and is coupled selectively to a 100 psi air supply through an air valve (not shown) to exert 1200 pounds of cutting forces.

Shear cylinder 784 comprises shear arm 784a which is connected to a clevis 779a, secured to the plate 779. The pin 784c extends through slot 784b formed in arm 784a to secure the clevis 779a to the arm 784a. The slot allows free clamping movement of the lower plate 779 caused by actuation of air cylinder 782, without requiring the clamp cylinder 782 to exert enough force to move the shear cylinder 784.

A pair of microswitch sensors 790, 791 are appropriately arranged to be triggered by arm 779b mounted to the clevis 779a. Sensor 790 indicates that the plates are in the aligned position, and sensor 791 indicates the end-of-travel for the shear motion, providing a positive indication that the shear action has been performed.

The lead straightening and cutting system further comprises the presentation robot 900. The robot 900 employs an end effector 905, shown in FIG. 33, mounted on robot arm 901, to grip the components at the feeder devices. The end effector is adapted for a 45° pitch angle to accommodate gravity feeder tracks, and can be actuated to rotate 45° to squarely present the gripped component to the presentation station 775.

The end effector body member 906 is adapted to rotate about hinge pin 906a in response to the force executed by the air cylinders 907a, 906b. The air cylinders comprise arms 907c, 907d, which are secured to corresponding clevis members 906b,c formed on body member 906. The end effector components are cooperatively arranged so that the gripping fingers may be disposed at a 45° angle from the horizontal, or at the horizontal plane.

The end effector 905 comprises two pairs of fingers, an outer pair 905a, 905b, each formed with a respective protruding tang 905c, 905d, and an inner pair 905e, 905f.

The outer fingers 905a, 905b are each mounted for translation in directions normal to the plane of surface 905i, i.e., into ad out of the plane defined by surface 905i. Each of fingers 905a, 905b is biased in the extended position illustrated in FIG. 33 by low pressure air cylinders (not shown).

The inner fingers 905e, 905f are arranged for translation toward and away from each other. Their movement is driven by pneumatic air cylinder means (not shown) and is synchronized such that each finger is driven inwardly or outwardly in synchronization with the other finger. The fingers 905e, 905f are arranged to exert a strong gripping force on the gripped components, greater than 50 pounds, to firmly grip the component for the lead straightening sequence.

Figure 33:
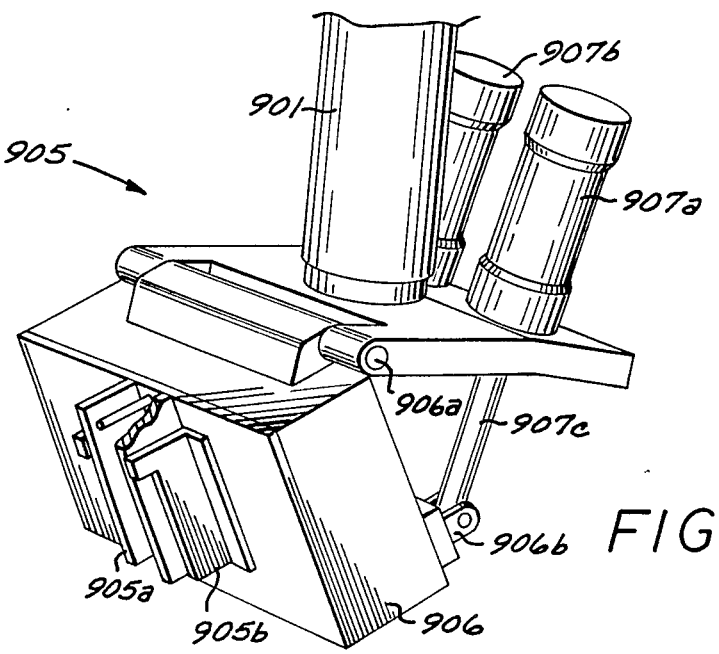
FIG. 33 is a perspective view of the robot arm end effector employed to pick up an electrical component and insert the component leads into the funnels formed in the lead straightening and cutting plates.

The end effector 905 further comprises a hold-down pin 905g which is biased in the extended position shown in FIG. 33 by a spring or air cylinder (not shown), but which may be depressed inwardly. The end effector further comprises a microswitch sensor 905h mounted to indicate when the inner fingers have fully closed. The sensor 905h thus provides a signal that the fingers 905e, 905f have failed to grip a part, since the fingers do not go the fully closed position when a part has been gripped.

Figure 36A:
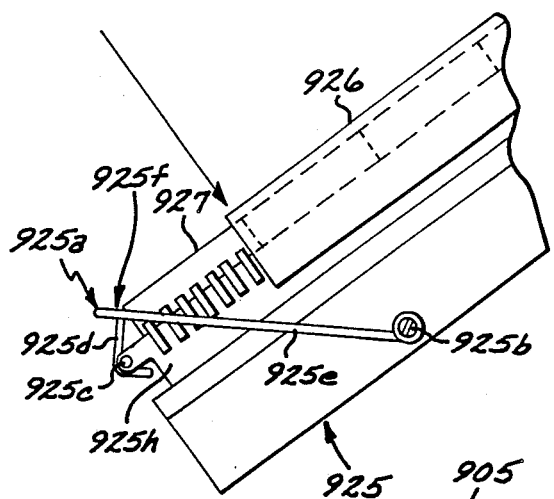
FIGS. 36(a)–(c) depict a tube feeder and the grasping of components from the tube feeder by the presentation robot.

The operation of the end effector is more fully described with reference to FIGS. 36(a)–(c). FIG. 36(a) illustrates a partial side view of a tube feeder 925, arranged at a 45° angle from the horizontal. A plurality of components 927 having in-line leads are stored in tube 927. The feeder 925 includes a central rib 925(d). The leads of the components 927 straddle central rib 925(d). A retainer pin 925(c) is passed through the end of rib 925d.

A novel aspect is the L-shaped spring clip 925a secured by fastener 925b to the body of feeder 925. The L-shaped clip 925a further includes a curved tang 925d, and the elongated side 925e forms a 90° angle with retainer portion 925f. While not visible in the side view, retainer portion 925f is about one third the length of side portion 925e.

The purpose of clip 925a is to provide a stop means preventing the leads of components 927 from colliding with pin 925c and thereby bending the leads. With the clip in the position shown in FIG. 36(a) the trailing or back edge of the first component is retained inside the tube, preventing the component from tumbling out of the feeder 925 as the components are loaded.

Figure 36B:
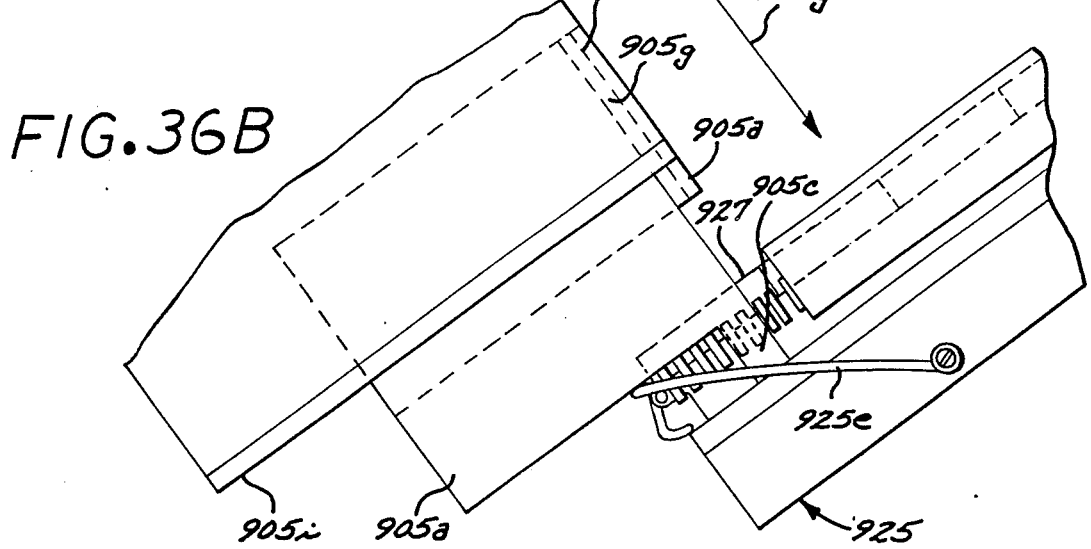
Figure 36C:
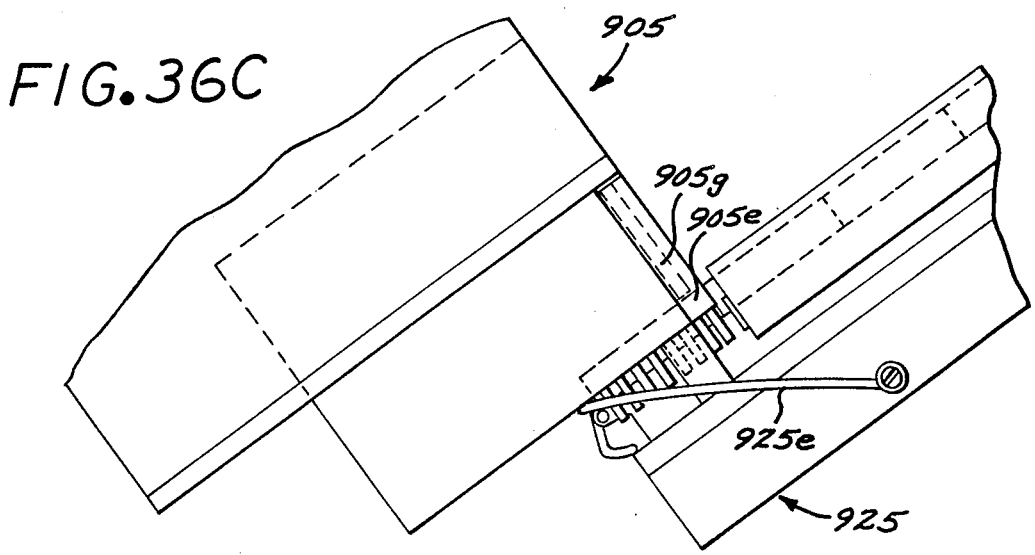

Referring now to FIGS. 36(b),(c), side views of the end effector 905 and the feeder 925 are shown, with FIG. 36(b) illustrating an initial contacting position as the end effector initially engages the feeder 925, and FIG. 36(c) illustrating a fully engaged position for extracting the component. The end effector is moved along axis 925g from the position of FIG. 36(b) to that of FIG. 36(c).

The outer finger 905a initially engages the clip 925a, and depresses it out of engagement with the body of component 927. Component 927 then slides down the central rib into engagement with pin 925c. As the effector approaches the feeder 925, the tang 905c engages the body of feeder 925, and as the effector 905 moves to the fully engaged position, the outer finger 905a slides inwardly into surface 905i, against the bias of its corresponding air cylinder.

In the fully engaged position of FIG. 36(c), the inner jaws 905e, 905f are in position to grip the component 72, the hold-down pin 905g having engaged the trailing edge of the component 927 to hold the component down into contact with central rib 925d, allowing the end effector 905 to squarely grip the component 927.

Figure 23:
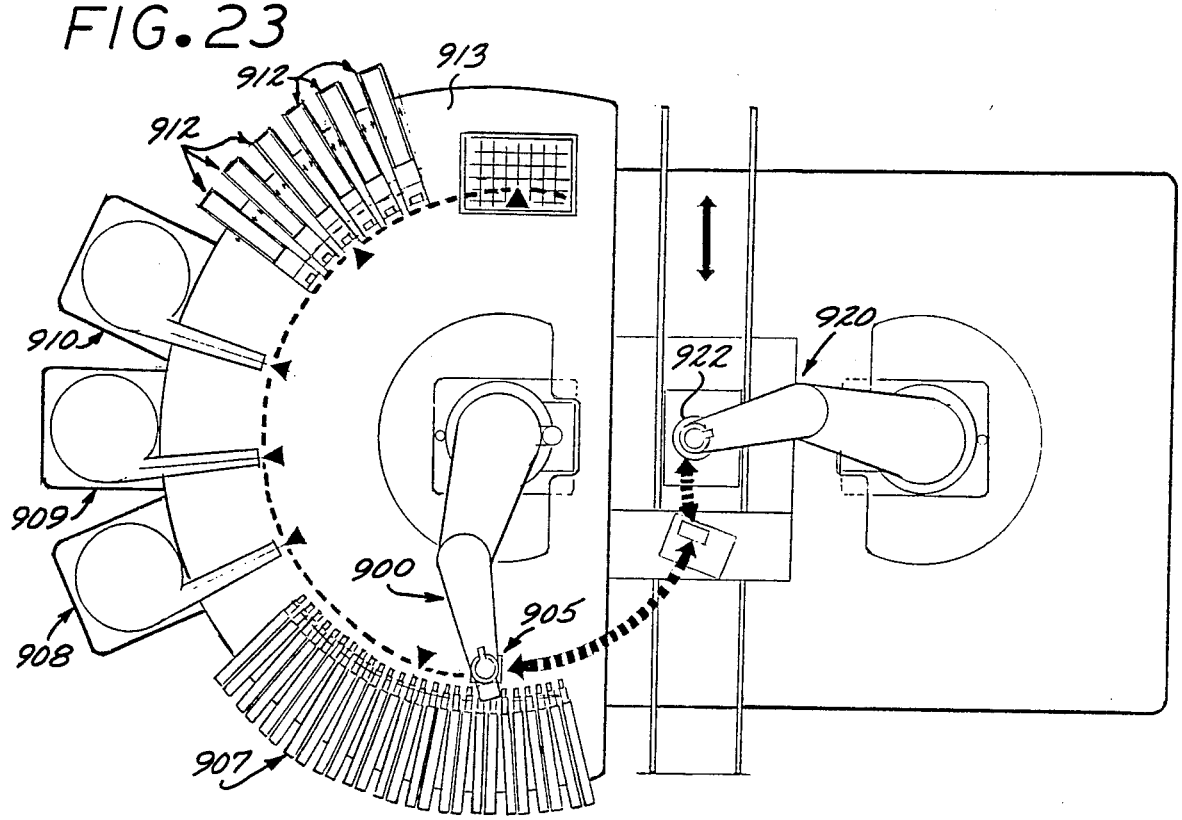
FIG. 23 is a simplified top view of the third embodiment.

As shown in the top view of FIG. 23, the presentation robot 900 selects one component from the plurality of component feeders. The end effector 905 is adapted to securely grip the body of the selected component for the ensuing lead straightening sequence. In this sequence, the presentation robot moves to the presentation station 775, and inserts the component leads into the corresponding opening pattern in the plates 778, 779, which are in the aligned position. With the leads inserted in the funnel openings and their position substantially constrained, the presentation robot executes a predetermined series of oscillating movements moving the component body with respect to the constrained leads. The particular movements are typically empirically determined for each particular component type. A typical series of movements is to repetitively oscillate the component body in four directions +X, −X, +Y, −Y, 1/32 inch away from the central inserted position.

The oscillatory movements are adapted to flex the leads in one direction (for example, +X) to a minimum yield point, i.e., the deflection at which the lead no longer springs back or returns to its initial position, and then to flex the lead in the opposite direction (−X) from the central position to the opposite yield point. The yield point depends on factors such as the stiffness of the leads and is empirically determined. The leads may then be flexed in the direction (+Y,−Y) normal to the first series of movements. More than one series of movements may be required. Upon completion of the oscillatory movements, the leads will be aligned at averaged positions within a few thousandths of an inch from the nominal, perfectly aligned condition. It is desirable to minimize the required oscillations, to minimize the risk of breaking the leads.

An aspect of the invention is the flexibility of the system to accommodate virtually any component and straighten its leads sufficiently that the insertion robot can successfully insert the component into the circuit board. Because the funnel openings comprising the opening patterns in the plates 778, 779 are over-sized relative to the circuit board opening, the presentation robot is able to insert components into the plates 778, 779 which could not be successfully inserted into the circuit board by the insertion robot because one or more of the component leads are misaligned.

Figure 35:
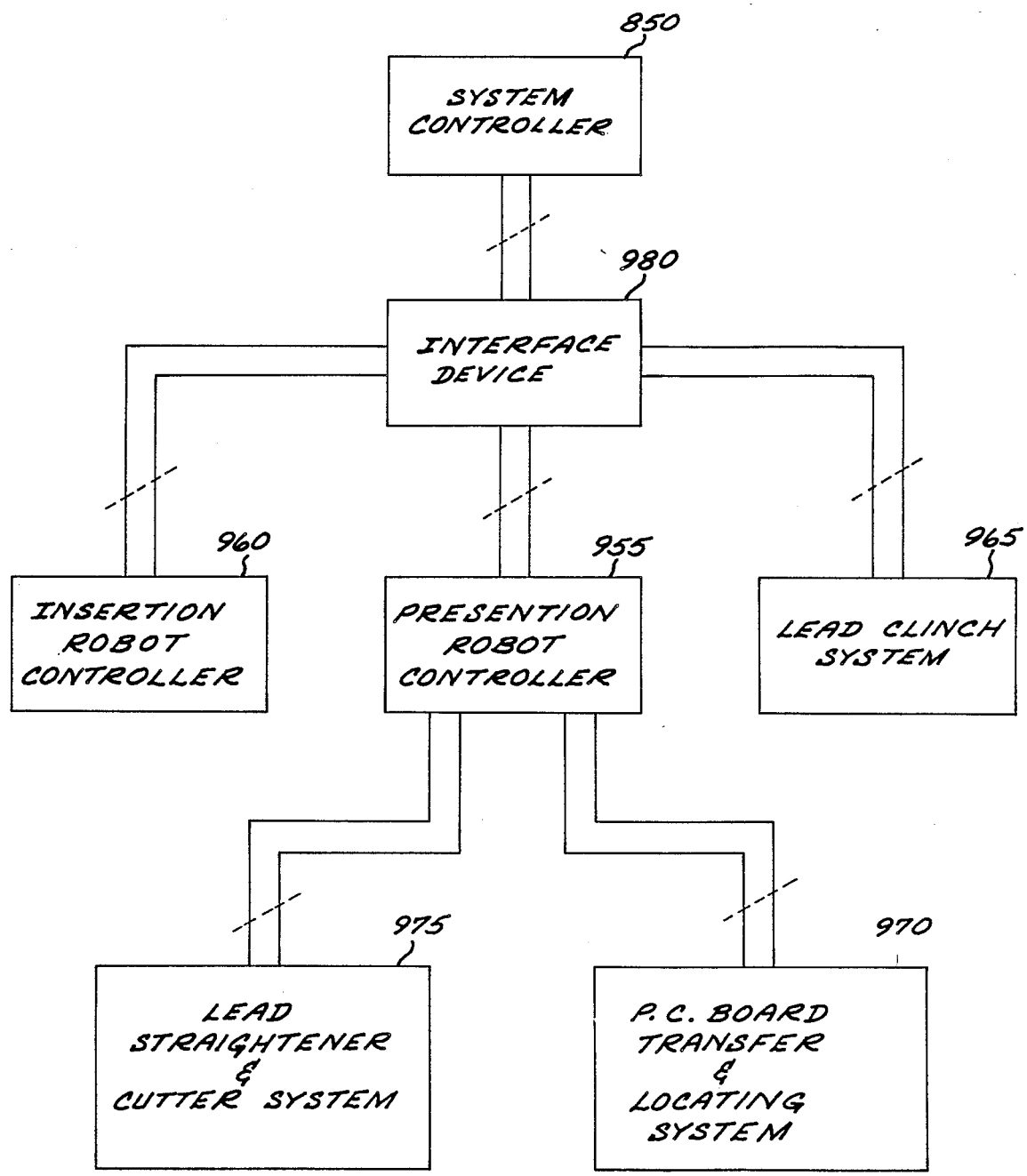
FIG. 35 is a block diagram of the component insertion system depicted in FIG. 22.

FIG. 35 is a block diagram illustrative of the control system for architecture controlling the operation of the component insertion system shown in the perspective view of FIG. 22. In this embodiment, the system controller 850 provides overall control over the entire system. As described above, controller 850 comprises a personal computer station, such as the IBM personal computer, with associated memory, display and keyboard functions, enabling a system operator to interface with the system.

In the embodiment, the presentation robot 900, as well as the insertion robot, comprise commercially available systems, and each system includes a robot controller, indicated in FIG. 35 as presentation robot controller 955 and insertion robot controller 960.

The system controller is interfaced with the presentation robot controller 955, the insertion robot controller 960 and the clinch system (indicated generally as block 965) through interface device 980. Each robot controller is programmed to accept instructions from the system controller 850, and to provide responsive information to the controller 850, via the interface device 980.

The component clinch system 965 is directly controlled by the system controller, as described above.

The board transfer and locating system, indicated generally in FIG. 35 as block 970, is controlled by the presentation robot controller 955. Thus, controller 955 is adapted to control the operation of the conveyor motor and the air cylinders actuating the clamp mechanism for fixing the location of the board bracket 768 at the insertion station 772.

The presentation robot controller 955 is further adapted to control the operation of the lead straightener and cutting system. Thus, the controller 955 controls the function of the clamp and shear cylinders, and monitors the sensors 790, 791. The controller 850 indirectly controls the operation of the presentation robot 900, by interfacing with the robot controller 955.

The system controller 850 is programmed to perform such functions as system start-up control, data handling, system sequencing, error fielding, and controlling the teaching sequences for the insertion robot and the clinch system. A listing of an exemplary program for the IBM personal computer is set forth in Appendix A.

The presentation robot controller 955 includes a peripheral disc drive memory unit, enabling the controller to perform several program functions. The controller 955 controls the movement of the presentation robot arm and end effector, in its part retrieval function. The controller 955 also controls the straightener and cutter operation sequence, and the handshaking performed with the insertion robot to ensure that the operations of the two robots are properly sequenced to avoid collisions.

The above functions are performed by one program for the controller. By another program, the controller 955 communicates with the system controller 850 and controls the operation of the board locating and transfer system. Another program is employed for the manual teaching sequence by which the pick up location and presentation location of each component are loaded into memory. Another program performs safety functions to provide for safe operation following emergency stop of the system, and verification that the position data which has been learned by the controller are regionally correct, i.e., not in conflict with the insertion module. A listing of an exemplary program for the controller 955 employed in this embodiment is set forth in Appendix B.

The insertion robot controller 960 is adapted to carry out a component pick-up and insertion function. The movement of the insertion robot arm and the operation of the end effector are under the control of controller 960. Other functions performed by this controller include part presence sensing, tactile insertion sensing, handshaking with the clinch system, teaching of the insertion movements and testing. A listing of an exemplary program for the controller 960 employed in this embodiment is set forth in Appendix It is to be understood that the control system is provided with insertion program information for each type of board to be processed. The information defines the sequence by which the various components are to be inserted into the board and their respective board locations. The control system is further provided with information defining the location of each part feeder device and the appropriate component type provided at that feeder device.

The system controller 850 is adapted to coordinate the operation of the above-described components of the component insertion systems. A series of steps occurs in sequence. First, the BLT system is operated to convey a circuit board to the insertion station and clamp it in the insertion position. The presentation robot selects the first component from the appropriate feeder device and delivers it to the component presentation station, where the leads are straightened. The presentation robot then releases the component and moves away to select the next component.

The insertion robot then grips the first component at the presentation station and the leads may then be sheared. The insertion robot then inserts the component at its predetermined location on the board. While insertion robot grips the component in its inserted position, the clinching element clinches predetermined leads of the component. The insertion robot then returns to the presentation station to grip the next component.

These steps are repeated until all the components on the board have been inserted. The BLT system then conveys the finished board away from the insertion station and delivers a new board to the station.

For the sake of clarity, specific details concerning the interfacing of the respective controllers 850, 955, 960 have been omitted. For similar reasons, specific details concerning air valves, motor drivers and peripheral devices for interfacing the controller 850 with the various elements of the board transfer and locating system 970 and the lead straightening and cutting system 975 are omitted. Such details will be apparent to those skilled in the art from the above description.

An improved component insertion system has been disclosed. The system provides the flexibility of adapting to insertion of different products without mechanical retooling, by changing the controller software. The system enhances the productivity of circuit board assembly lines by substantially reducing the time required to convert the line from assembly of one type of circuit board to another type. Moreover, because retooling is not required, the capital expenditures required to implement an assemble line capable of assembling a plurality of circuit board types may be reduced.

It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

APPENDIX A

```
10  '-----------------------------------------------------------------------
20  '   C L I N C H    S U P E R V I S O R Y    P R O G R A M
30  '   5/11/85
40  '   CHAD INDUSTRIES
50  '   WSP
60  '-----------------------------------------------------------------------
100 ' Initialization
110 KEY OFF:CLS
120 CLOSE:CLEAR
130 '
150 OPEN "COM1:9600,N,8,1" AS #1
160 OPEN "PARTFILE.CLN" AS #4
170 'OPEN "HOMEFILE.1" AND "HOMEFILE.2" FOR INPUT AS #5
180 'OPEN "PARAFILE.DAT" FOR INPUT AS #6
190 '
200 '
210 FIELD #4,5 AS PT$,6 AS X$[1],6 AS Y$[1],2 AS P$[1]
220 FIELD #4,19 AS NL1$,6 AS X$[2],6 AS Y$[2],2 AS P$[2]
230 FIELD #4,33 AS NL2$,6 AS X$[3],6 AS Y$[3],2 AS P$[3]
240 FIELD #4,47 AS NL3$,6 AS X$[4],6 AS Y$[4],2 AS P$[4]
250 FIELD #4,61 AS NL4$,6 AS X$[5],6 AS Y$[5],2 AS P$[5]
260 FIELD #4,75 AS NL5$,6 AS X$[6],6 AS Y$[6],2 AS P$[6]
270 FIELD #4,89 AS NL6$,6 AS X$[7],6 AS Y$[7],2 AS P$[7]
280 FIELD #4,103 AS NL7$,6 AS X$[8],6 AS Y$[8],2 AS P$[8],2 AS CR$
290 '
300 XLIMIT=10600:YLIMIT=13500     '19210,11187
310 PARTLST=0:CRLF$=CHR$(13)+CHR$(10)
320 '
420 LOCATE 10,5,0,2,13
430 'PRINT "ARE YOU USING A MONOCHROME MONITOR (M) OR A COLOR MONITOR (C) ?"
440 'MNTR$=INPUT$(1):IF MNTR$<>"M" AND MNTR$<>"C" THEN 420
450 'IF MNTR$="M" THEN MNTR.SEG=&HB000
460 'IF MNTR$="C" THEN MNTR.SEG=&HB800
470 MNTR.SEG=&HB000
480 GOTO 1000      '**************COMMENTED 3/29
500 ' Setup and Homing
510 DEF SEG=MNTR.SEG
520 BLOAD "HOMEFRM1.DAT",0
530 LOCATE 20,30,0
540 INPUT "HIT RETURN WHEN READY...",DUMMY$
550 CLS
560 IF NOT EOF(1) THEN D$=INPUT$(LOC(1),#1)
570 GOSUB 1600    'homing routine
580 IF NOT EOF(1) THEN D$=INPUT$(LOC(1),#1)
590 '
1000 '   Central Operating Routine
```

```
1010 PRINT #1,CHR$(20)+"3";
1015 DEF SEG=MNTR.SEG: BLOAD "OPERFRAM.DAT",0
1020 LOCATE 15,11,1,2,13:PRINT "ENTER COMMANDS AS DESIRED";
1030 LOCATE 18,12,1,2,13
1040 LINE INPUT COMMAND$
1045 'IF LEFT$(COMMAND$,1)="A" THEN D=0:GOTO 1300
1050  IF LEFT$(COMMAND$,4)="HERE" THEN D=1:GOTO 1200    '2000
1060  IF LEFT$(COMMAND$,4)="MOVE" THEN D=2:GOTO 1200    '3000
1070  IF COMMAND$="WHERE" THEN D=3:GOTO 1200            '4000
1080  IF LEFT$(COMMAND$,4)="DISP" THEN D=4:GOTO 1200    '4200
1090  IF LEFT$(COMMAND$,5)="PRINT" THEN D=5:GOTO 1200   '4400
1100  IF COMMAND$="HELP" THEN D=6:GOTO 1200             '4600
1110  IF COMMAND$="QUIT" THEN D=7:GOTO 1200             '4800
1120  IF LEFT$(COMMAND$,4)="TERM" THEN D=8:GOTO 1200    '5000
1130  IF COMMAND$="UP" THEN D=9:GOTO 1200               '5500
1135  IF COMMAND$="DOWN" THEN D=9:GOTO 1200             '5500
1140  IF LEFT$(COMMAND$,4)="PARA" THEN D=10:GOTO 1200   '6000
1145  IF LEFT$(COMMAND$,3)="RET" THEN D=11:GOTO 1200    '9000
1150  IF LEFT$(COMMAND$,4)="EDIT" THEN D=12:GOTO 1200   '9200
1155  IF LEFT$(COMMAND$,5)="ERASE" THEN D=13:GOTO 1200  '9600
1160  IF COMMAND$="HOME" THEN 500
1165  GOTO 1230
1170 '
1200 ON D GOSUB 2000,3000,4000,4200,4400,4600,4800,5210,5500,6000,9000,9200,9600
1210 IF E=1 THEN 1400
1215 LOCATE 24,15:PRINT SPACE$(20);
1220 LOCATE 24,2:PRINT "Last Command: ";COMMAND$;
1230 LOCATE 15,11:PRINT SPACE$(67);:LOCATE 16,2:PRINT SPACE$(77);
1235 LOCATE 18,12:PRINT SPACE$(20);
1240 GOTO 1030
1250 '
1300 ' Emergency Stop
1310 PRINT #1,CHR$(3);
1312 LOCATE 15,11,0:INPUT "MOVE ABORTED, HIT RETURN TO RESET",DUMMY$
1314 PRINT #1,"@.";CRLF$;
1320 PRINT #1,"X.B200.H4000.A20000.";CRLF$;
1330 PRINT #1,"Y.B200.H4000.A20000.";CRLF$;
1340 LOCATE 15,11:PRINT SPACE$(35);:LOCATE 18,12:PRINT SPACE$(10)
1350 '
1360 GOTO 500
1400 '
1600 '      CLINCH INITIALIZATION
1605 PRINT " CLINCH HOMING..."
1610 '
1615 PRINT #1,CHR$(20)+"3";
1620 OPEN "HOMEFILE.1" FOR INPUT AS #5
1625 WHILE NOT EOF(5)
1630    LINE INPUT #5,HOMELINE$
1635    PRINT #1,HOMELINE$;CRLF$;
1640    LINE INPUT #1,DUMMY$:D$=INPUT$(1,#1)
1645 ' PRINT DUMMY$
1650 WEND
1655 CLOSE #5
1660 '
1665 OPEN "HOMEFILE.2" FOR INPUT AS #5
1670 PRINT #1,"X.B50.Y.B50.";CRLF$;:LINE INPUT #1,DUMMY$:D$=INPUT$(1,#1)
1675 ' PRINT DUMMY$
1680 FOR I= 1 TO 9
1685    LINE INPUT #5,HOMELINE$
1690    PRINT #1,HOMELINE$;CRLF$;
```

```
1695     LINE INPUT #1,DUMMY$:D$=INPUT$(1,#1)
1700  '  PRINT DUMMY$
1705     IF I=3 OR I=7 THEN 1710 ELSE 1720
1710         LINE INPUT #1,YSTAT$:D$=INPUT$(1,#1)
1715         IF INSTR(YSTAT$,"0")=1 THEN 1720 ELSE 1690
1720 NEXT I
1725 CLOSE #5
1730 LINE INPUT #1,C1$:D$=INPUT$(1,#1):LINE INPUT #1,C2$:D$=INPUT$(1,#1)
1735 IF C1$<>"+00,00/32,(NA,X" THEN 1765
1740 IF C2$<>"+00,00/32,(NA,Y" THEN 1765
1745 PRINT #1,"X.B100.H200.A5000.Y.B100.H200.A5000.";CRLF$;
1750 LINE INPUT #1,DUMMY$:D$=INPUT$(1,#1)
1755 PRINT " CLINCH HOMED"
1760 RETURN
1765 PRINT "** CLINCH HOMING ERROR **"
1770 PRINT C1$,C2$:PRINT "HIT ANY KEY TO TRY AGAIN..."
1775 D$=INPUT$(1)
1780 GOTO 1620
1785 '----------------------------------
2000 '  Here Routine
2010 '
2020 IF LEN(COMMAND$)>8 THEN 2060
2030 LOCATE 15,10:PRINT SPACE$(50):LOCATE 15,11:PRINT "INPUT C##.#";
2040 LOCATE 18,17:INPUT "C",PNT$
2050 COMMAND$="HERE C"+PNT$
2060 DC=INSTR(COMMAND$,"C"):DP=INSTR(COMMAND$,".")
2065 IF DP=0 OR DC=0 THEN 2030
2070 PART=VAL(MID$(COMMAND$,DC+1,DP-DC))
2080 PATHPT=VAL(RIGHT$(COMMAND$,1))
2090 GOSUB 12130   'Display complete path
2100 GOSUB 11000   'Get current location
2110 CX[PATHPT]=XSTEPS
2120 CY[PATHPT]=YSTEPS
2130 LOCATE 15,11:PRINT "DURING THE MOVE, IS CLINCH BALL TO BE";
2140 LOCATE 16,11:PRINT "POSITIONED...UP OR DOWN ?";
2150 LOCATE 18,24,1:INPUT "-",PPP$
2160 IF LEFT$(PPP$,1)="U" THEN PP$[PATHPT]="1" ELSE PP$[PATHPT]="0"
2170 GOSUB 13000   'Display new path
2180 GOSUB 12000   'File new path
2190 LOCATE 15,10:PRINT SPACE$(40)
2200 RETURN
2210 '
3000 '    M O V E   R O U T I N E
3010 '
3020 CMD$=COMMAND$':STOP
3030 IF LEN(CMD$)<6 THEN 3500   'GOTO FORMATTING NOTE
3040 MC=INSTR(CMD$,"C"):IF MC<>0 THEN 3200
3050 '
3060 MX=INSTR(CMD$,"X"):IF MX=0 THEN 3500
3070 CMD$=RIGHT$(CMD$,LEN(CMD$)-MX)
3080 CX$=STR$(VAL(CMD$)):IF CX$="0" AND ASC(CMD$)<>48 THEN 3500
3090 MY=INSTR(CMD$,"Y"):IF MY=0 THEN 3500
3100 CMD$=RIGHT$(CMD$,LEN(CMD$)-MY)
3110 CY$=STR$(VAL(CMD$)):IF CY$="0" AND ASC(CMD$)<>48 THEN 3500
3120 IF VAL(CX$)>XLIMIT OR VAL(CY$)<YLIMIT THEN 3140
3130 LOCATE 15,11:PRINT "COORDINATES ARE OUTSIDE OF LIMITS":GOTO 3500
3140 MOVESTRG$="Y.M"+CY$+".X.M"+CX$+".G.Y.G.BW6."
3150 PRINT #1,MOVESTRG$;CRLF$;
3160 LINE INPUT #1,R$:D$=INPUT$(1,#1)   '******************ADDED 3/29/85
3170 IF R$<>MOVESTRG$ THEN BEEP:PRINT #1,CHR$(3);
```

```
3180 GOTO 3610
3190 '
3200 MP=INSTR(CMD$,"."):IF MP=0 THEN 3500
3210 PART=VAL(MID$(CMD$,MC+1,MP-MC-1)):IF PART=0 THEN 3500
3220 GOSUB 12130   'GET PATH COORDINATES
3230 PATHPT$=RIGHT$(CMD$,1)
3240 IF PATHPT$="*" THEN 3300
3250 PATHPT=VAL(PATHPT$):IF PATHPT<1 OR PATHPT>8 THEN 3500
3260 CX$=STR$(CX[PATHPT]):CY$=STR$(CY[PATHPT]):CP$=PP$[PATHPT]
3270 CX$=RIGHT$(CX$,LEN(CX$)-1):CY$=RIGHT$(CY$,LEN(CY$)-1)
3280 GOSUB 3400
3282 PRINT #1,"X.KZL0.P.BW6.";CRLF$;
3284 LINE INPUT #1,DUMMY$:D$=INPUT$(1,#1)
3290 GOTO 3600
3295 '
3300 FOR PATHPT=1 TO 8
3310 IF CX[PATHPT]=-1 OR CY[PATHPT]=-1 THEN PATHPT=9:GOTO 3360
3320 CX$=STR$(CX[PATHPT]):CY$=STR$(CY[PATHPT])
3330 CX$=RIGHT$(CX$,LEN(CX$)-1):CY$=RIGHT$(CY$,LEN(CY$)-1)
3340 CP$=PP$[PATHPT]
3350 GOSUB 3400
3360 NEXT PATHPT
3362 PRINT #1,"X.KZL0.P.BW6.";CRLF$;
3364 LINE INPUT #1,DUMMY$:D$=INPUT$(1,#1)
3370 GOTO 3600
3380 '
3400 MOVESTRG$="Y.M"+CY$+".X.M"+CX$+".G.Y.G.BW6."
3410 CYLSTRG$="X.KZL"+CP$+".P.BW6."
3420 PRINT #1,CYLSTRG$+MOVESTRG$;CRLF$;
3430 LINE INPUT #1,R$:D$=INPUT$(1,#1)   '*****************ADDED 3/29/85
3440 'IF R$<>MOVESTRG$+CYLSTRG$ THEN BEEP:STOP
3450 RETURN
3460 '
3500 LOCATE 15,11:PRINT "REFORMAT COMMAND AS SHOWN BELOW          ";
3510 LOCATE 18,12:PRINT "MOVE                              ";
3520 LOCATE 20,14:PRINT "MOVE C###.#   (1-8)  One point";
3530 LOCATE 21,14:PRINT "MOVE C###.*   Complete path   ";
3540 LOCATE 22,14:PRINT "MOVE X#####,Y#####   Coordinate move";
3550 LOCATE 18,17,1:LINE INPUT "",NEWCMD$
3560 COMMAND$="MOVE "+NEWCMD$
3570 GOTO 3000
3580 '
3600 GOSUB 13000   'Display part path
3610 GOSUB 11000   'Get current location"
3620 RETURN
3630 '
4000 '   Where Routine
4010 '
4020 GOSUB 11000
4030 RETURN
4040 '
4200 '   Display Routine
4210 '
4220 IF LEN(COMMAND$)>6 THEN 4260
4230 LOCATE 15,10:PRINT SPACE$(50):LOCATE 15,11:PRINT "INPUT C#";
4240 LOCATE 18,17,1:INPUT "C",PART$
4250 COMMAND$="DISP C"+PART$
4260 DC=INSTR(COMMAND$,"C")
4270 IF DC=0 THEN 4230
4280 PART=INT(VAL(RIGHT$(COMMAND$,LEN(COMMAND$)-DC)))
```

```
4290 GOSUB 12130    'Retrieve File
4300 GOSUB 13000    'Display points
4310 RETURN
4320 '
4600 '   Help Routine
4610 '
4620 LOCATE 15,11:PRINT "...ONE MOMENT PLEASE...    "
4630 'DEF SEG=MNTR.SEG:BSAVE "C:CURFRAME.DAT",0,16384
4640 DEF SEG=MNTR.SEG:BLOAD "HELPFRAM.DAT",0
4650 LOCATE 24,20:LINE INPUT "HIT RETURN TO CONTINUE...",DUMMY$
4660 DEF SEG=MNTR.SEG:BLOAD "OPERFRAM.DAT",0        'C:CURFRAME.DAT"
4670 RETURN
4680 '
4800 '   Quit Routine
4810 '
4820 CLS:END
4830 '
5000 '   Terminal Routine
5010 '
5020 OPEN "COM1:9600,N,8,1" AS #1
5030 CLS
5040 LOCATE ,,1
5050 B$ = INKEY$
5060 IF B$=CHR$(17) THEN 5250
5070 IF B$=CHR$(13) THEN B$=B$+CHR$(10)
5080 IF B$<>"" THEN PRINT #1,B$;
5090 IF EOF(1) THEN 5050        'EOF MEANS BUFFER IS EMPTY
5100 IF LOC(1)>225 THEN BEEP
5110 A$ = INPUT$(1,#1)
5120 'FOR I=1 TO LEN(A$)
5130 D = ASC(A$)
5140 IF D=10 THEN 5180
5150 IF D=17 OR D=19 OR D=127 THEN A$=""
5160 IF D=8 THEN A$=CHR$(29)
5170 PRINT A$;
5180 IF LOC(1)>0 THEN 5110
5190 GOTO 5050
5200 '
5210 LOCATE 15,11:PRINT "...ONE MOMENT PLEASE...   ";
5220 'DEF SEG=MNTR.SEG:BSAVE "C:CURFRAM.DAT",0,16384
5230 GOTO 5030
5240 RETURN
5250 DEF SEG=MNTR.SEG:BLOAD "OPERFRAM.DAT",0     '"C:CURFRAM.DAT"
5260 RETURN
5270 '
5500 '   Up/Down Routine
5510 '
5520 IF LEFT$(COMMAND$,1)="U" THEN 5700
5530 IF LEFT$(COMMAND$,1)<>"D" THEN 5900
5540 '
5550 'Down
5560 PRINT #1,"KZL0.X.P.BW6.DT.";CRLF$;
5570 LINE INPUT #1,R$
5580 IF R$<>"KZL0.X.P.BW6.DT." THEN BEEP
5590 LINE INPUT #1,DUMMY$
5600 LOCATE 12,40:PRINT "   DN "
5610 RETURN
5620 '
5700 'Up
5710 PRINT #1,"KZL1.X.P.BW6.DT.";CRLF$;
```

```
5720 LINE INPUT #1,R$
5730 IF R$<>"KYL1.X.P.BW6.DT." THEN BEEP
5740 LINE INPUT #1,DUMMY$
5750 LOCATE 12,40:PRINT "UP     "
5760 RETURN
5770 '
5900 LOCATE 15,11:PRINT "ENTER EITHER 'UP' OR 'DOWN'"
5910 LOCATE 18,12:PRINT SPACE$(40)
5920 LOCATE 18,12,1:LINE INPUT "",COMMAND$
5930 GOTO 5500
5940 '
6000 '    Parameters Routine
6010 '
6020 LOCATE 15,11:PRINT "...ONE MOMENT...         "
6030 DEF SEG=MNTR.SEG:BLOAD "PARAFRAM.DAT",0
6040 '
6100 'Retrieve file
6110 OPEN "PARAFILE.DAT" FOR INPUT AS #6
6120 IF EOF(6) THEN 6340
6130 ON ERROR GOTO 6320
6140 INPUT #6,DUMY1$,SPD$,DUMY2$,CTM$,DUMY3$,CYL$,DUMY4$,FDBK$
6150 INPUT #6,DUMY1$,XBSPD$
6160 FOR I=1 TO 5
6170    INPUT #6,DUMY1$,XAC$[I],DUMY2$,XHS$[I]
6180 NEXT I
6190 FOR I=1 TO 5
6200    INPUT #6,DUMY1$,XDC$[I],DUMY2$,XLS$[I]
6210 NEXT I
6220 INPUT #6,DUMY1$,YBSPD$
6230 FOR I=1 TO 5
6240    INPUT #6,DUMY1$,YAC$[I],DUMY2$,YHS$[I]
6250 NEXT I
6260 FOR I=1 TO 5
6270    INPUT #6,DUMY1$,YDC$[I],DUMY2$,YLS$[I]
6280 NEXT I
6290 INPUT #6,DUMY1$,XLIMIT,DUMY2$,YLIMIT
6300 CLOSE #6:ON ERROR GOTO 0:GOTO 6510
6310 '
6320 PRINT ERR,ERN:IF ERR=62 THEN 6340
6330 ON ERROR GOTO 0:STOP
6340 LOCATE 16,12:PRINT "CREATING A NEW FILE..."
6350 CLOSE #6:GOTO 6360
6360 FOR I=1 TO 5
6370 XAC$[I]="10000":YAC$[I]="20000"
6380 XHS$[I]="4000":YHS$[I]="5000"
6390 XDC$[I]="8000":YDC$[I]="15000"
6400 XLS$[I]="3000":YLS$[I]="4000"
6410 NEXT I
6420 SPD$="SLOW"
6430 CTM$="250":CYL$="OFF"
6440 FDBK$="YES"
6450 XBSPD$="200":YBSPD$="300"
6460 XLIMIT=19000:YLIMIT=11000
6470 CLOSE #6:RESUME 6510
6480 '
6500 'Print Table
6510 IF MNTR$="C" THEN COLOR 13
6520 LOCATE 4,38:PRINT SPD$
6530 LOCATE 5,40:PRINT CTM$:LOCATE 5,70:PRINT CYL$;"    "
6540 LOCATE 6,35:PRINT FDBK$;"   "
```

```
6550 LOCATE 9,17:PRINT XBSPD$:LOCATE 9,57:PRINT YBSPD$
6560 FOR I=1 TO 5
6570 LOCATE 10+I,11:PRINT XAC$[I]:LOCATE 10+I,29:PRINT XHS$[I]
6580 LOCATE 10+I,51:PRINT YAC$[I]:LOCATE 10+I,69:PRINT YHS$[I]
6590 NEXT I
6600 FOR J=1 TO 5
6610 LOCATE 16+J,11:PRINT XDC$[J]:LOCATE 16+J,29:PRINT XLS$[J]
6620 LOCATE 16+J,51:PRINT YDC$[J]:LOCATE 16+J,69:PRINT YLS$[J]
6630 NEXT J
6640 LOCATE 23,18:PRINT XLIMIT:LOCATE 23,58:PRINT YLIMIT
6650 '
6660 IF MNTR$="C" THEN COLOR 14
6670 LOCATE 25,20,1,1,6:PRINT "Do you wish to change anything ? (Y/N) ";
6680 'IF MNTR$="C" THEN COLOR 13
6690 A$=INKEY$
6700 IF A$<>"Y" AND A$<>"N" THEN 6690
6710 IF A$="N" THEN LOCATE ,,0,7,7:GOTO 7900
6720 '
6800 'New Parameters
6805 LOCATE 25,20:PRINT "        Enter Changes                                   ";
6810 LOCATE 4,38,1:INPUT "",CHG$
6820 IF CHG$="" THEN 6840 ELSE IF CHG$="L" THEN 6810
6830 IF CHG$<>"FAST" AND CHG$<>"SLOW" THEN 6810 ELSE SPD$=CHG$
6840 LOCATE 5,40:INPUT "",CHG$
6850 IF CHG$="" THEN 6870 ELSE IF CHG$="L" THEN 6810
6860 IF VAL(CHG$)=0 THEN 6840 ELSE CTM$=CHG$
6870 LOCATE 5,70:INPUT "",CHG$
6880 IF CHG$="" THEN 6900 ELSE IF CHG$="L" THEN 6840
6890 IF CHG$<>"ON" AND CHG$<>"OFF" THEN 6870 ELSE CYL$=CHG$
6900 LOCATE 6,35:INPUT "",CHG$
6910 IF CHG$="" THEN 6930 ELSE IF CHG$="L" THEN 6870
6920 IF LEFT$(CHG$,1)<>"Y" AND LEFT$(CHG$,1)<>"N" THEN 6900 ELSE FDBK$=CHG$
6930 LOCATE 9,17:INPUT "",CHG$
6940 IF CHG$="" THEN 6960 ELSE IF CHG$="L" THEN 6900
6950 IF VAL(CHG$)=0 THEN 6930 ELSE XBSPD$=CHG$
6960 FOR I=1 TO 5
6970   LOCATE I+10,11:INPUT "",CHG$
6980   IF CHG$="" THEN 7000 ELSE IF CHG$="L" THEN 7030
6990   IF VAL(CHG$)=0 THEN 6970 ELSE XAC$[I]=CHG$
7000   LOCATE I+10,29:INPUT "",CHG$
7010   IF CHG$="" THEN 7040 ELSE IF CHG$="L" THEN 6970
7020   IF VAL(CHG$)=0 THEN 7000 ELSE XHS$[I]=CHG$:GOTO 7040
7030   IF I=1 THEN I=10 ELSE I=I-1:GOTO 6970
7040 NEXT I
7050 IF I>9 THEN 6930
7060 FOR I=1 TO 5
7070   LOCATE I+16,11:INPUT "",CHG$
7080   IF CHG$="" THEN 7100 ELSE IF CHG$="L" THEN 7130
7090   IF VAL(CHG$)=0 THEN 7070 ELSE XDC$[I]=CHG$
7100   LOCATE I+16,29:INPUT "",CHG$
7110   IF CHG$="" THEN 7140 ELSE IF CHG$="L" THEN 7070
7120   IF VAL(CHG$)=0 THEN 7100 ELSE XLS$[I]=CHG$:GOTO 7140
7130   IF I=1 THEN I=10 ELSE I=I-1:GOTO 7070
7140 NEXT I
7150 IF I>9 THEN 6960
7160 LOCATE 9,57:INPUT "",CHG$
7170 IF CHG$="" THEN 7190 ELSE IF CHG$="L" THEN 7060
7180 IF VAL(CHG$)=0 THEN 7160 ELSE YBSPD$=CHG$
7190 FOR I=1 TO 5
7200   LOCATE I+10,51:INPUT "",CHG$
```

```
7210    IF CHG$="" THEN 7230 ELSE IF CHG$="L" THEN 7260
7220    IF VAL(CHG$)=0 THEN 7200 ELSE YAC$[I]=CHG$
7230    LOCATE I+10,69:INPUT "",CHG$
7240    IF CHG$="" THEN 7270 ELSE IF CHG$="L" THEN 7200
7250    IF VAL(CHG$)=0 THEN 7230 ELSE YHS$[I]=CHG$:GOTO 7270
7260    IF I=1 THEN I=10 ELSE I=I-1:GOTO 7200
7270 NEXT I
7280 IF I>9 THEN 7160
7290 FOR I=1 TO 5
7300    LOCATE I+16,51:INPUT "",CHG$
7310    IF CHG$="" THEN 7330 ELSE IF CHG$="L" THEN 7360
7320    IF VAL(CHG$)=0 THEN 7300 ELSE YDC$[I]=CHG$
7330    LOCATE I+16,69:INPUT "",CHG$
7340    IF CHG$="" THEN 7370 ELSE IF CHG$="L" THEN 7300
7350    IF VAL(CHG$)=0 THEN 7330 ELSE YLS$[I]=CHG$:GOTO 7370
7360    IF I=1 THEN I=10 ELSE I=I-1:GOTO 7300
7370 NEXT I
7380 IF I>9 THEN 7190
7390 LOCATE 23,19:INPUT "",CHG$
7400 IF CHG$="" THEN 7420 ELSE IF CHG$="L" THEN 7290
7410 IF VAL(CHG$)=0 THEN 7390 ELSE XLIMIT=VAL(CHG$)
7420 LOCATE 23,59:INPUT "",CHG$
7430 IF CHG$="" THEN 7450 ELSE IF CHG$="L" THEN 7390
7440 IF VAL(CHG$)=0 THEN 7420 ELSE YLIMIT=VAL(CHG$)
7450 'GOTO 160
7460 '
7500 'File
7510 ON ERROR GOTO 7540
7520 KILL "PARAFILE.BAK"
7530 NAME "PARAFILE.DAT" AS "PARAFILE.BAK":GOTO 7550
7540 IF ERR=53 THEN RESUME NEXT
7550 ON ERROR GOTO 0
7560 OPEN "PARAFILE.DAT" FOR OUTPUT AS #6
7570 '
7580 PRINT #6,"SPD$,";SPD$
7590 PRINT #6,"CTM$,";CTM$
7600 PRINT #6,"CYL$,";CYL$
7610 PRINT #6,"FDBK$,";FDBK$
7620 PRINT #6,"XBSPD$,";XBSPD$
7630 FOR I=1 TO 5
7640    PRINT #6,"XAC$[";I;"],";XAC$[I]
7650    PRINT #6,"XHS$[";I;"],";XHS$[I]
7660 NEXT I
7670 FOR I=1 TO 5
7680    PRINT #6,"XDC$[";I;"],";XDC$[I]
7690    PRINT #6,"XLS$[";I;"],";XLS$[I]
7700 NEXT I
7710 PRINT #6,"YBSPD$,";YBSPD$
7720 FOR I=1 TO 5
7730    PRINT #6,"YAC$[";I;"],";YAC$[I]
7740    PRINT #6,"YHS$[";I;"],";YHS$[I]
7750 NEXT I
7760 FOR I=1 TO 5
7770    PRINT #6,"YDC$[";I;"],";YDC$[I]
7780    PRINT #6,"YLS$[";I;"],";YLS$[I]
7790 NEXT I
7800 PRINT #6,"X LIMIT,";XLIMIT
7810 PRINT #6,"Y LIMIT,";YLIMIT
7820 CLOSE #6
7830 CLS: GOTO 6000   'REDISPLAY CONTENTS OF FILE
```

```
7840 '
7900 'Transmit to stepper
7905 LOCATE 25,20:PRINT "....Transmitting Data....                                    ";
7910 IF SPD$="FAST" THEN PRINT #1,"X.K.Y.K.";CRLF$;:GOTO 7915
7913       PRINT #1,"X.L.Y.L.";CRLF$;
7915 LINE INPUT #1,DUMMY$
7920 PRINT #1,"X.S"+CTM$+".Y.S"+CTM$+".";
7930 PRINT #1,"X.B"+XBSPD$+".Y.B"+YBSPD$+".";CRLF$;
7935 LINE INPUT #1,DUMMY$:D$=INPUT$(1,#1)
7940 PRINT #1,"IAA"+XAC$[1]+".IVA"+XHS$[1]+".IAB"+XAC$[2]+".IVB"+XHS$[2]+".";
7950 PRINT #1,"IAC"+XAC$[3]+".IVC"+XHS$[3]+".IAD"+XAC$[4]+".IVD"+XHS$[4]+".";
7960 PRINT #1,"IAE"+XAC$[5]+".IVE"+XHS$[5]+".";CRLF$;
7965 LINE INPUT #1,DUMMY$:D$=INPUT$(1,#1)
7970 PRINT #1,"IDA"+XDC$[1]+".IVF"+XLS$[1]+".IDB"+XDC$[2]+".IVG"+XLS$[2]+".";
7980 PRINT #1,"IDC"+XDC$[3]+".IVH"+XLS$[3]+".IDD"+XDC$[4]+".IVI"+XLS$[4]+".";
7990 PRINT #1,"IDE"+XDC$[5]+".IVJ"+XLS$[5]+".";
8000 PRINT #1,"X.IRL.";CRLF$;
8005 LINE INPUT #1,DUMMY$:D$=INPUT$(1,#1)
8010 PRINT #1,"IAA"+YAC$[1]+".IVA"+YHS$[1]+".IAB"+YAC$[2]+".IVB"+YHS$[2]+".";
8020 PRINT #1,"IAC"+YAC$[3]+".IVC"+YHS$[3]+".IAD"+YAC$[4]+".IVD"+YHS$[4]+".";
8030 PRINT #1,"IAE"+YAC$[5]+".IVE"+YHS$[5]+".";CRLF$;
8035 LINE INPUT #1,DUMMY$:D$=INPUT$(1,#1)
8040 PRINT #1,"IDA"+YDC$[1]+".IVF"+YLS$[1]+".IDB"+YDC$[2]+".IVG"+YLS$[2]+".";
8050 PRINT #1,"IDC"+YDC$[3]+".IVH"+YLS$[3]+".IDD"+YDC$[4]+".IVI"+YLS$[4]+".";
8060 PRINT #1,"IDE"+YDC$[5]+".IVJ"+YLS$[5]+".";
8070 PRINT #1,"Y.IRL.DT.";CRLF$;
8080 WHILE NOT EOF(1)
8083 FOR T=1 TO 500:NEXT T:IF NOT EOF(1) THEN DUMMY$=INPUT$(LOC(1),#1)
8084 WEND:IF INSTR(DUMMY$,"D09")=0 THEN 8080
8090 CLS:IF MNTR$="C" THEN COLOR 12
8100 DEF SEG=MNTR.SEG:BLOAD "OPERFRAM.DAT",0
8110 RETURN
8120 '
9000 '   RETURN TO TEACH PROGRAM
9010 '
9020 IF RET.FLAG=3070 THEN CHAIN "TEACH.BAS",3070,ALL
9040 IF RET.FLAG=5030 THEN CHAIN "TEACH.BAS",5030,ALL
9050 '
9200 '   EDIT PROGRAM
9210 IF LEN(COMMAND$)>6 THEN 9270
9220 LOCATE 15,11:PRINT SPC(65)
9230 LOCATE 15,11:PRINT "REFORMAT AS EDIT C##"
9240 LOCATE 18,12:PRINT "EDIT C            "
9250 LOCATE 18,18,1:INPUT "",NEWCMD$
9260 COMMAND$="EDIT C"+NEWCMD$
9270 PART=VAL(MID$(COMMAND$,7))
9280 GOSUB 12140
9290 GOSUB 13000
9300 LOCATE 15,11:PRINT "CHANGE VALUES AS REQUIRED";SPC(40)
9310 FOR I=1 TO 8
9320    LOCATE I+1,17,1:INPUT "",N.CX$[I]
9330       IF N.CX$[I]="L" AND I=1 THEN I=8:GOTO
9340       IF N.CX$[I]="L" THEN I=I-1:GOTO 9320
9350       IF N.CX$[I]<>"" THEN CX[I]=VAL(N.CX$[I])
9360    LOCATE I+1,30,1:INPUT "",N.CY$[I]
9370       IF N.CY$[I]="L" THEN 9320
9380       IF N.CY$[I]<>"" THEN CY[I]=VAL(N.CY$[I])
9390    LOCATE I+1,40,1:INPUT "",N.PP$[I]
9400       IF N.PP$[I]="L" THEN 9360
9410       IF INSTR(N.PP$[I],"U")<>0 THEN PP$[I]="1"
```

```
9420      IF INSTR(N.PP$[I],"D")<>0 THEN PP$[I]="0"
9430         '
9440 NEXT I
9450 GOSUB 13000
9460 LOCATE 15,11:INPUT "...DO YOU WISH TO FILE THESE (Y/N) ";AN$
9470 IF AN$="Y" THEN GOSUB 12020:GOTO 9490
9480      GOSUB 12140:GOSUB 13000
9490 RETURN
9500 '
9600 '    ERASE PROGRAM
9610 IF LEN(COMMAND$)>7 THEN 9690
9620 LOCATE 15,11:PRINT SPC(65)
9630 LOCATE 15,11:PRINT "REFORMAT AS ERASE C##"
9640 LOCATE 18,12:PRINT "ERASE C            "
9650 LOCATE 18,19,1:INPUT "",NEWCMD$
9660 COMMAND$="ERASE C"+NEWCMD$
9670 PART=VAL(MID$(COMMAND$,8))
9680 GOSUB 12020:GOSUB 13000
9690 LOCATE 15,11,1:INPUT "...ARE YOU SURE (Y/N) ";AN$
9700 IF AN$<>"Y" THEN RETURN
9710 GOSUB 12250:GOSUB 13000:GOSUB 12020
9720 RETURN
9730 '
10000 '    COMMUNICATIONS ROUTINE
10010 '
10020 TX$="": A$="":'SW2=0
10030 FOR T=1 TO 16000
10040 IF NOT EOF(1) THEN T=16010
10050 NEXT T
10060 IF T>16005 THEN 10100
10070 LOCATE 15,12: PRINT "*** Transmission Error ***";
10080 STOP:LOCATE 15,12: PRINT SPACE$(27);:GOTO 10000
10090 '
10100 A$=INPUT$(1,#1)
10110 A=ASC(A$):B$=A$
10120 IF A=8 THEN 10180
10130 IF A=17 OR A=19 THEN B$=""
10140 IF A=10 OR A=12 THEN B$=""
10150 TX$=TX$+B$
10160 IF EOF(1) THEN 10220 ELSE 10100
10170 '
10180 IF LEN(TX$)=0 THEN 10160
10190 TX$=LEFT$(TX$,LEN(TX$)-1)
10200 GOTO 10160
10210 '
10220 FOR T=1 TO 1000
10230 IF NOT EOF(1) THEN T=1010
10240 NEXT T
10250 IF T>1005 THEN 10100
10260 IF LEN(TX$)<>0 THEN RETURN
10270 LOCATE 15,11: PRINT "CHECK MANUAL MODE          ";
10280 GOTO 10020
10290 '
11000 '    LOCATION EXTRACTION
11010 '
11015 'BEEP:STOP
11020 CT$ = "X.IST.Y.IST.":PRINT #1,CT$;CRLF$;
11030 LINE INPUT #1,R$:D$=INPUT$(1,#1)
11040 IF R$<>CT$ THEN BEEP:LOCATE 21,10:PRINT R$;:STOP
11045 LINE INPUT #1,XTX$:D$=INPUT$(1,#1)
```

```
11050 LINE INPUT #1,YTX$:D$=INPUT$(1,#1):GOTO 11100
11060 N=INSTR(TX$,CHR$(13))
11070 IF RIGHT$(TX$,1)=CHR$(13) THEN TX$=LEFT$(TX$,LEN(TX$)-1)
11080 XTX$=LEFT$(TX$,N-1)
11090 YTX$=RIGHT$(TX$,LEN(TX$)-N)
11100 LOCATE 22,10:PRINT XTX$;"     ";YTX$;
11110 '
11120 FOR N=1 TO 2
11130 IF N=1 THEN TEXT$=XTX$
11140 IF N=2 THEN TEXT$=YTX$
11150 '
11160 X$="/":Y$=","
11170 A=INSTR(TEXT$,X$)
11180 B=A-1
11190 B$=RIGHT$(TEXT$,1)
11200 C$=LEFT$(TEXT$,B)
11210 LC=INSTR(C$,Y$)
11220 LC$=LEFT$(C$,LC-1)
11230 RC$=RIGHT$(C$,LEN(C$)-LC)
11240 SIGN$=LEFT$(C$,1)
11250 IF SIGN$<>"-" THEN SIGN$="":GOTO 11270
11260 LOCATE 21,10:PRINT "*Sign Error*";
11270 INC$=MID$(TEXT$,A+1,3)
11280 IF RIGHT$(INC$,1)="," THEN INC$=LEFT$(INC$,2)
11285 IF INC$<>"32" THEN STOP
11290 STEPS = VAL(INC$)*VAL(LC$)+VAL(RC$)
11300 IF SIGN$="-" THEN STEPS=0-STEPS
11310 IF B$="X" THEN XSTEPS=STEPS:GOTO 11340
11320 IF B$="Y" THEN YSTEPS=STEPS:GOTO 11340
11330 LOCATE 21,10:PRINT "*AXIS ERROR*":STOP
11340 NEXT N
11350 LOCATE 12,18:PRINT "     ";:LOCATE 12,31:PRINT "    ";
11360 LOCATE 12,18:PRINT XSTEPS;:LOCATE 12,31:PRINT YSTEPS;
11370 RETURN
11380 '
12000 '   F I L I N G   R O U T I N E
12010 '
12020 '   Filing a File
12030 'OPEN FILE IF NECESSARY
12040 LSET PT$="#"+RIGHT$(STR$(PART),LEN(STR$(PART))-1)
12050 FOR I=1 TO 8
12060 LSET X$[I]=STR$(CX[I])
12070 LSET Y$[I]=STR$(CY[I])
12075 LSET P$[I]=PP$[I]
12080 NEXT I
12090 LSET CR$=CHR$(13)+CHR$(10)
12100 PUT #4,PART
12110 RETURN
12120 '
12130 '   Retrieving a File
12140 'OPEN THE FILE IF NECESSARY
12150 GET #4,PART
12160 IF LEFT$(PT$,1)<>"#" THEN 12250
12170 LOCATE 20,15:PRINT SPACE$(50);
12180 FOR I=1 TO 8
12190 CX[I]=VAL(X$[I])
12200 CY[I]=VAL(Y$[I])
12205 PP$[I]=LEFT$(P$[I],1)
12210 NEXT I
12220 'GOSUB 13000    'Display Routine
```

```
12230 RETURN
12240 '
12250 LOCATE 20,15,0:PRINT "NON-EXISTANT PART NUMBER        ";
12260 FOR I=1 TO 8
12270 CX[I]=-1:CY[I]=-1:PP$[I]="0"
12280 NEXT I
12290 'GOSUB 13000
12300 RETURN
12310 '
13000 '    Display Routine
13010 '
13020 IF PART<>PARTLST THEN 13100 ELSE 13120
13030 FOR I=1 TO 8
13040 LOCATE I+1,17:IF CX[I]<>-1 THEN PRINT CX[I] ELSE PRINT "     "
13050 LOCATE I+1,30:IF CY[I]<>-1 THEN PRINT CY[I] ELSE PRINT "     "
13055 LOCATE I+1,40:IF PP$=1 THEN PRINT "UP   " ELSE PRINT "     "
13060 NEXT I
13080 RETURN
13090 '
13100 PARTLST=PART
13110 CPART$="      ":RSET CPART$="C"+RIGHT$(STR$(PART),LEN(STR$(PART))-1)
13120 FOR I=1 TO 8
13130 LOCATE I+1,5:PRINT CPART$+"."
13140 LOCATE I+1,17:PRINT "       ";
13150 LOCATE I+1,30:PRINT "       ";
13155 LOCATE I+1,40:PRINT "      ";
13160 LOCATE I+1,17:IF CX[I]<>-1 THEN PRINT CX[I];
13170 LOCATE I+1,30:IF CY[I]<>-1 THEN PRINT CY[I]; ELSE 13180
13175 LOCATE I+1,40:IF PP$[I]="1" THEN PRINT "UP   " ELSE PRINT "   DN"
13180 NEXT I
13190 RETURN
13200 '
20000 'DEF SEG=&HB000:BLOAD "A:TEST.DAT",0
20010 'DEF SEG=&HB000:BSAVE "A:TEST.DAT",0,16384
20020 'NEXT T
20030 'D$=INPUT$(1)
20040 END
25000 IF NOT EOF(1) THEN PRINT INPUT$(LOC(1),#1) ELSE PRINT " - "
25010 STOP 100 '    SUPERVISORY CONTROL PROGRAM
110 '
120 '4/30/85
130 'WSP
140 '--------------------------------------------------------------------
200 '    INITIALIZE PROGRAM
210 '
220 OPEN "COM1:9600,N,8,1" AS #1
230 OPEN "SEQUENCE.GNL" AS #2 LEN=8
240 OPEN "PARTFILE.SKO" AS #3 LEN=200
250 OPEN "PARTFILE.CLN" AS #4 LEN=128
260     'OPEN "HOMEFILE." FOR INPUT AS #5
270     'OPEN "PARAFILE.DAT" FOR INPUT AS #6
280 '
300 FIELD #2,4 AS N$
310 '
320 FIELD #3,50 AS ST1$,50 AS ST2$,50 AS ST3$,40 AS SV$
325 '
330 FIELD #4,5 AS PT$,6 AS X$[1],6 AS Y$[1],2 AS P$[1]
331 FIELD #4,19 AS NL1$,6 AS X$[2],6 AS Y$[2],2 AS P$[2]
```

```
332 FIELD #4,33 AS NL2$,6 AS X$[3],6 AS Y$[3],2 AS P$[3]
333 FIELD #4,47 AS NL3$,6 AS X$[4],6 AS Y$[4],2 AS P$[4]
334 FIELD #4,61 AS NL4$,6 AS X$[5],6 AS Y$[5],2 AS P$[5]
335 FIELD #4,75 AS NL5$,6 AS X$[6],6 AS Y$[6],2 AS P$[6]
336 FIELD #4,89 AS NL6$,6 AS X$[7],6 AS Y$[7],2 AS P$[7]
337 FIELD #4,103 AS NL7$,6 AS X$[8],6 AS Y$[8],2 AS P$[8],2 AS CR$
340 '
400 AFLAG=0:SFLAG=0:CFLAG=0:RFLAG=0
410 EFLAG=0:OFLAG=0:PFLAG=0:KFLAG=0
420 FAULT=0:ERRMES$="":CRLF$=CHR$(13)+CHR$(10)
430 N[1]=0:N[2]=0:N[3]=0:N[4]=0:N[5]=0
440 XLIMIT=19000:YLIMIT=11000    '19210,11187
450 DIM ACOM$[20]
460 MM=2:NN=5
470 OVER.TIME = 300         '5 MIN TIMEOUT
480 '
500 'Baytech Initialization
505 T$=CHR$(20):R$=CHR$(18)
510 PRINT #1,R$+"5";
515 PRINT #1,R$+"1261";       '9600,N,8,1
520 PRINT #1,R$+"2261";
525 PRINT #1,R$+"3261";
530 PRINT #1,R$+"4261";
535 PRINT #1,T$+"1";:FOR T=1 TO 25:NEXT T
540 PRINT #1,T$+"2";:FOR T=1 TO 25:NEXT T
545 PRINT #1,T$+"3";:FOR T=1 TO 25:NEXT T
550 PRINT #1,T$+"4";:FOR T=1 TO 25:NEXT T
555 IF EOF(1) THEN 600 ELSE GRBG$=INPUT$(LOC(1),#1):PRINT GRBG$:GOTO 535
560 '
600 KEY 15,CHR$(&H40)+CHR$(&H1)          'ESC KEY
610 KEY 16,CHR$(&H0)+CHR$(&H1)           'ESC KEY
620 ON KEY(15) GOSUB 17000:KEY(15) ON
630 ON KEY(16) GOSUB 17000:KEY(16) ON
640 '
700 INPUT "SKIP INITIALIZATION (A,S,C) ";ANS$
705 INPUT "SPEED FACTOR: ",SPD.FCTR
710 IF ANS$="ASC" THEN 3000
720 IF ANS$="A" OR ANS$="AC" THEN 770
730 IF ANS$="AS" THEN 790
740 GOSUB 1400                           'Initialize Adept ***** CHG TO 1000 ***
750 IF ANS$="S" THEN GOTO 770
760 IF ANS$="SC" THEN GOTO 900
770 GOSUB 1500                           'Initialize Seiko
780 IF ANS$="C" OR ANS$="AC" THEN GOTO 900
790 GOSUB 2000                           'Initialize Clinch
795 '
800 'INPUT "SELECT BOARD # (1,2,3,4,5) ",BDNUM
810 '   IF BDNUM<1 OR BDNUM>5 THEN 800
820 '   IF BDNUM=1 THEN OPEN "SEQUENCE.B1" AS #2 LEN=8
830 '   IF BDNUM=2 THEN OPEN "SEQUENCE.B2" AS #2 LEN=8
840 '   IF BDNUM=3 THEN OPEN "SEQUENCE.B3" AS #2 LEN=8
850 '   IF BDNUM=4 THEN OPEN "SEQUENCE.B4" AS #2 LEN=8
860 '   IF BDNUM=5 THEN OPEN "SEQUENCE.B5" AS #2 LEN=8
870 'FIELD #2,4 AS N$
875 BDNUM=3
880 PRINT "BOARD NUMBER = ";BDNUM
895 '
900 GOTO 3000   'Sequential Operation
930 '
940 '
990 '--------------------------------------------------------------------------
```

```
1000 '       ADEPT INITIALIZATION
1005 '
1010 PRINT #1,T$+"1";:PRINT #1,CHR$(13);
1015 PRINT "Checking Adept for communications..."'STOP
1020 FOR T=1 TO 1000:IF NOT EOF(1) THEN T=1010
1025 NEXT T
1030 IF T>1005 THEN D$=INPUT$(LOC(1),#1):GOTO 1190 ELSE 1040
1035 '
1040 PRINT "       ADEPT STARTUP"
1045 PRINT " . VAL II disk in drive A (left)"
1050 PRINT " . Applications disk in drive B"
1055 PRINT " . Emergency Stop buttons up"
1060 PRINT " . Key switch toward TERMINAL"
1065 PRINT " .    Turn on SYSTEM POWER"
1070 PRINT CHR$(13)+" ... Hit any key when this is done"
1075 D$=INPUT$(1)
1080 'PRINT #1,T$+"1"   **************DELETE**********
1085 FOR T=1 TO 15000
1090 IF NOT EOF(1) THEN 1115
1095 NEXT T
1100 PRINT "* NO COMMUNICATIONS ESTABLISHED *"
1105 PRINT "...HIT ANY KEY TO RESTART...":D$=INPUT$(1)
1110 GOTO 1040
1115 PRINT CHR$(13)+"... ADEPT is loading now"
1120 D$=INPUT$(LOC(1),#1)
1125 ON TIMER(240) GOSUB 1480:TIMER ON
1130 ATX$=""
1135 WHILE EOF(1):WEND
1140 ATX$=ATX$+INPUT$(LOC(1),#1)
1145 IF INSTR(ATX$,CHR$(10)+".") THEN TIMER OFF:GOTO 1185
1150 IF INSTR(ATX$,"?") THEN 1160
1155 ATX$=RIGHT$(ATX$,10):GOTO 1135
1160 PRINT "* CHECK THAT DISKS ARE IN PLACE *"
1165 PRINT "   HIT ANY KEY WHEN READY..."
1170 D$=INPUT$(1)
1175 PRINT #1,"A"+CHR$(13)
1180 TIMER OFF:GOTO 1125
1185 'STOP
1190 ACOM$[1]="PCEX SET_GRD"
1195 ACOM$[2]="EN P"
1200 ACOM$[3]="DO DELAY .1"
1205 ACOM$[4]="LOAD ROBCTRL.V2"
1210 ACOM$[5]="LOAD ROBPOINT.LC"
1215 ACOM$[6]="ENABLE POWER"
1220 ACOM$[7]="DO DELAY .1"
1225 ACOM$[8]="CALIBRATE"
1230 ACOM$[9]="EX MOVESAFE"
1235 ACOM$[10]="EX POINTCHK"
1240 'ACOM$[11]="PCEX PC_CNTRL"
1245 '
1250 FOR I=1 TO 10
1255 ATX$="":AEFLAG=0
1260 PRINT #1,ACOM$[I]
1265 PRINT ACOM$[I]
1270 FOR T=1 TO 15000
1275 IF EOF(1) THEN 1295
1280 ATX$=ATX$+INPUT$(LOC(1),#1)
1285 IF RIGHT$(ATX$,2)=CHR$(10)+"." THEN T=15010
1290 IF INSTR(ATX$,"?")<>0 THEN T=15010
1295 NEXT T
```

```
1300 IF T<15005 THEN FAULT=101:GOTO 1490
1305 IF INSTR(ATX$,"*")=0 THEN 1345
1310 IF INSTR(ATX$,"COMP mode disabled")=0 THEN 1330
1315 PRINT "COMPuter mode disabled..."
1320 PRINT "Check MANual mode or Joint out of Range, then hit any key"
1325 D$=INPUT$(1):GOTO 1255
1330 IF I=7 THEN 1390
1335 IF AEFLAG=1 THEN FAULT=100:GOTO 1490
1340 PRINT ATX$:D$=INPUT$(1):AEFLAG=1:GOTO 1255
1345 IF INSTR(ATX$,"sure")=0 THEN 1380
1350 IF I=8 THEN 1360                          '?ASK TO CLEAR B4 CAL, ALWAYS
1355 IF I=2 THEN PRINT #1,"Y":ATX$="":GOTO 1270 ' & ALWAYS RESPOND W/"Y"
1360 PRINT "IS THE ROBOT CLEAR TO HOME ???"
1365 PRINT "...TYPE "+CHR$(34)+"HOME"+CHR$(34)+" WHEN READY ":INPUT "",D$
1370 IF D$="HOME" THEN PRINT #1,"Y":ATX$="":GOTO 1270
1375 PRINT #1,"N":D$=INPUT$(1):I=5:GOTO 1255
1380 IF INSTR(ATX$,"?")=0 THEN 1385 ELSE 1340
1385 IF I=7 THEN I=8
1390 NEXT I
1395 '   APP_PROG PROGRAM START-UP
1400 PRINT #1,T$;"1";
1401 PRINT #1,"SPE ";SPD.FCTR
1402 LINE INPUT #1,DUMMY$
1403 PRINT #1,"EX APP_PROG"
1405 ATX$=""
1410 FOR T=1 TO 5000
1415 IF NOT EOF(1) THEN ATX$=ATX$+INPUT$(LOC(1),#1)
1420 IF RIGHT$(ATX$,1)="!" THEN T=5010
1425 NEXT T
1430 IF T>5005 THEN 1445
1435 FAULT=100:PRINT "NO START-UP ON ADEPT R.C. PROGRAM"
1440 END
1445 PRINT #1,"PRO"
1450 LINE INPUT #1,D$:D$=INPUT$(1,#1)
1455 AT$=INPUT$(1,#1)
1460 IF AT$<>":" THEN 1435
1465 PRINT "** A D E P T    I N I T I A L I Z E D **"
1470 PRINT #1,T$+"4";:  FOR T=1 TO NN:NEXT T
1472 IF NOT EOF(1) THEN PRINT "ADEPT INT: ";INPUT$(LOC(1),#1)
1475 RETURN
1480 PRINT "* DISK LOADING TIMEOUT *":STOP
1485 'STOP
1490 PRINT "FAULT",FAULT:STOP
1495 '-------------------------------------------------------------------
1500 '   SEIKO INITIALIZATION
1510 '
1511 PRINT #1,T$+"2";
1512 PRINT #1,CRLF$;
1513 FOR T=1 TO 500:NEXT T
1514 IF EOF(1) THEN 1520
1515 DUMMY$=INPUT$(LOC(1),#1)
1516 PRINT #1,"START 100"+CRLF$;
1517 GOTO 1700
1520 CLS
1530 LOCATE 10,20:PRINT "1> TURN ON SEIKO POWER BREAKER"
1540 LOCATE 11,20:PRINT "2> TURN ON SERVO DRIVE POWER"
1550 LOCATE 12,20:PRINT "3> PUSH F1 AND <ENTER> ON THE SEIKO TEACH TERMINAL"
1560 LOCATE 13,20:PRINT "4> PUSH F2 AND <ENTER> ON THE SEIKO TEACH TERMINAL"
1570 LOCATE 15,20:PRINT "...SCREEN WILL INICATE WHEN INITIALIZATION IS COMPLETE"
1575 '
```

```
1700 ON TIMER(120) GOSUB 1930:TIMER ON
1710 ON ERROR GOTO 1940
1730 WHILE EOF(1):WEND
1740 LINE INPUT #1,STX$:IF STX$="" THEN 1740 ELSE S$=INPUT$(1,#1)
1745 ON ERROR GOTO 0:TIMER OFF:IF NOT EOF(1) THEN BEEP
1750 IF INSTR(STX$,"M>")=0 THEN 1880
1760    PRINT #1,"START 490"+CRLF$;      '490 WILL BE 500*************
1770    TIMER ON
1780    WHILE EOF(1):WEND
1785 'IF NOT EOF(1) THEN PRINT 1785:BEEP:STOP
1790    LINE INPUT #1,STX$:IF STX$="" THEN 1790 ELSE S$=INPUT$(1,#1)
1800    IF INSTR(STX$,"READY")=0 THEN 1850
1810       LINE INPUT #1,STX$:IF STX$="" THEN 1810 ELSE S$=INPUT$(1,#1)
1815       TIMER OFF
1820       IF INSTR(STX$,"M>")=0 THEN 1860
1825 PRINT #1,"SPADJ ";SPD.FCTR;CRLF$;
1826 LINE INPUT #1,DUMMY$:D$=INPUT$(1,#1):IF INSTR(DUMMY$,"M>")=0 THEN STOP
1830          PRINT "* S E I K O   I N I T I A L I Z E D *"
1835          PRINT #1,T$+"4";: FOR T=1 TO NN:NEXT T
1836          IF NOT EOF(1) THEN PRINT "SEIKO INT: ";INPUT$(LOC(1),#1)
1840          RETURN
1850       TIMER OFF
1860          IF INSTR(STX$,"ERROR")=0 THEN FAULT=20:GOTO 18000
1870          FAULT=21:ERRMES$="SEIKO "+STX$:GOTO 18000
1880    IF INSTR(STX$,"ERROR")=0 THEN 1900
1890       FAULT=21:ERRMES$="SEIKO "+STX$:GOTO 18000
1900       IF INSTR(STX$,">")=0 THEN 1920
1910          FAULT=22:GOTO 18000     'mode error
1920          FAULT=23:GOTO 18000     'com error
1930 FAULT=24:GOSUB 18000:STOP
1940 IF ERR<>57 THEN ON ERROR GOTO 0:RESUME
1950 CLOSE #1:FOR T=1 TO 1000:NEXT T:OPEN "COM1:9600,N,8,1" AS #1
1960 RESUME 1730
1980 '-----------------------------------------------------------------------
2000 '     CLINCH INITIALIZATION
2005 PRINT " CLINCH HOMING..."
2010 PRINT #1,T$+"3";:FOR T=1 TO 100:NEXT T
2015 IF NOT EOF(1) THEN D$=INPUT$(LOC(1),#1)
2020 '
2025 OPEN "HOMEFILE.1" FOR INPUT AS #5
2030 WHILE NOT EOF(5)
2035    LINE INPUT #5,HOMELINE$
2040    PRINT #1,HOMELINE$+CRLF$;
2045    LINE INPUT #1,DUMMY$:D$=INPUT$(1,#1)
2050 ' PRINT DUMMY$
2055 WEND
2060 CLOSE #5
2062 '
2065 OPEN "HOMEFILE.2" FOR INPUT AS #5
2067 PRINT #1,"X.B30.Y.B30."+CRLF$;:LINE INPUT #1,DUMMY$:D$=INPUT$(1,#1)
2068 PRINT DUMMY$
2070 FOR I= 1 TO 9
2075    LINE INPUT #5,HOMELINE$
2080    PRINT #1,HOMELINE$+CRLF$;
2085    LINE INPUT #1,DUMMY$:D$=INPUT$(1,#1)
2090    PRINT DUMMY$
2095    IF I=3 OR I=7 THEN 2100 ELSE 2110
2100       LINE INPUT #1,YSTAT$:D$=INPUT$(1,#1)
2105       IF INSTR(YSTAT$,"0")=1 THEN 2110 ELSE 2080
2110 NEXT I
```

```
2120 CLOSE #5
2140 LINE INPUT #1,C1$:LINE INPUT #1,C2$
2150 IF RIGHT$(C1$,15)<>"+00,00/32,(NA,X" THEN 2200
2160 IF RIGHT$(C2$,15)<>"+00,00/32,(NA,Y" THEN 2200
2165 IF CIFLAG=1 THEN RETURN
2170 PRINT " CLINCH HOMED"+CHR$(13)+" LOADING PARAMETERS... "
2180 GOTO 2300
2190 '
2200 PRINT "** CLINCH HOMING ERROR **"
2210 PRINT C1$,C2$:PRINT "HIT ANY KEY TO TRY AGAIN..."
2220 D$=INPUT$(1)
2230 GOTO 2025
2240 '----------------------------------
2300 'Retrieve parameters file
2310 '
2315 OPEN "PARAFILE.DAT" FOR INPUT AS #6
2320 IF EOF(6) THEN 2540
2330 ON ERROR GOTO 2520
2340 INPUT #6,DUMY1$,SPD$,DUMY2$,CTM$,DUMY3$,CYL$,DUMY4$,FDBK$
2350 INPUT #6,DUMY1$,XBSPD$
2360 FOR I=1 TO 5
2370    INPUT #6,DUMY1$,XAC$[I],DUMY2$,XHS$[I]
2380 NEXT I
2390 FOR I=1 TO 5
2400    INPUT #6,DUMY1$,XDC$[I],DUMY2$,XLS$[I]
2410 NEXT I
2420 INPUT #6,DUMY1$,YBSPD$
2430 FOR I=1 TO 5
2440    INPUT #6,DUMY1$,YAC$[I],DUMY2$,YHS$[I]
2450 NEXT I
2460 FOR I=1 TO 5
2470    INPUT #6,DUMY1$,YDC$[I],DUMY2$,YLS$[I]
2480 NEXT I
2490 INPUT #6,DUMY1$,XLIMIT,DUMY2$,YLIMIT
2500 CLOSE #6:ON ERROR GOTO 0:GOTO 2540
2510 '
2520 PRINT ERR,ERN:IF ERR=62 THEN 2540
2530 ON ERROR GOTO 0:STOP
2540 '
2550 'Transmit to stepper
2560     'IF SPD$="FAST" THEN PRINT #1,"X.K.Y.K."+CRLF$;:GOTO 2570
2565 PRINT #1,"X.L.Y.L."+CRLF$;
2570 LINE INPUT #1,DUMMY$:D$=INPUT$(1,#1):PRINT DUMMY$;ASC(D$)
2575 PRINT #1,"X.S"+CTM$+".Y.S"+CTM$+".";
2580 PRINT #1,"X.B"+XBSPD$+".Y.B"+YBSPD$+".";CRLF$;
2585 LINE INPUT #1,DUMMY$:D$=INPUT$(1,#1):PRINT DUMMY$;ASC(D$)
2590 PRINT #1,"IAA"+XAC$[1]+".IVA"+XHS$[1]+".IAB"+XAC$[2]+".IVB"+XHS$[2]+".";
2600 PRINT #1,"IAC"+XAC$[3]+".IVC"+XHS$[3]+".IAD"+XAC$[4]+".IVD"+XHS$[4]+".";
2610 PRINT #1,"IAE"+XAC$[5]+".IVE"+XHS$[5]+".”+CRLF$;
2615 LINE INPUT #1,DUMMY$:D$=INPUT$(1,#1)
2620 PRINT #1,"IDA"+YDC$[1]+".IVF"+XLS$[1]+".IDB"+XDC$[2]+".IVG"+XLS$[2]+".";
2630 PRINT #1,"IDC"+XDC$[3]+".IVH"+XLS$[3]+".IDD"+XDC$[4]+".IVI"+XLS$[4]+".";
2640 PRINT #1,"IDE"+XDC$[5]+".IVJ"+XLS$[5]+".";
2650 PRINT #1,"X.IRL."+CRLF$;
2655 LINE INPUT #1,DUMMY$:D$=INPUT$(1,#1)
2660 PRINT #1,"IAA"+YAC$[1]+".IVA"+YHS$[1]+".IAB"+YAC$[2]+".IVB"+YHS$[2]+".";
2670 PRINT #1,"IAC"+YAC$[3]+".IVC"+YHS$[3]+".IAD"+YAC$[4]+".IVD"+YHS$[4]+".";
2680 PRINT #1,"IAE"+YAC$[5]+".IVE"+YHS$[5]+".”+CRLF$;
2685 LINE INPUT #1,DUMMY$:D$=INPUT$(1,#1)
2690 PRINT #1,"IDA"+YDC$[1]+".IVF"+YLS$[1]+".IDB"+YDC$[2]+".IVG"+YLS$[2]+".";
```

```
2700 PRINT #1,"IDC"+YDC$[3]+".IVH"+YLS$[3]+".IDD"+YDC$[4]+".IVI"+YLS$[4]+".";
2710 PRINT #1,"IDE"+YDC$[5]+".IVJ"+YLS$[5]+".";
2720 PRINT #1,"Y.IRL.DT."+CRLF$;
2730 WHILE NOT EOF(1)
2735 IF NOT EOF(1) THEN DUMMY$=INPUT$(LOC(1),#1)
2736 FOR T=1 TO 500:NEXT T
2738 WEND
2740 CXHSPD=1000    '((SPD.FCTR+5)*VAL(XHS$[5])/100)-200
2742 CYHSPD=600     '((SPD.FCTR+5)*VAL(YHS$[5])/100)-200
2745 PRINT #1,"X.H";CXHSPD;".Y.H";CYHSPD;".";CRLF$;
2750 LINE INPUT #1,DUMMY$:D$=INPUT$(1,#1)
2755 PRINT " PARAMETERS LOADED"+CHR$(13)
2760 PRINT "** C L I N C H   I N I T I A L I Z E D **"
2765 RETURN
2770 '
2775 '----------------------------------------------------------------
3000 '    SEQUENTIAL OPERATION
3010 '
3020 AFLAG=2:SFLAG=0:CFLAG=0:OFLAG=2:POINTR=3
3030 SIFLAG=2:CIFLAG=2
3032 ATIMER=TIMER:STIMER=TIMER:CTIMER=TIMER
3035 BFLAG=2
3045 GOTO 4000
3050 '
3060 '----------------------------------------------------------------
4000 'SEQUENCE LOOP
4010 '
4020 IF AFLAG<>0 THEN GOSUB 10000:IF AFLAG=0 THEN GOSUB 5000
4030 IF AFLAG=4 THEN AFLAG=0
4040 IF SFLAG<>0 THEN GOSUB 12000
4050 IF CFLAG<>0 THEN GOSUB 14000
4055       'IF SINGLE AND AFLAG=2 AND SFLAG=2 AND CFLAG=2 THEN RETURN
4060       '
4100 '
4110 IF ATX1$<>"" THEN GOSUB 6010:GOTO 4190
4120 PRINT #1,T$+"1";:  FOR T=1 TO MM:NEXT T
4130 PRINT #1,T$+"4";:  FOR T=1 TO NN:NEXT T
4140 IF NOT EOF(1) THEN 4150 ELSE 4160
4150    GOSUB 6030: GOTO 4190
4160 IF TIMER-ATIMER > OVER.TIME THEN 4170 ELSE 4190
4170    FAULT=110:ERRMES$="ADEPT TIMEOUT"
4180    GOTO 18000
4190 'CONTINUE
4200 '
4210 IF STX1$<>"" THEN GOSUB 6210:GOTO 4290
4220 PRINT #1,T$+"2";:  FOR T=1 TO MM:NEXT T
4230 PRINT #1,T$+"4";:  FOR T=1 TO NN:NEXT T
4240 IF NOT EOF(1) THEN 4250 ELSE 4260
4250    GOSUB 6230: GOTO 4290
4260 IF TIMER-STIMER > OVER.TIME THEN 4270 ELSE 4290
4270    FAULT=120:ERRMES$="SEIKO TIMEOUT"
4280    GOTO 18000
4290 'CONTINUE
4300 '
4310 IF CTX1$<>"" THEN GOSUB 6410:GOTO 4390
4320 PRINT #1,T$+"3";:  FOR T=1 TO MM:NEXT T
4330 PRINT #1,T$+"4";:  FOR T=1 TO NN:NEXT T
4340 IF NOT EOF(1) THEN 4350 ELSE 4360
4350    GOSUB 6430: GOTO 4390
4360 IF TIMER-CTIMER > OVER.TIME THEN 4370 ELSE 4390
```

```
4370    FAULT=130:ERRMES$="CLINCH TIMEOUT"
4380     GOTO 18000
4390 'CONTINUE
4400 '
4500     'KEY(9) ON
4510     'KEY(10) ON
4520     'KEY(1) ON
4530        '
4540 IF FAULT<>0 THEN GOSUB 18000
4550 IF QFLAG=1 THEN END      '*************TEMPORARY
4560 GOTO 4020
4570 '
4580 '--------------------------------------------------------------------------
5000 '     INDEXING ROUTINE
5010 '
5020 N[5]=N[4]:N[4]=N[3]:N[3]=N[2]:N[2]=N[1]
5030 IF RFLAG<>0 THEN 5040 ELSE 5055
5040 N[2]=RFLAG
5050 RFLAG=0:GOTO 5110
5055 IF N[1]=-1 THEN 5100
5060 INDEX=INDEX+1
5070 GET #2,INDEX
5075 IF INDEX=1 THEN S.CUE=VAL(N$)
5080 IF N$="SKIP" THEN 5060
5090 IF N$="END " THEN N[1]=-1 ELSE N[1]=VAL(N$)
5100 IF N[2]=-1 THEN BFLAG=1
5102 IF N[3]=-1 THEN BFLAG=2
5105 IF SIFLAG=2 AND N[3]=S.CUE THEN 5108 ELSE 5110
5108    SIFLAG=0:CIFLAG=0:SFLAG=2:CFLAG=2:STIMER=TIMER:CTIMER=TIMER:POINTR=3
5109       'PRINT "5109: SIFLAG:";SIFLAG,"SFLAG: ";SFLAG
5110 PRINT "N[1]:";N[1];" N[2]:";N[2];" N[3]:";N[3];" N[4]:";N[4];" N[5]:";N[5]
5115       'PRINT "5115: SIFLAG: ";SIFLAG,"SFLAG: ";SFLAG
5120 RETURN
5130 '
5140 '--------------------------------------------------------------------------
5200 '     SINGLE PART ROUTINE
5210 SINGLE=1
5220 INPUT "PART NO. - ";INDEX
5230 GET #2,INDEX
5240 IF INDEX=>ENDNUM THEN 5250 ELSE 5270
5250 PRINT "ENTRY IS TOO HIGH, REENTER...";
5260 GOTO 5220
5270 GET #2,INDEX
5280 IF N$="SKIP" THEN 5290 ELSE 5310
5290 PRINT "PART IS SKIPPED, REENTER...";
5300 GOTO 5220
5310 FOR I=1 TO 5
5320     N[I]=VAL(N$)
5330 NEXT I
5340 OFLAG=5
5350 AFLAG=2:SFLAG=2:CFLAG=2:BFLAG=0
5360 GOSUB 4000
5370 PRINT "PART NO. - ";INDEX;" DONE"
5380 PRINT "...PROCEED WITH NEXT PART (Y/N)?"
5390 AN$=INPUT$(1)
5400 IF AN$="Y" THEN 5310
5410 PRINT "   ...PROCEED WITH ANOTHER SINGLE PART (Y/N)?"
5420 AN$=INPUT$(1)
5430 IF AN$="Y" THEN 5220 ELSE 800    'RETURN TO INITIAL SELECTION MENU
5440 '
```

```
5450 '------------------------------------------------------------------
6000 '   Adept Buffer Check Routine
6010 ATX$=ATX$+ATX1$
6020     ATX1$=""
6030 PRINT #1,T$+"1";:  FOR T=1 TO MM:NEXT T
6040     WHILE NOT EOF(1)
6050         ATX$=ATX$+INPUT$(LOC(1),#1)
6060     WEND
6070 PRINT #1,T$+"4";:  FOR T=1 TO NN:NEXT T
6080 IF NOT EOF(1) THEN 6030
6090 IF INSTR(ATX$,"*")<>0 THEN 6100 ELSE 6120
6100     FAULT=110: ERRMES$=ATX$
6110     RETURN
6120 IF INSTR(ATX$,CHR$(10)+":")<>0 THEN 6130 ELSE 6150
6130     AFLAG=1
6140     PRINT "ATX$: ";ATX$
6150 ATIMER=TIMER
6160 RETURN
6170 '
6180 '------------------------------------------------------------------
6200 '   Seilo Buffer Check Routine
6210 STX$=STX$+STX1$
6220     STX1$=""
6230 PRINT #1,T$+"2";:  FOR T=1 TO MM:NEXT T
6240     WHILE NOT EOF(1)
6250         STX$=STX$+INPUT$(LOC(1),#1)
6260     WEND
6270 PRINT #1,T$+"4";:  FOR T=1 TO NN:NEXT T
6280 IF NOT EOF(1) THEN 6230
6290 IF INSTR(STX$,"*")<>0 THEN 6300 ELSE 6320
6300     FAULT=120: ERRMES$=STX$
6310     RETURN
6320 IF INSTR(STX$,"M>")<>0 THEN 6330 ELSE 6350
6330     SFLAG=1
6340     PRINT "STX$: ";STX$
6350 STIMER=TIMER
6360 RETURN
6370 '
6380 '------------------------------------------------------------------
6400 '   Clinch Buffer Check Routine
6410 CTX$=CTX$+CTX1$
6420     CTX1$=""
6430 PRINT #1,T$+"3";:  FOR T=1 TO MM:NEXT T
6440     WHILE NOT EOF(1)
6450         CTX$=CTX$+INPUT$(LOC(1),#1)
6460     WEND
6470 PRINT #1,T$+"4";:  FOR T=1 TO NN:NEXT T
6480 IF NOT EOF(1) THEN 6430
6490 IF INSTR(CTX$,"*")<>0 THEN 6500 ELSE 6520   '*****NEED AN ERROR SCHEME **
6500     FAULT=130: ERRMES$=CTX$
6510     RETURN
6520 IF INSTR(CTX$,"KNTS")<>0 THEN 6530 ELSE 6550
6530     CFLAG=1
6540     PRINT "CTX$: ";CTX$
6550 CTIMER=TIMER
6560 RETURN
6570 '
6580 '------------------------------------------------------------------
10000 '    ADEPT ROUTINE
10010 '
```

```
10015 PRINT #1,T$+"1";
10020 ON AFLAG GOTO 10030,10300
10030 '
10040 IF INSTR(ATX$,"*")<>0 THEN FAULT=111:ERRMES$=ATX$:RETURN
10050 IF INSTR(ATX$,STR$(AN.NXT))<>0 THEN 10100
10060 IF INSTR(ATX$,STR$(AN))=0 THEN FAULT=121:ERRMES$="ADPT PT # ERROR":RETURN
10070 '
10100 ADIR=VAL(MID$(ATX$,INSTR(ATX$,"=")+1,1))    ':PRINT "ADIR:";ADIR
10105 ON ADIR GOTO 10300,10115,10150,10165,10180,10170,10175,10195,10200
10110 '       ADIR =   1     2     3     4     5     6     7     8     9
10115 APOS=INSTR(ATX$,"@"):SPOS=INSTR(ATX$,"/")
10120 IF APOS=0 OR SPOS=0 THEN FAULT=131:RETURN
10125 ADISP$=MID$(ATX$,APOS+1,SPOS-APOS-1)
10130 ATUBE$=MID$(ATX$,SPOS+1)
10135 PRINT "EMPTY TUBE @":PRINT SPC(8);"PART #";STR$(AN.NXT)
10140 PRINT SPC(8);"DISPENSER #";ADISP$:PRINT SPC(8);"TUBE #";ATUBE$
10145 GOTO 10300
10150 FAULT=130:ERRMES$="PART #"+STR$(AN.NXT)+" NEEDS RESTOCKING"
10155 '***SET MISSED PART FLAG AND COME BACK FOR THIS PART
10160 GOTO 10300
10165 FAULT =135:ERRMES$="ADEPT EQUIPMENT ERROR":RETURN
10170 FAULT =136:ERRMES$="ADEPT ILLEGAL PART NUMBER":RETURN
10175 FAULT =137:ERRMES$="UNLOAD ERROR":RETURN
10180 INPUT "SEIKO NOT CLEAR, RETRY(R) OR QUIT(Q) ?",AN$
10185 IF AN$="R" THEN 10190 ELSE 10714
10190 AFLAG=4:ATX$="":PRINT #1,"-5":RETURN      'NO INDEX ROUTINE
10195 FAULT =138:ERRMES$="BOARD LOAD ERROR":RETURN
10200 FAULT =139:ERRMES$="TIMEOUT ON NEW BOARD STAGING":RETURN
10205 '
10300 'IF OFLAG<>1 THEN AFLAG=2:RETURN
10305 'IF AFLAG1=1 THEN AFLAG1=0:ATX$="":GOTO 10315
10310 ATX$="":AN.NXT=N[2]
10400 IF PFLAG=1 THEN POINTR=POINTR+1
10405     'PRINT "ADPT.POINTR: ";POINTR
10410 IFLAG=1:PFLAG=1
10420 'IF POINTR<2 OR POINTR>4 THEN 10250 ELSE 10260
10430 'FAULT=125:ERRMES$="SEIKO OR ADEPT JUMPED ORDER":RETURN
10435 IF BFLAG=1 THEN 10500
10436 IF BFLAG=2 THEN 10700
10440 '
10460 PRINT #1,AN.NXT
10465 LINE INPUT #1,DUMMY$
10468 PRINT "ADEPT TIME:";TIMER-A.CYC.TIMER:A.CYC.TIMER=TIMER
10470 GOTO 10900
10480 '
10500 '   BOARD UNLOAD
10510 'PRINT #1,T$+"1";
10520 AN.NXT=-1:PRINT #1,AN.NXT
10525 LINE INPUT #1,DUMMY$:PRINT "ADPT UNLOAD: ";DUMMY$
10530 BFLAG=2
10540 GOTO 10900
10550 '
10700 '   BOARD LOAD
10705 'PRINT #1,T$+"1";
10710 'IF KEYFLAG=??? THEN STOP
10711 BEEP:INPUT "LOAD A BOARD (Y/N/Q)? ",DUM$
10712 IF DUM$="Y" THEN 10720
10713 IF DUM$="N" THEN 10717
10714 AN.NXT=-4:PRINT #1,AN.NXT:LINE INPUT #1,DUMMY$
10715 QFLAG=1
```

```
10716 GOTO 10740
10717 AN.NXT=-3:PRINT #1,AN.NXT:LINE INPUT #1,DUMMY$
10718 GOTO 10730
10720 AN.NXT=-2:PRINT #1,AN.NXT:LINE INPUT #1,DUMMY$
10730 N[1]=0:INDEX=0:GOSUB 5000
10740 BFLAG=0
10750 GOTO 10900
10780 '
10900 AFLAG=0
10910 'OFLAG=2
10920 PRINT #1,T$+"4";:  FOR T=1 TO NN:NEXT T
10925 IF NOT EOF(1) THEN ATX1$=INPUT$(LOC(1),#1)
10930 RETURN
10940 '
10950 '----------------------------------------------------------------------
12000 '  SEIKO ROUTINE
12010 '
12015 PRINT #1,T$+"2";
12018 PRINT "SFLAG: ";SFLAG
12020 ON SFLAG GOTO 12030,12300
12030 IF INSTR(STX$,STR$(SN))=0 THEN FAULT=50:ERRMES$="SEIKO PT # ERROR":RETURN
12040 SDIR=VAL(MID$(STX$,INSTR(STX$,"=")+1,1))
12050 ON SDIR GOTO 12300,12100,12110,12120,12130,12180,12190,12200,12210
12060 '        SDIR =  1    2    3    4    5    6    7    8    9
12070 '
12100 FAULT=30:ERRMES$="PART #"+STR$(SN)+" NOT FOUND":RETURN
12110 FAULT=31:ERRMES$="BAD BOARD, TO MANY REJECTS ":RETURN
12120 RFLAG=SN:FAULT=32:ERRMES$="REJECT":RETURN
12130 PRINT #1,"DO T3=";ST3$;CRLF$;     'BEC POINT
12140 LINE INPUT #1,STX$:S$=INPUT$(1,#1)
12150 IF INSTR(STX$,"M>")=0 THEN FAULT=33:RETURN
12160 PRINT #1,"START 1000"+CRLF$;
12170 RETURN
12180 FAULT=33:ERRMES$="ADEPT NOT CLEAR ":RETURN
12190 FAULT=34:ERRMES$="CLINCH INCOMPLETE":RETURN
12200 FAULT=35:ERRMES$="CURRENT PART NOT CLAMPED":RETURN
12210 FAULT=36:ERRMES$="NO READING FROM SEIKO CLINCH HEIGHT SENSOR":RETURN
12220 '
12300 IF OFLAG<>2 THEN SFLAG=2:RETURN
12305 IF SIFLAG=1 THEN SIFLAG=2:SFLAG=0:RETURN
12310 IF PFLAG=0 THEN POINTR=POINTR-1
12315    'PRINT "SKO.POINTR: ";POINTR
12320 SN=N[POINTR]    ':PRINT "SN: ";SN
12330 PFLAG=0:STX$=""
12340 '
12345 IF SN=-1 THEN 12410
12350 GET 3,SN
12352 '********BEEP:PRINT "S.MID.TIME= ";TIMER-STIMER
12360 'SN$=MID$(ST1$,27,4)
12355 'IF NOT EOF(1) THEN SDUM$=INPUT$(LOC(1),#1):PRINT "SDUM$:";SDUM$
12370 PRINT #1,"DO ";LEFT$(SV$,(INSTR(SV$," ")));";N=";SN;CRLF$;
12380 LINE INPUT #1,D1$:D2$=INPUT$(LOC(1),#1)    ':PRINT SN;D1$
12385 PRINT #1,"DO T1=";ST1$;CRLF$;
12390 LINE INPUT #1,D1$:D2$=INPUT$(LOC(1),#1)
12395 PRINT #1,"DO T2=";ST2$;CRLF$;
12400 LINE INPUT #1,D1$:D2$=INPUT$(LOC(1),#1)
12405 GOTO 12430
12410 PRINT #1,"DO N=";SN;CRLF$;
12415 LINE INPUT #1,D1$:D2$=INPUT$(LOC(1),#1)
12420 SIFLAG=1:PRINT "SIFLAG=1"
```

```
12430 PRINT #1,"START 540"+CRLF$;    '550 WILL BE 1000 **************
12435 PRINT "SEIKO TIME:";TIMER-S.CYC.TIMER:S.CYC.TIMER=TIMER
12440 '
12450 SFLAG=0
12460 OFLAG=3
12465 PRINT #1,T$+"4";:  FOR T=1 TO NN:NEXT T
12470 IF NOT EOF(1) THEN STX1$=INPUT$(LOC(1),#1)
12475 RETURN
12480 '
12490 '----------------------------------------------------------------------
14000 '   CLINCH ROUTINE
14010 '
14020 ON CFLAG GOTO 14030,14300
14030 FBCNT$=LEFT$(CTX$,4)
14035 PRINT "KNTS>";VAL(FBCNT$):GOTO 14300   '*************DEBUG ONLY
14040 IF VAL(FBCNT$)=0 THEN 14300
14050 'FLAG BOARD AND PART NUMBER
14070 PRINT "IMPROPER FEEDBACK ON CLINCH OF PART #";CN
14080 GOTO 14300
14090 '
14300 CTX$=""
14305 IF OFLAG<>3 THEN CFLAG=2:RETURN
14306 IF CIFLAG=1 THEN CIFLAG=2:CFLAG=0:RETURN
14310 CN=SN       '********CN=SN  ***************
14311 PRINT #1,T$+"3";
14312 PRINT "CN: ";CN
14315 IF CN=-1 THEN 14700
14320 GET #4,CN
14321 FOR I=1 TO 8              '**COULD PRINT THE STRING VARIABLE
14322    CX[I]=VAL(X$[I])       '**INSTEAD OF THE REAL CONVERTED VARIABLE
14323    CY[I]=VAL(Y$[I])
14324    PP[I]=VAL(LEFT$(P$[I],1))
14325 NEXT I
14326 '
14330 '
14350 CNUM = 0
14360            'LNUM = 0
14370 FOR I=1 TO 8
14380 IF PP[I]=1 THEN CNUM=CNUM+1
14390 NEXT I
14400 PRINT #1,"KZL0.X.P.BW6.K.Y.K.KKA";CNUM;".KYL0.";CRLF$;
14410 LINE INPUT #1,DUMMY$:D$=INPUT$(1,#1)
14420 KFLAG=0        ':LNUM=1
14430 '
14440 FOR I=1 TO 8
14445 '***IF I=1 THEN 14470
14450 IF CX[I]=-1 THEN 14630
14460 IF PP[I]=1 THEN 14540
14470 IF KFLAG<>1 THEN 14485
14480 PRINT #1,"KZL0.P.BW6.";
14485 PRINT #1,"Y.M";CY[I];".X.M";CX[I];".";
14490 IF I=2 THEN PRINT #1,"SY1.";
14495 PRINT #1,"G.Y.G.BW6.";CRLF$;
14500 LINE INPUT #1,DUMMY$:D$=INPUT$(1,#1)
14510 KFLAG=0           ':LNUM=LNUM+1
14520 GOTO 14630
14530 '
14540 IF KFLAG=1 THEN 14560
14550 PRINT #1,"KZL1.P.BW6.";
14560 PRINT #1,"Y.M";CY[I];".X.M";CX[I];".KYL1.";CRLF$;
```

```
14565 LINE INPUT #1,DUMMY$:D$=INPUT$(1,#1)
14570 IF I=2 THEN PRINT #1,"SY1.";
14575 PRINT #1,"X.G.Y.G.BW6.";CRLF$;
14577 LINE INPUT #1,DUMMY$:D$=INPUT$(1,#1)
14580      'PRINT #1,"DKB0.#";(LNUM+6);CRLF$;
14585      'LINE INPUT #1,DUMMY$:D$=INPUT$(1,#1)
14590 PRINT #1,"KZW4.DKA0.";CRLF$;
14595 LINE INPUT #1,DUMMY$:D$=INPUT$(1,#1)
14600      'PRINT #1,"DKA0.";CRLF$;
14605      'LINE INPUT #1,DUMMY$:D$=INPUT$(1,#1)
14610 PRINT #1,"KYL0.";CRLF$;
14615 LINE INPUT #1,DUMMY$:D$=INPUT$(1,#1)
14620 KFLAG=1          ':LNUM=LNUM+6
14630 NEXT I
14640 '
14650 IF KFLAG<>0 THEN PRINT #1,"KZL0.P.BW6.";
14655 PRINT #1,"KKT.";CRLF$;
14657 LINE INPUT #1,DUMMY$:D$=INPUT$(1,#1)
14660 GOTO 14800
14665 '
14700 PRINT #1,"KZL0.X.P.BW6.M125.G.Y.M125.G.BW6.";CRLF$;
14710 LINE INPUT #1,DUMMY$:D$=INPUT$(1,#1)     ':PRINT DUMMY$
14720 CIFLAG=1:GOSUB 2065  ' "HOME"
14722 PRINT #1,"X.B";XBSPD$;".L.Y.B";YBSPD$;".L."+CRLF$;    '****** ADD K. ***
14725 LINE INPUT #1,DUMMY$:D$=INPUT$(1,#1)     ':PRINT DUMMY$
14730 PRINT #1,"KKT."+CRLF$::LINE INPUT #1,DUMMY$:D$=INPUT$(1,#1)
14740 GOTO 14800
14750 '
14800 CFLAG=0:OFLAG=2    '***SET UP FOR ORDER FLAG ON SEIKO AND CLINCH ONLY
14810 PRINT #1,T$+"4";:   FOR T=1 TO NN:NEXT T
14815 IF NOT EOF(1) THEN CTX1$=INPUT$(LOC(1),#1)
14820 RETURN
14830 '
14840 '-------------------------------------------------------------------
16999 OPEN "COM1:9600,N,8,1" AS #1
17000 PRINT #1,CHR$(20)+"1";
17010 PRINT #1,"PCA":PRINT #1,"A":PRINT #1,"RESET"
17020 PRINT #1,CHR$(20)+"2";
17030 PRINT #1,CHR$(27);
17040 PRINT #1,CHR$(20)+"3";
17050 PRINT #1,CHR$(3)+"@.";CRLF$;
17060 PRINT "*** S T O P ***":STOP
18000 PRINT "FAULT: ";FAULT
18010 PRINT "MESSAGE: ";ERRMES$
18020 GOTO 17000:RETURN
20000 SHELL "BASICA TERMINAL.2 /C:2048":END
21000 'SHELL "BASICA C:SEIKOHST /C:2048"
22000 'FOR I=1 TO LEN(A1$):PRINT ASC(MID$(A1$,I,1));:NEXT I

100 '-------------------------------------------------------------------
110 '    POINT TEACHING PROGRAM
120 '    1676 - 5/11/85
130 '    CHAD INDUSTRIES
140 '    WSP
150 '-------------------------------------------------------------------
160 '
170 CLS:KEY OFF:COLOR 5
180 OPEN "COM1:9600,N,8,1" AS #1
190 OPEN "PARTFILE.SKO" AS #3 LEN=200
200 OPEN "PARTFILE.CLN" AS #4
```

```
210 '
220 FIELD #3,50 AS FT1$,50 AS FT2$,50 AS FT3$,40 AS FV$
230 '
240 FIELD #4,5 AS PT$,6 AS X$[1],6 AS Y$[1],2 AS P$[1]
250 FIELD #4,19 AS NL1$,6 AS X$[2],6 AS Y$[2],2 AS P$[2]
260 FIELD #4,33 AS NL2$,6 AS X$[3],6 AS Y$[3],2 AS P$[3]
270 FIELD #4,47 AS NL3$,6 AS X$[4],6 AS Y$[4],2 AS P$[4]
280 FIELD #4,61 AS NL4$,6 AS X$[5],6 AS Y$[5],2 AS P$[5]
290 FIELD #4,75 AS NL5$,6 AS X$[6],6 AS Y$[6],2 AS P$[6]
300 FIELD #4,89 AS NL6$,6 AS X$[7],6 AS Y$[7],2 AS P$[7]
310 FIELD #4,103 AS NL7$,6 AS X$[8],6 AS Y$[8],2 AS P$[8],2 AS CR$
320 '
330 XLIMIT=10600:YLIMIT=13500      '11187,19210
350 MNTR.SEG=&HB000:PARTLST=0
360 '
400 T$=CHR$(20):CRLF$=CHR$(13)+CHR$(10)
410 PRINT #1,T$+"1";:FOR T= 1 TO 100:NEXT T
415 IF NOT EOF(1) THEN D$=INPUT$(LOC(1),#1):PRINT D$
420 PRINT #1,T$+"2";:FOR T= 1 TO 100:NEXT T
425 IF NOT EOF(1) THEN D$=INPUT$(LOC(1),#1):PRINT D$
430 PRINT #1,T$+"3";:FOR T= 1 TO 100:NEXT T
435 IF NOT EOF(1) THEN D$=INPUT$(LOC(1),#1):PRINT D$
440 PRINT #1,T$+"4";:FOR T= 1 TO 100:NEXT T
445 IF NOT EOF(1) THEN D$=INPUT$(LOC(1),#1):PRINT D$
500 'GOTO 2031
510 LOCATE 10,1:COLOR 5
520 PRINT "DO WISH TO TEACH POINTS ON THE:"
530 PRINT "            - ADEPT ?"
540 PRINT "            - SEIKO ?"
545 PRINT "            - CLINCH ?"
548 PRINT "            - TERMINAL ?"
550 PRINT "            - QUIT ?"
560 LOCATE ,13,1:INPUT "",AN$
570 IF LEFT$(AN$,1)="A" THEN 1000
580 IF LEFT$(AN$,1)="S" THEN 2000
585 IF LEFT$(AN$,1)="C" THEN 5000
588 IF LEFT$(AN$,1)="T" THEN 20000
590 IF LEFT$(AN$,1)="Q" THEN 10010
600 LOCATE CSRLIN-1,12:PRINT "            ";
610 GOTO 560
620 '
1000 'ADEPT TEACHING
1005 CLS:PRINT " *** TEACHING ADEPT USING PENDANT ***"
1010 PRINT #1,T$+"1";
1020 PRINT #1,"EX TEACH"
1025 LINE INPUT #1,DUMMY$:D$=INPUT$(1,#1)
1030 PRINT #1,""
1040 D$=INPUT$(3,#1):PRINT D$;
1050 IF INSTR(D$,"*")=0 THEN STOP:RTRN=1:GOSUB 10010 ELSE 1070
1060     GOTO 1010
1070 WHILE EOF(1) :IF INKEY$="A" THEN 1180 ELSE WEND
1080 FOR T=1 TO 100:NEXT T
1090 D$=INPUT$(LOC(1),#1)
1100 PRINT D$;
1110 IF INSTR(D$,CHR$(10)+".")<>0 THEN 1150
1120 FOR T=1 TO 500:NEXT T
1130 IF EOF(1) THEN 1070 ELSE 1090
1140 '
1150 PRINT "*** TEACHING ADEPT COMPLETED ***"
1160 FOR T=1 TO 1000:NEXT T:GOTO 510
```

```
1170 '
1180 PRINT #1,"A"
1190 D$=""
1200 WHILE EOF(1):WEND
1210 D$=D$+INPUT$(LOC(1),#1)
1220 IF INSTR(D$,CHR$(10)+".")=0 THEN 1200
1230 PRINT #1,"TOOL TTL0"
1240 LINE INPUT #1,DUMMY$:D$=INPUT$(2,#1)
1250 FOR T=1 TO 1000:NEXT T:CLS:GOTO 510
1260 '
2000 '   Seiko Point Teaching Routine
2010 '
2020 CLS:DEF SEG=&HB000:BLOAD "SKOTEACH.SCN",0
2022 LOCATE 14,5,0:COLOR 10:PRINT "*** STAY CLEAR OF THE TOOLING PINS ***"
2024 LOCATE ,5,1:COLOR 5
2026 INPUT "... AND HIT RETURN WHEN THERE IS A CARRIER IN POSITION ",D$
2030 PRINT #1,T$+"1";:FOR T=1 TO 10:NEXT T
2040 PRINT #1,"PCEX SKO_TCH"
2050 LINE INPUT #1,DUMMY$:D$=INPUT$(1,#1)
2060 LINE INPUT #1,ATX$:D$=INPUT$(1,#1)
2070 IF INSTR(ATX$,"PRO")<>0 THEN 2100
2075    IF ATX$="MOVE" THEN PRINT "MOVE ADEPT CLEAR":GOTO 2022
2080    RTRN=1:GOSUB 10010:GOTO 2030
2090 CLS:DEF SEG=&HB000:BLOAD "SKOTEACH.SCN",0
2100 LOCATE 25,8:COLOR 17
2110 PRINT "* * * W A R N I N G :  G U A R D Z O N E   D I S A B L E D * * *";
2120 LOCATE 10,1:COLOR 5
2122 LOCATE 14:PRINT SPC(75):PRINT SPC(75)
2123 PRINT #1,T$+"3";:FOR T=1 TO 10:NEXT T
2125 IF NOT EOF(1) THEN D$=INPUT$(LOC(1),1)
2130 PRINT #1,T$+"2";:FOR T=1 TO 10:NEXT T
2140 PRINT #1,"DO SPEED 40:MOVE T350:SPEED 300";CRLF$;
2150 LINE INPUT #1,DUMMY$:D$=INPUT$(1,#1)
2160 LOCATE 2,18,1,1,13:INPUT "",SN
2170 GET #3,SN
2180 IF VAL(FT1$)<>0 THEN 2240
2190    T1$= "   0.      0.      0.      0.    "
2200    T2$= "   0.      0.      0.      0.    "
2210    T3$= "   0.      0.      0.      0.    "
2220    V$ = "A=0:B=0:P=1:O=15:H=   0:G=    0"
2230 GOTO 2280
2240    T1$=FT1$:PRINT #1,"DO T1=";T1$;CRLF$;
2245       LINE INPUT #1,DUMMY$:D$=INPUT$(1,#1)
2250    T2$=FT2$:PRINT #1,"DO T2=";T2$;CRLF$;
2255       LINE INPUT #1,DUMMY$:D$=INPUT$(1,#1)
2260    T3$=FT3$:PRINT #1,"DO T3=";T3$;CRLF$;
2265       LINE INPUT #1,DUMMY$:D$=INPUT$(1,#1)
2270    V$ =FV$
2280 LOCATE 4,23,0:PRINT T1$;
2290 LOCATE 5,23,0:PRINT T2$;
2300 LOCATE 6,23,0:PRINT T3$;
2310 IF MID$(V$,11,1)="2" THEN LOCATE 8,32:PRES$="HIGH":PRINT PRES$;:GOTO 2330
2320 IF MID$(V$,11,1)="1" THEN LOCATE 8,32:PRES$="LOW ":PRINT PRES$;
2330 ORB=VAL(MID$(V$,15,2))
2340 LOCATE 9,32:PRINT ORB
2350 IF MID$(V$,27,1)="1" THEN LOCATE 10,32:SHR$="YES":PRINT SHR$;:GOTO 2370
2360 IF MID$(V$,27,1)="0" THEN LOCATE 10,32:SHR$="NO ":PRINT SHR$;
2370 '
2380 PRINT #1,"DO ";V$;":N=";SN;CRLF$;
2390 LINE INPUT #1,DUMMY$:D$=INPUT$(1,#1)
```

```
2400  '
2410  LOCATE 4,64,1:INPUT "TEACH Y/N";AN$
2420  IF AN$<>"Y" THEN 2712
2430     IF VAL(T1$)=0 THEN 2510
2440        SH$=MID$(T1$,20,4)
2450        'PRINT #1,"DO P=0:H=";SH$;":N=";SN;CRLF$;
2460        'LINE INPUT #1,D1$:D2$=INPUT$(1,#1)
2470        'PRINT #1,"DO T1=";T1$;CRLF$;
2480        'LINE INPUT #1,D1$:D2$=INPUT$(1,#1)
2490        PRINT #1,"START 10040";CRLF$;
2500     GOTO 2520
2510        PRINT #1,"START 10010";CRLF$;
2520     LINE INPUT #1,I.T1$:D$=INPUT$(1,#1)
2530     IF INSTR(I.T1$,"T1")=0 THEN PRINT I.T1$:STOP
2540     LINE INPUT #1,DUMMY$:D$=INPUT$(1,#1)
2550     IF INSTR( DUMMY$,"M>")=0 THEN STOP
2560     T1$=MID$(I.T1$,8)
2570     LOCATE 4,23,0:PRINT T1$;SPC(20)
2580     H$=MID$(T1$,20,4)
2590     MID$(V$,20,4)=H$
2600     PRINT #1,"DO H=";H$;CRLF$;
2610     LINE INPUT #1,DUMMY$:D$=INPUT$(1,#1)
2620     A.DEG=VAL(MID$(T1$,28))
2630        IF A.DEG>-6 AND A.DEG<84 THEN A$="1"
2640        IF A.DEG>-146 AND A.DEG<-94 THEN A$="2"
2650        IF A.DEG>84 AND A.DEG<146 THEN A$="3"
2660        IF A.DEG>-94 AND A.DEG<-6 THEN A$="4"
2670     MID$(V$,3,1)=A$
2680     PRINT #1,"DO A=";A$;CRLF$;
2690     LINE INPUT #1,DUMMY$:D$=INPUT$(1,#1)
2700     LOCATE 13,5:PRINT "NOTE: YOU MUST TEACH THE INSERTION POINT"
2710     GOTO 2730
2712     'PRINT #1,"DO T1=";T1$;CRLF$;
2713     'LINE INPUT #1,DUMMY$:D$=INPUT$(1,#1)
2715        '
2720        '
2730  LOCATE 5,64,1:INPUT "TEACH Y/N";ANS.T2$
2740  IF ANS.T2$<>"Y" THEN 2965
2750     LOCATE 14,5:PRINT "HIT RETURN WHEN THERE IS A PART IN THE STRAIGHTENER"
2760     INPUT "",D$
2770     IF VAL(T2$)=0 THEN 2820
2780        'PRINT #1,"DO T2=";T2$;CRLF$;
2790        'LINE INPUT #1,DUMMY$:D$=INPUT$(1,#1)
2800        PRINT #1,"START 10220";CRLF$;
2810     GOTO 2830
2820        PRINT #1,"START 10200";CRLF$;
2830     LINE INPUT #1,I.T2$:D$=INPUT$(1,#1)
2840     IF INSTR(I.T2$,"T2")=0 THEN PRINT I.T2$:STOP
2850     LINE INPUT #1,DUMMY$:D$=INPUT$(1,#1)
2860     IF INSTR(DUMMY$,"M>")=0 THEN 2850
2870     T2$=MID$(I.T2$,8)
2880     LOCATE 5,23:PRINT T2$;SPC(20)
2882     G$=MID$(T2$,20,4)
2884     MID$(V$,27,4)=G$
2886     PRINT #1,"DO G=";G$;CRLF$;
2888     LINE INPUT #1,DUMMY$:D$=INPUT$(1,#1)
2890     B.DEG=VAL(MID$(T2$,28))
2900        IF B.DEG>34 AND B.DEG<145 THEN B$="1"
2910        IF B.DEG>-145 AND B.DEG<-52 THEN B$="2"
2920        IF B.DEG>145 AND B.DEG<-145 THEN B$="3"    'NOT ACCESSABLE
```

```
2930        IF B.DEG>-52 AND B.DEG<34 THEN B$="4"
2940     MID$(V$,7,1)=B$
2950     PRINT #1,"DO B=";B$;CRLF$;
2960     LINE INPUT #1,DUMMY$:D$=INPUT$(1,#1)
2962 PRINT #1,"START 10800";CRLF$;
2964 LINE INPUT #1,STX$:D$=INPUT$(1,#1)
2965   'PRINT #1,"DO T2=";T2$;CRLF$;
2966 IF INSTR(STX$,"*ERROR")=0 THEN 2980
2968 LINE INPUT #1,DUMMY$:D$=INPUT$(1,#1):PRINT STX$:STOP
2970    '
2980 LOCATE 16,5,1:PRINT "DO YOU WISH TO TEACH THE CLINCH POINTS NOW (Y/N) ";
2985 INPUT AN$
2990 IF LEFT$(AN$,1)="Y" THEN 3000 ELSE 3140
3000 IF VAL(T2$)=0 OR VAL(T1$)=0 THEN 3060
3010 LOCATE 14,5,1:PRINT "HIT RETURN WHEN THERE IS A PART IN THE STAIGHTENER";
3015 INPUT " ",D$:IF D$<>"" THEN 3060
3020 PRINT #1,"START 10700";CRLF$;
3025 LINE INPUT #1,DUMMY$:D$=INPUT$(1,#1)
3030 IF INSTR(DUMMY$,"M>")=0 THEN PRINT DUMMY$:GOTO 10010
3060     RET.FLAG=3070
3065     CHAIN "CLINCH12.BAS",1000,ALL
3070     DEF SEG=&HB000:BLOAD "SKOTEACH.SCN",0
3075     PRINT #1,T$+"2";
3080     LOCATE 4,23:PRINT T1$;
3085     LOCATE 5,23:PRINT T2$;
3090     LOCATE 6,23:PRINT T3$;
3095     LOCATE 8,32:PRINT PRES$
3100     LOCATE 9,32:PRINT ORB
3105     LOCATE 10,32:PRINT SHR$;
3110 PRINT #1,T$+"2";
3112 IF VAL(T2$)=0 OR DUM$<>"" THEN 3140
3115 PRINT #1,"START 10800";CRLF$;
3120 LINE INPUT #1,STX$:D$=INPUT$(1,#1)
3125 IF INSTR(STX$,"*ERROR")=0 THEN 3140
3130 LINE INPUT #1,DUMMY$:D$=INPUT$(1,#1):PRINT STX$:STOP
3135 '
3140 LOCATE 6,64,1:INPUT "TEACH Y/N";AN$
3160 IF AN$="N" THEN 3290
3170     MID$(H.T3$,19,8)="   0.   "
3180     PRINT #1,"DO T3=";H.T3$;CRLF$;
3190     LINE INPUT #1,DUMMY$:D$=INPUT$(1,#1)
3200     PRINT #1,"START 10000";CRLF$;
3210     LINE INPUT #1,DUMMY$:D$=INPUT$(1,#1)
3220     IF INSTR(DUMMY$,"M>")=0 THEN STOP
3230     PRINT #1,"DO PRINT T3";CRLF$;
3240     LINE INPUT I.T3$:D$=INPUT$(1,#1)
3250     LINE INPUT #1,DUMMY$:D$=INPUT$(1,#1)
3260     T3$=MID$(I.T3$,8)
3270     LOCATE 6,23:PRINT T3$;SPC(13)
3280     '
3290 LOCATE 8,37,1:INPUT "CHANGE >",N.PRES$
3300 IF N.PRES$="" OR N.PRES$="N" THEN 3420
3305     IF N.PRES$<>"Y" THEN 3315
3310       LOCATE 9,37:PRINT SPC(12);:GOTO 3290
3315     IF INSTR(N.PRES$,"H")<>0 THEN 3320 ELSE 3360
3320       PRES$="HIGH"
3330       MID$(V$,11,1)="2"
3340       LOCATE 8,32:PRINT PRES$;SPC(15)
3350       GOTO 3420
3360     IF INSTR(N.PRES$,"L")<>0 THEN 3370 ELSE 3410
```

```
3370         PRES$="LOW "
3380         MID$(V$,11,1)="1"
3390         LOCATE 8,32:PRINT PRES$;SPC(15)
3400         GOTO 3420
3410         '
3420 LOCATE 9,37,1:INPUT "CHANGE >",N.ORB$
3425 IF N.ORB$="" OR N.ORB$="N" THEN 3500
3430     IF N.ORB$<>"Y" THEN 3440
3435         LOCATE 9,37:PRINT SPC(12);:GOTO 3420
3440     ORB=VAL(N.ORB$)
3445     ORB=VAL(N.ORB$)
3450     ORB$=RIGHT$(STR$(ORB),2)          'LEN(STR$(ORB))-1)
3460     MID$(V$,15,2)=ORB$
3470     LOCATE 9,32,0:PRINT ORB$;SPC(15)
3480     GOTO 3500
3490     '
3500 LOCATE 17,10,1:INPUT "DO YOU WISH TO TEST RUN THIS PART ";AN$
3510 IF LEFT$(AN$,1)<>"Y" THEN 3600
3520     LOCATE 18,10,1
3530     INPUT "HIT RETURN WHEN THERE IS A PART IN THE STRAIGHTENER ",D$
3540     FOR T= 1 TO 1000: NEXT T
3550     PRINT #1,"START 10600";CRLF$;
3560     LINE INPUT #1,STX$:D$=INPUT$(1,#1)
3570     IF INSTR(STX$,"M>")<>0 THEN 3590
3580     PRINT STX$: GOTO 3560
3590     LOCATE 17,10:PRINT SPC(60);:LOCATE 18,10:PRINT SPC(60);:GOTO 3500
3595 '
3600 LOCATE 19,10,1:PRINT "DO YOU WANT TO FILE THIS DATA (Y/N)";
3610 INPUT AN$
3620 IF AN$<>"Y" THEN 3700
3630 LSET FT1$=T1$
3640 LSET FT2$=T2$
3650 LSET FT3$=T3$
3660 LSET FV$=V$
3670 PUT #3,SN
3680 LOCATE 20,10:PRINT "...FILED"
3690 GOTO 3790
3700 LOCATE 20,10,1:INPUT "DO YOU WANT TO REDO THIS PART (Y) OR GO ON ";AN$
3710 IF AN$="Y" THEN 2170 ELSE 3790
3790 LOCATE 21,10:PRINT "DO YOU WISH TO TEACH ANOTHER PART (Y/N)";
3800 INPUT AN$
3810 IF AN$="Y" THEN PRINT "...damn":FOR T=1 TO 100:NEXT T:GOTO 2090
3820 IF AN$="N" THEN CLS:RTRN=1:GOSUB 10010:CLS:GOTO 510
3830 LOCATE 15,10:PRINT SPC(60):GOTO 3690
3840 '
3850 END
5000 '     CLINCH ROUTINE
5010 RET.FLAG=5030
5020 CHAIN "CLINCH12.BAS",1000,ALL
5030 CLS:GOTO 510
5040 '
10000 OPEN "COM1:9600,N,8,1" AS #1
10010 PRINT #1,CHR$(20)+"1";:FOR T=1 TO 20:NEXT T
10020 PRINT #1,"ABORT"
10025 PRINT #1,"PCABORT"
10030 LINE INPUT #1,DUMMY$       ':PRINT DUMMY$;
10040 WHILE NOT EOF(1)
10050 FOR T=1 TO 500:NEXT T
10060 IF NOT EOF(1) THEN D$=INPUT$(LOC(1),#1)
10070     'PRINT D$;
```

```
10080 WEND
10090 'END
10100 PRINT #1,"SIGNAL -30"
10110 LINE INPUT #1,DUMMY$:D$=INPUT$(1,#1)    ':PRINT DUMMY$
10115 IF RTRN=1 THEN RTRN=0:RETURN
10120 PRINT "END"
10130 STOP
20000 SHELL "BASICA TERMINAL.2 /C:2048":CLS:GOTO 510
```

- APPENDIX B

```
.r LISTP APP_PROG
  1  .PROGRAM app_prog()
  2  ;----------------------------------------------------------------
  3  ;       ADEPT ROBOT CONTROL PROGRAM
  4  ;       1676 - 4/5/85
  5  ;       CHAD INDUSTRIES
  6  ;       WSP
  7  ;
  8  ;----------------------------------------------------------------
  9  ;INITIALIZE
 10         RESET
 11         SIGNAL -2001, -2002, -2009, -2007, 23
 12  ;     SIGNAL 24
 13  ;     DELAY 1.1
 14  ;     BREAK
 15  ;     SIGNAL -24
 16         SPEED 100 ALWAYS
 17         ACCEL 100, 100
 18         COARSE ALWAYS
 19         ATTACH (1)
 20         count = 0
 21         st_lim = 175
 22         rad.maj = 650
 23         FOR i = 1 TO partqty
 24             IF $tube[i] == "" THEN
 25                 GOTO 20
 26             END
 27             $tubet[i] = $tube[i]
 28             curdisp[i] = VAL($DECODE($tubet[i],",",0))
 29             $dummy = $DECODE($tubet[i],",",1)
 30             curtube[i] = VAL($DECODE($tubet[i],";",0))
 31             IF $tubet[i] == "" THEN
 32                 GOTO 20
 33             END
 34             $dummy = $DECODE($tubet[i],";",1)
 35      20 END
 36         PCEXECUTE pc_cntrl (), 0, 0
 37  ;     REACT (-1007), rel_clmp
 38  ;----------------------------------------------------------------
 39      100 HERE current
 40         IF DISTANCE(current,loc1) < st_lim THEN
 41             GOTO 150
 42         ELSE
 43             WRITE (1) /B, /B, /B, "LOCATE ROBOT CLOSE TO STARTING POINT"
 44             READ (1) dummy
 45             GOTO 100
 46         END
```

```
47    150   MOVE loc1
48          HERE #now
49          DECOMPOSE q[1] = #now
50          IF q[2] > 0 THEN
51              GOTO 180
52          END
53          WRITE (1) /B, /B, /B, "CHANGE TO RIGHTY CONFIGURATION"
54          STOP
55          MOVE loc2
56          MOVE loc3
57          RIGHTY
58          MOVE loc1
59          BREAK
60    180   RESET
61          SIGNAL 2007
62          SIGNAL 2001        ;RC PROG INITIALIZED (TO PC PROG)
63    200   TIMER (3) = 0
64          WAIT (SIG(2002)) OR (SIG(2009)) OR (TIMER(3) > 180)
65          IF SIG(2002) GOTO 205
66          IF SIG(2009) GOTO 800
67          IF (TIMER(3) > 60) AND (SIG(2006)) THEN
68              GOTO 200
69          ELSE
70              PCABORT
71              TYPE "** NEXT PART TIMEOUT **"
72              PCABORT
73              STOP      ;THIS NEEDS WORK
74          END
75    205   TIMER (1) = 0
76          an = an.nxt
77          an.nxt = 0
78          SIGNAL -2002, 2010
79    210   ;MATH
80          tn = (12*curdisp[an])+curtube[an]
81          tube.num = tn
82          DECOMPOSE pt1[1] = pick[tn]
83          rad1 = SQRT(SQR(pt1[1])+SQR(pt1[2]))
84          IF 876-pt1[3] > rad1-rad.maj THEN
85              GOTO 220
86          ELSE
87              GOTO 230
88          END
89    220   pt2[1] = rad.maj/rad1*pt1[1]
90          pt2[2] = rad.maj/rad1*pt1[2]
91          pt2[3] = pt1[3]+(rad1-rad.maj)
92          SET apick2 = TRANS(pt2[1], pt2[2], pt2[3], pt1[4], pt1[5], pt1[6])
93          SET apick3 = apick2
94          GOTO 240
95    230   rad2 = rad1-(876-pt1[3])
96          pt2[1] = rad2/rad1*pt1[1]
97          pt2[2] = rad2/rad1*pt1[2]
98          pt3[1] = rad.maj/rad1*pt1[1]
99          pt3[2] = rad.maj/rad1*pt1[2]
100         SET apick2 = TRANS(pt2[1], pt2[2], 876, pt1[4], pt1[5], pt1[6])
101         SET apick3 = TRANS(pt3[1], pt3[2], 876, pt1[4], pt1[5], pt1[6])
102   240   SIGNAL 17              ;PIVOT
103         SPEED 100
104         ACCEL 80, 60
105         MOVE apick3
```

```
106 ;        BREAK
107          ;SIGNAL ACTUATOR
108 ;        IF curtube[an] MOD 2 == 0 THEN
109 ;           SIGNAL 19           ;LEFT ACTUATOR
110 ;        ELSE
111 ;           SIGNAL 18           ;RIGHT ACTUATOR
112 ;        END
113     250  ;CHECK SIG (PIVOT)
114          IF SIG(-1003) THEN
115              TIMER (2) = 0
116              WAIT (TIMER(2) > 2) OR (SIG(1003))
117              IF SIG(1003) GOTO 260
118              SIGNAL 2012
119              TYPE "* GRIP PIVOT DOWN LIMIT SWITCH BAD*"
120              STOP
121          END
122     260  SPEED 100
123          ACCEL 100, 100
124          MOVES apick2
125          BREAK
126 ;        SIGNAL ACTUATOR
127          IF curtube[an] MOD 2 == 0 THEN
128              SIGNAL 19        ;LEFT
129          ELSE
130              SIGNAL 18        ;RIGHT
131          END
132          SPEED 100
133          ACCEL 100, 20
134 ;        FINE
135          MOVES pick[tn]
136          BREAK
137 ;        DELAY 2
138          SIGNAL -23, 22       ;GRIP JAWS CLOSED
139          IF gp[tn] == 1 THEN
140              SIGNAL 21            ;GRIP HIGH PRESSURE
141          ELSE
142              SIGNAL 20            ;GRIP, LOW PRESSURE
143          END
144          DELAY grip.time
145          BREAK
146          SIGNAL -18, -19
147          DELAY 0.3
148          BREAK
149 ;        PAUSE
150          SPEED 100
151          ACCEL 100, 100
152          MOVES apick2
153          SPEED 100
154          ACCEL 100, 100
155          MOVES apick3
156     270  IF SIG(1001) THEN
157              GOTO 300
158          ELSE
159              WRITE (1) /B, /B, /B, "NO PART IN GRIP", /N
160              GOTO 300
161              lst.disp = curdisp[an]
162              lst.tube = curtube[an]
163              SIGNAL 2004      ;EMPTY TUBE
164              IF $tubet[an] == "" THEN
```

```
165                     $tubet[an] = $tube[an]
166                 END
167                 curdisp[an] = VAL($DECODE($tubet[an],",",0))
168                 $dummy = $DECODE($tubet[an],",",1)
169                 curtube[an] = VAL($DECODE($tubet[an],";",0))
170                 IF $tubet[an] == "" THEN
171                     GOTO 280
172                 END
173                 $dummy = $DECODE($tubet[an],";",1)
174         280     count = count+1
175                 SIGNAL -20, -18, -19
176                 IF count > 3 THEN
177                     SIGNAL -17
178                     MOVE loc1
179                     SIGNAL 2005
180                     GOTO 380        ;NEW PART
181                 END
182                 GOTO 210            ;NEXT TUBE
183             END
184     300 SIGNAL 2003       ;GOOD PART/FOUND
185         count = 0
186         SIGNAL -17, -18, -19;   RAISE PIVOT, AND BOTH ACTUATORS
187         SPEED 100
188         ACCEL 80, 60
189         FINE
190         MOVE loc1
191     310 ;CHECK PIVOT FEEDBACK
192         IF SIG(-1002) THEN
193             TIMER (2) = 0
194             WAIT (TIMER(2) > 2) OR (SIG(1002))
195             IF SIG(1002) GOTO 320
196             SIGNAL 2012
197             TYPE "* GRIP PIVOT UP LIMIT SWITCH BAD *"
198             PCABORT
199             STOP
200         END
201     320 DECOMPOSE pt4[1] = place[tn]
202         SET aplace1 = TRANS(pt4[1], pt4[2], 876, pt4[4], pt4[5], pt4[6])
203     330 IF (SIG(1005)) OR (SIG(29)) OR (SIG(-1006)) THEN
204             TIMER (2) = 0
205             WAIT ((SIG(-1005)) AND (SIG(1006)) AND (SIG(-29))) OR (TIMER(2) > 30)
206             IF (SIG(1006)) AND (SIG(-1005)) AND (SIG(-29)) GOTO 340
207             GOTO 500
208         END
209     340 SIGNAL -25, -2007    ;ADEPT NOT CLEAR TO SEIKO
210         SPEED 80
211         ACCEL 100, 60
212         ; FINE
213         MOVE aplace1
214         BREAK
215 ;       PAUSE
216         SPEED 100
217         ACCEL 60, 30
218         FINE
219     350 MOVES place[tn]
220 ;       PAUSE
221 ;       GOTO 358
222         BREAK
223         SPEED ((spd[tn]*100)/SPEED(1)) ALWAYS
```

```
224         ACCEL acl[tn], dcl[tn]
225         DECOMPOSE pl[1] = place[tn]
226         off.x = 0.0254*COS(15)
227         off.y = 0.0254*SIN(15)
228         SET oxp.1 = TRANS(pl[1]+sxp[tn]*off.x, pl[2]-sxp[tn]*off.y, pl[3], pl[4], pl[5], pl[6]-rxp[tn])
229    ;    SET oxp.1 = TRANS(pl[1]+sxp*off.x, (pl[2]-sxp*off.y), pl[3], pl[4], pl[5], pl[6]+rxp)
230         SET oxm.1 = TRANS(pl[1]-sxm[tn]*off.x, pl[2]+sxm[tn]*off.y, pl[3], pl[4], pl[5], pl[6]-rxm[tn])
231    ;    SET oxm.1 = TRANS((pl[1]-sxm*off.x), pl[2]+sxm*off.y, pl[3], pl[4], pl[5], pl[6]+rxm)
232         SET oxp.2 = TRANS(pl[1]+sxr[tn]*off.x, pl[2]-sxr[tn]*off.y, pl[3], pl[4], pl[5], pl[6]-rxr[tn])
233    ;    SET oxp.2 = TRANS(pl[1]+sxr*off.x, (pl[2]-sxr*off.y), pl[3], pl[4], pl[5], pl[6]+rxr)
234         SET oyp.1 = TRANS(pl[1]+syp[tn]*off.y, pl[2]+syp[tn]*off.x, pl[3], pl[4], pl[5], pl[6]-ryp[tn])
235    ;    SET oyp.1 = TRANS(pl[1]+syp*off.y, pl[2]+syp*off.x, pl[3], pl[4], pl[5], pl[6]+ryp)
236         SET oym.1 = TRANS(pl[1]-sym[tn]*off.y, pl[2]-sym[tn]*off.x, pl[3], pl[4], pl[5], pl[6]-rym[tn])
237    ;    SET oym.1 = TRANS((pl[1]-sym*off.y), (pl[2]-sym*off.x), pl[3], pl[4], pl[5], pl[6]+rym)
238         SET oyp.2 = TRANS(pl[1]+syr[tn]*off.y, pl[2]+syr[tn]*off.x, pl[3], pl[4], pl[5], pl[6]-ryr[tn])
239    ;    SET oyp.2 = TRANS(pl[1]+syr*off.y, pl[2]+syr*off.x, pl[3], pl[4], pl[5], pl[6]+ryr)
240         MOVES oxp.1
241         MOVES oxm.1
242         MOVES oxp.2
243         MOVES place[tn]
244         MOVES oyp.1
245         MOVES oym.1
246         MOVES oyp.2
247         SPEED 100 ALWAYS
248    ;    FINE
249  358    MOVES place[tn]
250         IF shr[tn] == 1 THEN
251             FINE
252             MOVES SHIFT(place[tn] BY , , sz1[tn])
253             BREAK
254             SIGNAL 29
255             DELAY 0.5
256             BREAK
257             SIGNAL -29
258             DELAY 0.5
259             BREAK
260         END
261         MOVE SHIFT(place[tn] BY , , sz2[tn])
262         BREAK
263  360    SIGNAL 27   ;PART IN PLACE
264         REACT (-1007), rel_clmp
265         SIGNAL -20, -21, -22, 23       ;OPEN GRIP
266         DELAY 0.25
267         SPEED 100
268         ACCEL 60, 40
269         MOVES aplace1
270         SPEED 100
271         ACCEL 80, 60
```

```
272 ;          FINE
273            MOVE loc1
274            BREAK
275            IF SIG(2008) THEN
276                 SIGNAL 25        ;ADEPT CLEAR OF SEIKO
277            ELSE
278                 SIGNAL 2007
279            END
280 ;          TYPE "TIME =", TIMER(1), /N
281            SIGNAL -2010
282     380    IF SIG(2009) THEN   ;CYCLE STOP
283                 GOTO 800
284            END
285 ;          SIGNAL -29;******************DELETE
286            GOTO 200
287 ;-----------------------------------------------------------------
288 ;          ERROR SITUATIONS
289     500    WRITE (1) /B, /B, /B, "*** TIMEOUT WAITING FOR SEIKO ***"
290            SIGNAL 2011
291            WAIT (SIG(-2011)) OR (SIG(2009))
292            IF SIG(-2011) GOTO 330
293            IF SIG(2006) GOTO 800
294 ;-----------------------------------------------------------------
295 ;CYCLE STOP
296     800    MOVE loc1
297            TYPE "DONE"
298            PAUSE
299            GOTO 100
300 ;-----------------------------------------------------------------
301 .END
```

```
.LISTP PC_CNTRL
  1 .PROGRAM pc_cntrl()
  2 ;-----------------------------------------------------------------
  3 ;          ADEPT PROCESS CONTROL PROGRAM
  4 ;          1676 - 4/10/85
  5 ;          WSP
  6 ;
  7 ;-----------------------------------------------------------------
  8 ;INITIALIZE
  9            SIGNAL -2002, -2003, -2004, -2005, -2006
 10            SIGNAL -2007, -2008, -2009, -2010, -2011, -2012
 11            SIGNAL -29, -30, -31, -32         ;RESET BLT I/O
 12            SIGNAL -28       ;PROTEUS NOT READY
 13 ;
 14 ;-----------------------------------------------------------------
 15     100    ;FIELD COMMUNICATIONS FOR RC PROGRAM
 16            TIMER (5) = 0
 17            DO
 18            UNTIL SIG(2001) == -1
 19            IF TIMER(5) > 60 THEN
 20                 STOP
 21                 GOTO 100
 22            END
 23            PROMPT "I", $gate
 24            IF $gate == "PRO" THEN
 25                 GOTO 200
```

```
26          ELSE
27              STOP
28          END
29  ;----------------------------------------------------------------
30      150 WAIT SIG(2003) OR SIG(2004) OR SIG(2005) OR SIG(2011) OR SIG(2012)

31          IF SIG(2003) THEN
32              TYPE "#", an, "=1"
33              SIGNAL -2003
34          END
35          IF SIG(2004) THEN
36              TYPE "#", an, "=2@", lst.disp, "/", lst.tube
37              SIGNAL -2004
38              GOTO 150
39          END
40          IF SIG(2005) THEN
41              TYPE "#", an, "=3", /N
42              SIGNAL -2005
43          END
44          IF SIG(2011) THEN
45              TYPE "#", an, "=5", /N
46              an.nxt.lst = an.nxt
47              SIGNAL -2002
48          END
49          IF SIG(2012) THEN
50              TYPE "#", an, "=4", /C1, ":", /N
51              SIGNAL -30, -28
52              STOP
53          END
54      200 PROMPT ":", an.nxt
55  ;       IF an.nxt > 4 THEN
56  ;       STOP
57  ;       END
58      210 IF an.nxt > 0 THEN
59              SIGNAL 2002
60              IF SIG(-2006) THEN
61                  GOTO 150
62              ELSE
63                  GOTO 420
64              END
65          END
66          CASE an.nxt OF
67            VALUE 0:
68              GOTO 200
69            VALUE -1:       ;BOARD UNLOAD
70              SIGNAL 2006
71              GOTO 500
72            VALUE -2:       ;BOARD LOAD
73              SIGNAL 2006
74              GOTO 400
75            VALUE -3:       ;BOARD LOAD BYPASS
76              SIGNAL -2006, 2008
77              GOTO 420
78            VALUE -4:       ;CYCLE STOP
79              IF SIG(-2006) GOTO 500
80              SIGNAL 2009, -2008
81              GOTO 600
82            VALUE -5:       ;RETRY
83              SIGNAL (-2011)
84              WAIT SIG(-2010)
```

```
 85             TYPE "#", an, "=1"
 86             an.nxt = an.nxt.lst
 87             SIGNAL 2002
 88             GOTO 210
 89         ANY
 90             TYPE "#", an.nxt, "=6"
 91             GOTO 200
 92         END
 93 ;------------------------------------------------------------------
 94     400 ;BOARD LOAD ROUTINE
 95         SIGNAL 28, -31
 96         TIMER (6) = 0
 97         WAIT SIG(1009) OR (TIMER(6) > 6)    ;****60***
 98         IF SIG(1009) THEN
 99             GOTO 410
100         ELSE
101             TYPE "#", an.nxt, "=9", /N
102             GOTO 200
103         END
104     410 SIGNAL 32, -28
105         TYPE "#", an.nxt, "=1"
106         GOTO 200
107     420 TIMER (6) = 0
108         WAIT SIG(-1012) OR (TIMER(6) > 4)
109         IF SIG(-1012) THEN
110             GOTO 450
111         ELSE
112     425     TYPE "# -2=8", /N
113             SIGNAL -32
114             PROMPT ":", ans.bd.ld
115             IF ans.bd.ld == -2 THEN
116                 SIGNAL 32
117                 GOTO 420
118             ELSE
119                 IF ans.bd.ld == -4 THEN
120                     GOTO 210
121                 ELSE
122                     GOTO 425
123                 END
124             END
125         END
126     450 SIGNAL 30
127         TIMER (5) = 0
128         WAIT ((SIG(-1015)) AND (SIG(-1016))) OR (TIMER(5) > 3)
129         IF TIMER(5) > 3 GOTO 470
130     460 SIGNAL -32, -2006, 2008
131         IF SIG(2007) THEN
132             SIGNAL 25, -2007
133         END
134         IF an.nxt <> -3 THEN
135             GOTO 150
136         ELSE
137             TYPE "# 3=1", /N
138             GOTO 200
139         END
140     470 SIGNAL -32, -30
141         TYPE "#", an.nxt, "=4"
142         TYPE "TOOL CLAMPS DOWN LIMIT SWITCH"
143         SIGNAL 2009
```

```
144         SIGNAL -30, -28
145         STOP
146 ;
147 ;------------------------------------------------------------
148   500   IF SIG(1012) AND SIG(-30) GOTO 520      ;IF NO CURRENT BOARD
149         WAIT SIG(-2010)
150         SIGNAL 26
151         WAIT SIG(-1008)
152         SIGNAL -30, 31   ;TOOL PINS UP & REV CONVEYOR
153         SIGNAL -2008     ;SIGNAL TO RC PROG TO HOLD SEIKO
154         TIMER (6) = 0
155         WAIT SIG(1010) OR (TIMER(6) > 4)   ;CLEAR TO UNLOAD BOARD
156         IF SIG(1010) THEN
157             GOTO 510
158         ELSE
159             TYPE "#", an.nxt, "=7", /N
160             GOTO 200
161         END
162   510   TIMER (5) = 0
163         WAIT ((SIG(-1013)) AND (SIG(-1014))) OR (TIMER(5) > 3)
164         IF TIMER(5) > 3 GOTO 530
165         SIGNAL 32
166         TIMER (5) = 0
167         WAIT TIMER(5) > 2
168         SIGNAL -32, -26
169         IF an.nxt == -4 THEN
170             SIGNAL 2009, -2008
171             GOTO 600
172         END
173   520   TYPE "#", an.nxt, "=1"
174         GOTO 200
175   530   TYPE "#", an.nxt, "=4"
176         SIGNAL (2009)
177         TYPE "TOOL CLAMPS UP LIMIT SWITCH"
178         STOP
179 ;
180 ;------------------------------------------------------------
181   600   ;PROGRAM END
182         SIGNAL -30, -32, -31, -28
183         TYPE "#", an.nxt, "=1", /C1, ":"
184 .END .LISTP PC    P TEACH
  1 .PROGRAM teach()
  2 ;------------------------------------------------------------
  3 ;      ADEPT POINT TEACHING PROGRAM
  4 ;      1575 - 5/2/85
  5 ;      CHAD INDUSTRIES
  6 ;      WSP
  7 ;------------------------------------------------------------
  8         SIGNAL 24
  9         DELAY 3.2
 10         BREAK
 11         SIGNAL -24
 12   10    ATTACH (1, 0)
 13         WRITE (1) " * WARNING GUARDZONE DISABLED *"
 14         DETACH (0)
```

```
15            key.1 = 1
16            key.2 = 0
17            key.4 = 0
18            key.5 = 0
19            key.9 = 0
20            key.10 = 0
21            key.11 = 0
22            taught = 0
23            KEYMODE 4, 5 = 1
24            KEYMODE 9, 11 = 1
25            KEYMODE 8 = 1, 0
26            TOOL tt10
27     20     WRITE (1) "TEACHING DISPENSER >", /S
28            READ (1) dspnsr
29            WRITE (1) /B, /C1, "                    TUBE >", /S
30            READ (1) tube
31            WRITE (1) /B, /C2
32            WRITE (1) "DISP>", dspnsr, "  TUBE>", tube
33            KEYMODE 2 = 1, 1
34            WRITE (1) /X18, "TEACH...PICK", /S
35     40     IF PENDANT(2) == 0 THEN
36                IF key.2 <> 1 THEN
37                    pick.ind = 12*dspnsr+tube
38                    TOOL tt10
39                    HERE pick[pick.ind]
40                    TOOL tt11
41                    TYPE "PICK[", pick.ind, "] TAUGHT", /B
42                    KEYMODE 2 = 0
43                    key.2 = 1
44                    WRITE (1) /C2, /X18, "TEACH..........PLACE", /S
45                    KEYMODE 1 = 1, 1
46                    key.1 = 0
47                END
48            END
49     50     IF PENDANT(1) == 0 THEN
50                IF key.1 <> 1 THEN
51                    place.ind = 12*dspnsr+tube
52                    HERE place[place.ind]
53                    TYPE "PLACE[", place.ind, "] TAUGHT", /B
54                    KEYMODE 1 = 0
55                    key.1 = 1
56                END
57            END
58     60     IF PENDANT(9) <> key.9 THEN
59                key.9 = PENDANT(9)
60                IF PENDANT(9) THEN
61                    SIGNAL 17
62                    TOOL tt11
63                ELSE
64                    SIGNAL -17
65                    TOOL tt10
66                END
67            END
68            IF PENDANT(10) <> key.10 THEN
69                key.10 = PENDANT(10)
70                IF PENDANT(10) THEN
71                    SIGNAL 18
72                ELSE
73                    SIGNAL -18
74                END
```

```
 75        END
 76        IF PENDANT(11) <> key.11 THEN
 77            key.11 = PENDANT(11)
 78            IF PENDANT(11) THEN
 79                SIGNAL 19
 80            ELSE
 81                SIGNAL -19
 82            END
 83        END
 84        IF PENDANT(5) <> key.5 THEN
 85            key.5 = PENDANT(5)
 86            IF PENDANT(5) THEN
 87                SIGNAL -23, 20, 22
 88            ELSE
 89                SIGNAL -20, -21, -22, 23
 90            END
 91        END
 92        IF PENDANT(4) <> key.4 THEN
 93            key.4 = PENDANT(4)
 94            IF PENDANT(4) THEN
 95                SIGNAL -23, 21, 22
 96            ELSE
 97                SIGNAL -20, -21, -22, 23
 98            END
 99        END
100        IF key.1 == 1 THEN
101            IF key.2 == 1 THEN
102                IF taught == 0 THEN
103                    WRITE (1) /C2, "PART TAUGHT", /B
104                    taught = 1
105                END
106            END
107        END
108  70   IF PENDANT(8) <> -1 THEN
109            GOTO 40
110        ELSE
111            GOTO 80
112        END
113  80   WRITE (1) $CHR(12), "TEACH ANOTHER PART :yes/no)?"
114        dir = PENDANT(0)
115        IF dir == 53 THEN
116            GOTO 10
117        ELSE
118            IF dir == 54 THEN
119                GOTO 100
120            ELSE
121                GOTO 80
122            END
123        END
124 100   BREAK
125        DETACH (1)
126        ATTACH (0)
127        TOOL tt10
128        TYPE "DONE"
129 .END
```

.LISTP MOVESAFE
```
   1  .PROGRAM movesafe()
   2          HERE present
   3          DECOMPOSE p[1] = present
   4          rad1 = SQRT(SQR(p[1])+SQR(p[2]))
   5          IF (rad1 < 600) OR (p[1] < -370) THEN
   6              GOTO 20
   7          ELSE
   8              GOTO 30
   9          END
  10      20  SET new1 = TRANS(p[1], p[2], 876, p[4], p[5], p[6])
  11          GOTO 40
  12      30  d1 = 876-p[3]
  13          rad2 = rad1-d1
  14          s[1] = p[1]*rad2/rad1
  15          s[2] = p[2]*rad2/rad1
  16          SET new1 = TRANS(s[1], s[2], 876, p[4], p[5], p[6])
  17          GOTO 40
  18      40  rad3 = 400
  19          s[1] = p[1]*rad3/rad1
  20          s[2] = p[2]*rad3/rad1
  21          SET new2 = TRANS(s[1], s[2], 876, p[4], p[5], p[6])
  22          SPEED 10
  23          MOVES new1
  24          MOVES new2
  25          BREAK
  26          SIGNAL -17, -20, -21, -22, 23, -18, -19
  27          HERE #now
  28          DECOMPOSE q[1] = #now
  29          IF q[2] > 0 THEN
  30              GOTO 50
  31          ELSE
  32              MOVE loc2
  33              MOVE loc3
  34              RIGHTY
  35              GOTO 50
  36          END
  37      50  MOVE loc1
  38  .END
```

.LISTP CLMP_ON
```
   1  .PROGRAM clmp_on()
   2          SIGNAL 29
   3          WAIT SIG(1008)
   4          REACT -1007, rel_clmp
   5          REACT -1008, clmp_on
   6          RETURN
   7  .END
```

.LISTP REL_CLMP
```
   1  .PROGRAM rel_clmp()
   2  ;------------------------------------------------------------
   3  ;       CLAMP RELEASE SUBROUTINE FOR APP_PROG
   4          SIGNAL -27
   5          RETURN
   6  ;------------------------------------------------------------
   7  .END
```

APPENDIX C

```
00100 '--------------------------------------------------------------------
00110 'J1676                                                         5/11/85
00120 'ECA 101, N.T.L., PROTEUS
00130 'CHAD INDUSTRIES, ORANGE, CA.
00140 'SAS
00150 '--------------------------------------------------------------------
00160 '
00170 'T0  = 395.675 0.  0.  0.    ***HOME LENGTH BEFORE 100 MM SHIFT
00180 T300 =  0. 0. 0. 0.        'APP. PT. TO T2 (T306 * -G)
00190 T305 =  0. 0. 0. 0.        '-> APP. PT. TO T1  (T306 * H)
00195 T306 =  0. 0. 1. 0.        '-> APP. PT. FACTOR
00200 T311 =  4. -1. 0. 0.       '-> A=1
00210 T312 = -4.  1. 0. 0.       '-> A=2
00220 T313 =  1.  4. 0. 0.       '-> A=3
00230 T314 = -1. -4. 0. 0.       '-> A=4
00240 T320 =  0.2 0. 0. 0.       '-> B=1
00250 T321 = -0.2 0. 0. 0.       '-> B=2
00260 T322 =  0.  0.2 0. 0.      '-> B=3
00270 T323 =  0. -0.2 0. 0.      '-> B=4
00280 T325 =  0. 0. 2.5 0.       '-> CENTER
00290 T330 =  0.4 0. 0. 0.       '-> ORBIT
00300 T331 =  0. 0.4 0. 0.       '-> ORBIT
00310 T332 = -0.4 0. 0. 0.       '-> ORBIT
00320 T333 =  0. -0.4 0. 0.      '-> ORBIT
00325 T350 =  500. 0. 0. 0.      '***> BEC POINT -- WILL NEED TO CHANGE
00328 T383 =  0. 0. 10. 0.       '-> APPROACH PLACE FOR TEACHING
00330 T384 =  0. 0. 2. 0.        '-> STARTING PT. FOR SEARCH MOVE
00340 T385 =  0. 0. -5. 0.       '-> DIST. OF SEARCH MOVE
00350 T386 =  0. 0. -4. 0.       '-> DIST. FOR MOVE TO CLINCH POSITION
00360 '
00370 KEY 1 "HOME"
00380 KEY 2 "START 100"
00390 KEY 3 "START 7000 ' OPEN"
00400 KEY 4 "START 7100 ' CLOSE"
00410 KEY 5 "START 7200 'RELEASE PART"
00415 '
00420 A=0:B=0:C=0:G=0:H=0:I=0:N=0:O=0:P=0:R=0:S=0:T=0:U=0
00425 '
00426 OUTPUT +OE0 200
00430 OUTPUT -OE12 -OE13 -OE14 -OE6 -OE7
00432 OUTPUT -OE1 -OE2 -OE3 +OE4 -OE5 -OE6   'OPEN,FREE & CENTER GRIP
00435 DELAY 500:OUTPUT -OE4
00440 SPEED 300: SHAVE: NOSYNC
00445 OUNIT 0:PRINT "INITIALIZED"
00450 Z=78
00455 OUNIT 1:IUNIT 1
00460 STOP
00470 '
00480 '-------------------------------
00490 MOVE T0
00500 PRINT "# 0-READY"
00510 STOP
00520 '
00530 '------------------------MAIN PROGRAM---------------------------
00540 '*
00542 'OUNIT 0:PRINT "N- ";N:OUNIT 1
00545 IF N<>-1 THEN 555 ELSE 546
00546 MOVE T0:GOTO 1330
```

```
00550  OUTPUT -OE1 -OE2 -OE3 +OE4 -OE5 -OE6   'OPEN,FREE & CENTER GRIP
00552  DELAY 300
00555 OUTPUT -OE4
00560   IF U>0 THEN 668
00570 FOR I=1 TO 20000
00580    IF IE12=1 THEN 620            '-> ADEPT CLEAR
00590    NEXT I
00600    PRINT "# " ;N; "=6"           '-> ADEPT NOT CLEAR
00610    GOTO 510
00620 OUTPUT -OE14
00625 FOR I=1 TO 10000
00630    IF IE14=1 THEN 665            '-> PART IN PLACE
00640    NEXT I
00642    IF U=0 THEN 650
00645       U=8:RETURN
00650    PRINT "# " ;N; "=8"           '-> PART NOT IN PLACE
00660    GOTO 510
00665 IF IE12=0 THEN 570
00668 OUTPUT +OE9                      '-> CLAMP PART
00670 OUTPUT +OE12                     '-> SIEKO IN COMMON ZONE
00675 T305=T306*(-1*H)
00680 MOVE T1+T305
00685  IF U=1 THEN RETURN
00690 OUTPUT -OE5 -OE4
00700 '
00720 IF A=1 THEN MOVE T1+T311
00730 IF A=2 THEN MOVE T1+T312
00740 IF A=3 THEN MOVE T1+T313
00750 IF A=4 THEN MOVE T1+T314
00760 IF IG0<>1 THEN 780                '-> TACTILE SENSOR CHECK
00765    IF R=1 THEN 5000               '    CHECK ONLY TWICE
00766    R=1:GOTO 680
00770 '
00780 'OUTPUT -OE6                      '-> GRIP CENTERING RETRACT
00790 'MOVE T1
00800 IF P=2 THEN 825
00805 OUTPUT +OE6:DELAY 50
00810 OUTPUT -OE1 +OE2 +OE3 '-> CLOSE GRIP; PRESSURE 1
00815  MOVE T1:DELAY 500:OUTPUT +OE5
00820  DELAY 60:GOTO 850
00825 OUTPUT +OE6:DELAY 50
00830 OUTPUT -OE2 +OE1 +OE3 '-> CLOSE GRIP; PRESSURE 2
00835  MOVE T1:DELAY 550:OUTPUT +OE5
00837  DELAY 60
00840 '
00850 OUTPUT -OE9:DELAY 50
00855 IF IG1=1 THEN 5000
00860 OUTPUT +OE13
00875 MOVE T1+T305
00880 IF IG1=1 THEN 5000
00882 IF IE14=0 THEN OUTPUT -OE13
00883 IF G=0 THEN G=-75
00884 T300=T306*(-1*G)
00885 MOVE T2+T300
00890 IF IE14=0 OR U>0 THEN 915
00900 FOR T= 1 TO 10000                 '-> WAITING FOR ADEPT TO
00901  IF IE14=0 THEN 915               '    ACCEPT PART GONE
00902 NEXT T:OUTPUT -OE3 +OE1 -OE2 +OE4
00903 DELAY 100: MOVE T1+T305 T0
00904   IF U=0 THEN 906
```

```
00905      U=16:RETURN
00906   GOTO 600   'ADEPT NOT CLEAR
00915  OUTPUT -OE12                           '-> SEIKO OUT OF COMMON ZONE
00920  SPEED 300
00922    IF U=2 THEN MOVE T2+T383
00924    IF U=2 THEN RETURN
00930  MOVE T2+T384
00934  SPEED 15
00935  IF IG0=1 THEN 960
00940  SEARCH +IG0 T2 THEN 960 ELSE 1110
00960    SPEED 150                            '-> TACTILE SENSE ROUTINE
00970    MOVE T2+T305
00980    SPEED 250: MOVE T2+T325: SPEED 300
00990    FOR S=330 TO 333                     '-> LOOP FOR ORBITAL ROUTINE
01000    MOVE T2+T325 T2+T325+T(S)
01010    NEXT S
01020    MOVE T2+T325
01030    SPEED 30: IF IG0=1 THEN 1050         '->CHECK TACTILE SENSOR
01040    SEARCH +IG0 T2 THEN 1050 ELSE 1110
01050    SPEED 300
01060    MOVE T2+T300
01065      IF U=0 THEN 1080
01070         U=15:OUTPUT -OE1 -OE2 -OE3:RETURN
01080    PRINT "# " ;N; "=5"                  '-> VALUE FOR BEC
01090    MOVE T2+T305: GOTO 510
01100    GOTO 510
01110  IF U=7 THEN RETURN
01115  OUTPUT -OE5
01120  SEARCH +IG0 T2+T385 THEN 1150
01125    SPEED 150:MOVE T2+T305 T0
01130      IF U=0 THEN 1140
01135         U=19:OUTPUT -OE1 -OE2 -OE3: RETURN
01140    PRINT "# " ;N; "=9"                  '-> NO TACTILE INPUT; CLINCH POSITIO
01145  GOTO 510
01150    HERE T399
01155    SPEED 150: MOVE T399+T386
01160    OUTPUT +OE5
01175  IF U>0 THEN 1240
01180  OUTPUT +OE0                            '-> SIGNAL TO CLINCH
01190  FOR J= 1 TO 10000
01200    IF IE1=1 THEN 1240                   '-> SIGNAL FROM CLINCH - DONE
01210    NEXT J
01220    C=7:PRINT "# ";N;"=7"                '-> NO SIGNAL FROM CLINCH
01228    IF IE13=1 AND IE14=0 THEN OUTPUT +OE14
01230  '
01240  OUTPUT -OE0                            '-> CLINCH SIGNAL OFF
01250  OUTPUT -OE3 -OE2 -OE1: DELAY 50        '-> FREE GRIP
01260  SPEED 300
01270  IF B=1 THEN MOVE T(2)+T320
01280  IF B=2 THEN MOVE T(2)+T321
01290  IF B=3 THEN MOVE T(2)+T322
01300  IF B=4 THEN MOVE T(2)+T323
01310  MOVE T(2)+T300
01320  OUTPUT -OE1 -OE2 -OE3 +OE4 -OE5 -OE6   '-> OPEN GRIP
01322    IF U>0 THEN RETURN
01325  IF C<>0 THEN 1340
01330  PRINT "# " ;N; "=1"                    '-> SIGNALS CYCLE COMPLETE
01332  OUNIT 0:PRINT N:"DONE":OUNIT 1
01335  IF IE13=1 AND IE14=0 THEN OUTPUT +OE14
01340  C=0:GOTO 510
```

```
01350 '
03000 '            * BEC ROUTINE *
03010 '
03020 MOVE T0 T350
03030 OUTPUT -OE1 -OE2 -OE3 +OE4          '-> OPEN GRIP: DUMP PART
03040 MOVE T0
03050 GOTO 510
03060 '
05000 '----------GRIP CHECK----------
05010 MOVE T1+T305 T0
05020   IF U=0 THEN 5040
05030     U=12:OUTPUT -OE1 -OE2 -OE3 +OE4 -OE5 -OE6
05035     RETURN
05040 PRINT "# " ;N; "=2"                 '> NO PART FOUND
05050 GOTO 510
05060 '
06000 '---------------------------F KEY COMANDS---------------------------
06010 '
07000 '------------ KEY 3 - OPEN GRIP-----------
07010 OUTPUT -OE1 -OE2 -OE3 +OE4: DELAY 500
07015 OUTPUT -OE4 -OE5 -OE6
07020 KEY 3 "DO OUTPUT -OE5 -OE6"
07025 'RETURN
07030 END
07100 '------------ KEY 4 - CLOSE GRIP----------
07110 OUTPUT -OE4 +OE6:DELAY 200
07112 OUTPUT -OE1 +OE2 +OE3: DELAY 400
07115 OUTPUT +OE5
07120 KEY 3 "START 7000 ' OPEN"
07125 'RETURN
07130 END
07200 '------------ KEY 5 - FREE GRIP-----------
07210 OUTPUT  -OE1 -OE2 -OE3
07215 'RETURN
07220 END
07230 '
07240 '-------------------------------------------------------------------
10000 '    TEACH PROGRAM
10010 T1=430. 300. 0. -60.
10020 H=0
10030 '
10040 U=1:OUTPUT -OE14 -OE13
10050 OUNIT 0:IUNIT 0
10060 KEY 2 "START 10110"
10070 GOSUB 668
10080 IF U<>1 THEN 10120
10090 PRINT " F2 <ENTER> TO RECORD PICK-UP POINT"
10100 STOP
10110 HERE T1
10120 KEY 2 "START 100"
10130 OUNIT 1:IUNIT 1
10140 IF U=1 THEN PRINT T1
10150 IF U=8 THEN PRINT "CLAMP MALFUNCION, RESTART PROGRAM"
10160 STOP
10170 '
10200 T2=500. 0. -50. 0.
10205 G=-50
10210 '
10220 U=2:OUTPUT -OE14 -OE13
10230 OUNIT 0:IUNIT 0
```

```
10240 KEY 2 "START 10290"
10250 GOSUB 550
10260 IF U<>2 THEN 10300
10270 PRINT " F2 <ENTER> TO RECORD INSERTION POINT"
10280 STOP
10290 HERE T2
10300 KEY 2 "START 100"
10310 'MOVE T2+T300
10330 OUNIT 1:IUNIT 1
10340 IF U=2 THEN PRINT T2
10350 IF U=12 THEN PRINT "NO PART FOUND AT PICK-UP POINT"
10360 IF U=16 OR U=8 THEN PRINT "CLAMP MALFUNCTION, RESTART PROGRAM"
10370 STOP
10380 '
10400 'BEC TEACHING
10600 U=4:OUTPUT -OE14 -OE13
10610 GOSUB 550
10620 IF U=4 OR U=7 THEN 10670
10630 IF U=12 THEN PRINT "NO PART FOUND AT PICK-UP"
10640 IF U=15 THEN PRINT "BAD INSERTION POINT"
10650 IF U=16 THEN PRINT "CLAMP MALFUNCTION, RESTART PROGRAM"
10660 IF U=19 THEN PRINT "IMPROPER TACTILE SENSING AT CLINCH POINT"
10670 IF U=7 THEN GOTO 10720
10675 STOP
10680 GOTO 100
10690 '
10700 U=7:OUTPUT -OE14 -OE13
10710 GOTO 10610
10720 OUNIT 0:IUNIT 0
10730 STOP
10740 OUNIT 1:IUNIT 1
10750 STOP
10760 '
10800 U=5
10810 SPEED 150
10815 T300=T306*(-1*G)
10820 GOSUB 1240
10830 SPEED 300
10840 STOP
15000 OUTPUT +OE9:DELAY 100
15010 OUTPUT -OE5 -OE6
15020 MOVE T278
15025 OUTPUT +OE6:MOVE T275:DELAY 100
15030 GOSUB 7100
15040 OUTPUT -OE9
15050 DELAY 100
15060 MOVE T276
15070 DELAY 6000
15080 MOVE T277
15090 GOSUB 7200
15100 GOSUB 7000
15110 'MOVE T275
15120 STOP:GOTO 15000
20000 '**** TESTS *****
20010 WAIT -IE1
20015 PRINT "BUSY-IE1=":PRINT IE1
20020 DELAY 2000
20030 OUTPUT +OE0 800
20040 WAIT +IE1
20050 PRINT "COMPLETE-IE1=":PRINT IE1
```

```
20060 GOTO 20000
20070 '
25000 WAIT +IE14
25005 DELAY 1000
25010 OUTPUT +OE13
25020 WAIT -IE14
25030 OUTPUT -OE13
25040 GOTO 25000
25050 '
30000 OUTPUT +OE7
30010 WAIT +IG3
30020 DELAY 1000
30025 WAIT -IG4
30030 OUTPUT -OE7
30040 WAIT +IG2
30050 DELAY 1000
30060 OUTPUT +OE3 +OE1
30070 DELAY 1000
30080 OUTPUT -OE3 -OE1
30090 DELAY 1000
30100 OUTPUT +OE4
30110 DELAY 300
30120 OUTPUT -OE4
30130 GOTO 30000
T0=      450.        0.         0.        0.
T1=      588.365   285.786    -23.82    -49.786
T2=      590.961  -179.858   -102.024    97.967
T3=        0.        0.         0.        0.
T10=     395.675     0.       -120.        0.
T11=     395.677   199.997   -120.      -26.816
T12=     395.687  -569.995   -120.       55.232
T110=      0.      -300.        0.        0.
T275=    533.895   347.638    -24.06    34.553
T276=    533.895   347.638    -12.024   34.553
T277=    533.895   347.638    -19.92    34.553
T278=    537.622   347.129    -23.196   34.553
T279=    444.049   237.981    -10.836   -8.801
T280=    584.244   296.832    -29.352  -52.099
T281=    478.161  -140.941   -107.244    7.072
T284=    588.365   285.786    -23.82   -49.786
T300=      0.        0.       102.        0.
T305=      0.        0.        23.        0.
T306=      0.        0.         1.        0.
T311=      4.       -1.         0.        0.
T312=     -4.        1.         0.        0.
T313=      1.        4.         0.        0.
T314=     -1.       -4.         0.        0.
T320=      0.2       0.         0.        0.
T321=     -0.2       0.         0.        0.
T322=      0.        0.2        0.        0.
T323=      0.       -0.2        0.        0.
T325=      0.        0.         2.5       0.
T330=      0.4       0.         0.        0.
T331=      0.        0.4        0.        0.
T332=     -0.4       0.         0.        0.
T333=      0.       -0.4        0.        0.
T350=    500.        0.         0.        0.
T383=      0.        0.        10.        0.
T384=      0.        0.         2.        0.
T385=      0.        0.        -5.        0.
T386=      0.        0.        -4.        0.
T399=    590.961  -179.858   -103.896    97.967
END
```

What is claimed is:

1. A system for active clinching of component leads after insertion thereof from an upper side of a circuit board and through apertures in the board to extend from the lower surface thereof, comprising:
   a clinching element for contracting and bending said leads;
   means for driving said clinching element through a programmably determined path of travel substantially within a plane adjacent said lower surface in response to control signals to contact and bend one or more leads of said component adjacent said lower surface of said board;
   programmable controller means adapted to provide control signals to said drive means so as to pass said clinching element through a programmably determined sequence of movements substantially within said plane to contact and bend one or more leads of said component to secure said component in its inserted position, and wherein the clinching element effects the bending of a lead by running into the lead during the course of its programmably determined travel.

2. The system of claim 1 wherein said clinching element comprises a rounded clinch tool whose size is proportioned in relation to the component lead size and spacing so as to provide the capability of clinching a single component lead during a clinch movement.

3. The system of claim 1 further comprising means for positioning said clinching element at a clinch position directly adjacent the lower surface for contacting and bending said leads, or at a retracted position disposed well apart from the lower surface so as to not contact downwardly extending leads.

4. The system of claim 1 wherein said drive means is adapted to programmably drive said clinch element in lateral and longitudinal directions within said plane, and said drive means comprises a first drive means for driving said clinch element in the lateral direction, and a second drive means for driving said clinch element in said longitudinal direction.

5. The system of claim 4 wherein said first and second axis define said plane which is substantially parallel to the lower side of said printed circuit board.

6. A robotic component insertion system for assembly of electrical components to printed circuit boards, comprising:
   an insertion station for securing at least one circuit board in a predetermined board position;
   programmable insertion robot means for gripping said components and inserting them into predetermined locations in said circuit board; and
   clinching means for clinching one or more leads of the components after said leads of each component have been inserted from a first side of said board through apertures in the board to extend from a second surface thereof, comprising:
   a clinch element for contacting and bending said leads;
   programmable drive means for driving said clinch element through a programmable clinch movement sequence substantially within a plane adjacent said second surface in response to control signals for blending at least one lead of the inserted component as it is gripped by the robot means in the inserted position; and
   programmable controller means for providing control signals to said drive means so as to pass said clinching element through a programmably determined sequence of movements substantially within said plane to contact and bend one or more leads of said component to secure said component in its inserted position, wherein the clinching element effects the bending of a lead by running into the lead during the course of its programmably determined travel.

7. The invention of claim 6 wherein said programmable drive means comprises first means for driving said clinch element throughout said programmable clinch movement sequence in said plane disposed substantially parallel to and adjacent said second surface of said circuit board, and said second drive means for selectively extending the clinch element from a retracted position in relation to said second surface of said circuit board to a clinch position directly adjacent said second surface for contacting and bending said leads.

8. The invention of claim 6 further comprising a component presentation station, and wherein said robot means comprises means for sequentially gripping components presented at said presentation stage and inserting such components into the printed circuit board at predetermined locations.

9. The invention of claim 8 wherein said programmable robot further comprises an end effector attached to a robot arm for gripping such components, the end effector comprising:
   (i) gripping means for gripping such components; and
   (ii) compliance means for coupling said gripping means to said robot arm, said compliance means selectively operable in a first state wherein the location of said gripping means is movable through a predetermined range of movement with respect to the robot arm and in a second state wherein the lateral location of said gripping mechanism is substantially fixed with respect to said robot arm.

10. The invention of claim 6 further comprising a transport means for transporting a printed circuit board to said insertion station and locating said printed circuit board at a predetermined location with respect to said insertion robot means.

11. The invention of claim 10 wherein said transport means comprises a motor driven conveyor system which is adapted to convey said circuit board to said insertion station in response to motor drive signals.

12. The invention of claim 11 further comprising central controller means adapted to control the operation of said transport means, said insertion robot means and said clinching means.

13. In a component insertion system, the improvement comprising:
   component feeder means for storing a plurality of components;
   robot means for sequentially picking up components from said component feeder means and delivering said components to a presentation station, said robot means comprising a robot controller for controlling the operation of said robot means;
   lead straightening plate disposed at said presentation station, said plate having an opening pattern defined therein in correspondence with the lead pattern of the component;

said robot comprising means for inserting the component leads into said opening pattern of said plate, and thereafter, with said plate fixedly positioned, moving the component body through a predetermined series of oscillatory movements so as to respectively exercise the component leads to substantially straighten the leads.

14. The invention of claim 13 wherein said opening pattern formed in said lead straightening plate is adapted to accommodate the respective lead patterns of a plurality of component types.

15. The invention of claim 13 wherein said robot means is adapted to select one of a plurality of types of components available at said feeder means, and wherein said series of oscillatory movements is adapted to the selected type of component.

16. The invention of claim 13 further comprising cutting means for cutting the leads of the selected component to a predetermined length.

17. The invention of claim 16 wherein said cutting means comprises:
a shear plate disposed in sliding relation with said straightening plate, said shear plate including an opening pattern corresponding to the opening pattern formed in said straightening plate;
means for disposing said shear plate in an aligned position relative to said straightening plate so that the corresponding hole patterns in each plate are aligned;
means for exerting a sliding shear force on said shear plate so as to shear the component leads extending into the opening pattern formed in said shear plate.

18. A robotic component insertion system, comprising:
an insertion station;
circuit board transferring and locating system for transferring a circuit board to said insertion station at a predetermined reference position;
a component presentation station;
a plurality of component feeder devices for feeding a plurality of types of components;
presentation robot means for sequentially selecting predetermined ones of said components from said feeder devices and delivering the selected components to said presentation station;
insertion robot means for sequentially picking up said selected components at said presentation station and inserting said selected components at predetermined locations on said board; and
active clinching means for clinching leads of said selected components to said board after insertion of said leads through an aperture pattern in said board to extend from a surface of said board, said means comprising:
an active clinching element for contacting and bending said leads;
programmable drive means for actively driving said clinch element through a programmable clinch movement sequence substantially within a plane adjacent said board surface in response to control signals for bending at least one lead of the inserted component as it is gripped by said insertion robot means in the inserted position; and
programmable controller means adapted to provide control signals to said drive means so as to pass said clinching element through a programmably determined sequence of movements substantially within said plane to contact and bend one or more leads of said component to secure said component in its inserted position, wherein the clinching element effects the bending of a lead by running into the lead during the course of its programmably determined travel.

19. The system of claim 18 further comprising lead straightening means for straightening the leads of said selected components before insertion into said circuit board.

20. The system of claim 19 further comprising cutting means for cutting the leads of said selected components to a predetermined length prior to insertion in said circuit board.

21. The system of claim 18 further comprising programmable system controller for controlling said presentation and insertion robot means and said clinching means.

22. The system of claim 21 wherein said system controller means comprises memory means for storing data representative of the components to be inserted into said board, the sequence in which said components are to be inserted and the respective positions at which said components are to be inserted.

23. The system of claim 22 wherein said system controller memory means is further adapted to store clinch data for the respective components to be inserted in said board, said clinch data including data defining the predetermined clinch system movement required to clinch the leads of such components.

24. The system of claim 22 wherein said memory means further comprises data indicative of the positions of the respective feeder means.

25. In a robotic component insertion system for inserting in circuit boards a plurality of different types of electrical components having at least one lead depending from the component body, wherein the system includes an insertion station, a presentation station, a plurality of component feeder devices disposed at predetermined locations, a presentation robot for sequentially selecting predetermined ones of the components from the feeder devices and delivering the components to the presentation station, a lead straightening plate disposed at the presentation station having an opening pattern defined therein in correspondence with the lead pattern of the respective components, and an insertion robot for sequentially gripping the selected components at the insertion station and inserting the selected components at predetermined locations on the circuit board, a method for inserting said components into said circuit board, comprising a sequence of the following steps:
securing the printed circuit board at said insertion station;
using the presentation robot to sequentially select predetermined components from said feeder devices and present the selected components to said presentation station, insert the leads of the component in the corresponding openings of the lead straightening plate, move the component body through a predetermined series of oscillatory movements with the leads so inserted so as to respectively exercise and thereby substantially straighten the component leads, and thereafter release the component at said presentation station;
using the insertion robot to sequentially pick up said selected components at said presentation station in coordination with said presentation robot means, and thereafter to insert the selected component at a predetermined location in the board; and actively clinching the leads of the inserted component while gripped by the insertion robot.

26. The system of claim 3 wherein said means for positioning said clinching element comprises means for extending and retracting said element along a clinching axis extending substantially perpendicular to said lower surface, and wherein said positioning means is controlled by said programmable controller means.

27. The system of claim 26 wherein said positioning means comprises a cylinder and piston assembly, said assembly mounted for piston travel along said axis, and said clinching element being carried by said piston.

28. The system of claim 5 further comprising means for positioning said clinching element at a clinch position directly adjacent the lower surface for contacting and bending said leads, or at a retracted position disposed well apart from the lower surface so as not to contact downwardly extending leads.

29. The system of claim 28 wherein said means for positioning said clinching element comprises means for extending and retracting said element along a clinching axis extending substantially perpendicular to said lower surface, and wherein said positioning means is controlled by said programmable controller means.

30. The system of claim 29 wherein said positioning means comprises an cylinder and piston assembly, said assembly mounted for piston travel along said axis, and said clinching element being carried by said piston.

31. The system of claim 1 wherein a computer programmed with data defining the particular movement sequence through which said clinching element is to be driven for a particular circuit board and the particular components to be inserted in said board.

32. The system of claim 5 wherein said drive means comprises:

an upper carriage assembly supported for lateral movement by a lateral support element having first and second ends;

first and second opposed longitudinal support elements;

first and second lower carriage assemblies, said first end of said lateral support element mounted in said first lower assembly and said second end of said support element mounted in said second lower assembly;

said first lower carriage assembly carried for longitudinal movement on said first longitudinal support element;

said second lower carriage assembly carried for longitudinal movement on said second longitudinal support element;

said first drive means for driving said upper carriage assembly in said lateral direction along the lateral extent of said lateral support element; and said second drive means for driving said first and second lower assemblies in said longitudinal direction along the longitudinal extents of said longitudinal support elements.

33. The invention of claim 17 wherein said means for exerting a sliding shear force on said shear plate comprises a pneumatic cylinder and piston assembly.

34. The system of claim 18 wherein said presentation robot means is capable of controlled movement along each of the orthogonal X, Y and Z axes, and said component feeder devices comprise a plurality of tube feeders, each for storing a plurality of components having in-line leads and presenting one of said stored components at a corresponding feeder pickup location which is directly accessible by said presentation robot independent of the others of said tube feeders.

35. The system of claim 34 wherein said tube feeder devices are disposed at an angle with respect to the horizontal to provide for gravity feeding of successive components therefrom, and said tube feeders each further comprises a retaining means for retaining the next available component at said pickup location until said feeder device is accessed by said presentation robot.

36. The system of claim 35 wherein said presentation robot comprises an end effector having a pair of gripping jaws, and means for controlling the attitude of said jaws relative to the horizontal to a first attitude aligned with said tube feeder for gripping said components at said pickup locations and to a second attitude aligned with the horizontal to deliver said components to said presentation station.

37. A robotic component insertion system, comprising:

an insertion station at which a circuit board is located;

a component presentation station;

a plurality of component tube feeder devices for feeding a plurality of types of components, each for storing a plurality of components having in-line leads and presenting one of said stored components at a corresponding feeder pickup location which is directly accessible independent of the feeder locations of the other tube feeders;

presentation robot means comprising means for controlled movement along each of the orthogonal X, Y and Z axes for sequentially picking up said selected components from said feeder devices at said respective feeder pickup locations and delivering said selected components to said presentation station; and insertion robot means for sequentially picking up said components at said presentation station and inserting said components at predetermined locations in said circuit board.

38. The system of claim 37 wherein said tube feeder devices are disposed at an angle with respect to the horizontal to provide for gravity feeding of successive components therefrom, and said tube feeders each further comprises a retaining means for retaining the next available component at said pickup location until said feeder device is accessed by said presentation robot.

39. The system of claim 38 wherein said presentation robot comprises an end effector having a pair of gripping jaws, and means for controlling the attitude of said jaws relative to the horizontal to a first attitude aligned with said tube feeders for gripping said components at said pickup locations and to a second attitude aligned with the horizontal to deliver said components to said presentation station.

40. The system of claim 1 further comprising tactile sensing means for detecting whether a lead has been successfully clinched and providing an output signal to the controller means indicative of successful clinching.

41. A system for active clinching of component leads after insertion thereof from an upper side of a circuit board and through apertures in the board to extend from the lower surface thereof, thereby to secure the component in its inserted position, comprising a clinching element for bending the leads, and means for driving the clinching element through a programmably determined path substantially parallel to and adjacent the lower surface of the board in response to control signals, the system further characterized in that the clinching element effects the bending of a lead by running into the lead during the course of its programmably determined travel, and by a programmable controller adapted to provide control signals to the drive means so as to pass the clinching element through a programmably determined sequence of movements such that the clinching element contacts and bend one or more leads of the component.

42. The system of claim 41, further characterized in that the clinching element comprises a rounded clinch tool whose size is proportioned in relation to the component lead size and spacing so as to provide the capability of clinching a single component lead during a clinch movement.

43. The system of claim 41, further characterized by means for positioning the clinching element at a clinch position directly adjacent the lower surface for contacting and bending the leads, or at a retracted position well away from the lower surface, so as not to contact downwardly extending leads.

44. The system of claim 43, characterized in that the means for positioning the clinching element comprise means for extending and retracting this element along an axis extending substantially perpendicular to the lower surface of the circuit board, and in that positioning means is controlled by the programmable controller.

45. In a robotic component insertion system including a presentation station, at least one component feeder means for storing a plurality of components, a robot for sequentially picking up components from said component feeder means and delivering the components to the presentation station, and a lead straightening plate disposed at the presentation station and including an opening pattern defined therein in correspondence with the lead pattern of the components; a method for straightening the leads of said components, comprising a sequence of the following steps:

using the robot to grip a component by its body at the component feeder; and using the robot to insert the leads of the gripped component into the opening pattern of said lead straightening plate and thereafter move the component body through a predetermined series of oscillatory movements so as to respectively exercise the component leads to substantially straighten the leads.

46. A component lead straightening and cutting apparatus, comprising:

component feeder means for storing a plurality of components each characterized by a component body and one or more component leads depending from the body;

robot means for sequentially picking up components from said component feeder means and delivering said components to a presentation station, said robot means comprising a robot controller for controlling the operation of said robot means;

lead straightening plate disposed at said presentation station, said plate having an opening pattern defined therein in correspondence with the lead pattern of the component;

said robot comprising means for inserting the component leads into said opening pattern of said plate;

means for providing relative movement between the component body and said plate with the body gripped by the robot and the leads inserted in said opening pattern so as to provide a predetermined series of relative oscillatory movements therebetween, thereby respectively exercising the component leads to substantially straighten the leads; and cutting means in cooperation with said lead straightening plate for cutting the leads of the selected component to a predetermined length.

47. The apparatus of claim 46 wherein said opening pattern formed in said lead straightening plate is adapted to accommodate the respective lead patterns of a plurality of component types.

48. The apparatus of claim 46 wherein said robot means is adapted to select one of a plurality of types of components available at said feeder means, and wherein said series of oscillatory movements is adapted to the selected type of component.

49. The apparatus of claim 46 wherein said cutting means comprises:

a shear plate disposed in sliding relation with said straightening plate, said shear plate including an opening pattern corresponding to the opening pattern formed in said straightening plate;

means for disposing said shear plate in an aligned position relative to said straightening plate so that the corresponding hole patterns in each plate are aligned; and means for exerting a sliding shear force on said shear plate so as to shear the component leads extending into the opening pattern formed in said shear plate.

50. The apparatus of claim 46 wherein said series of oscillatory movements comprise relative movements between the component body and the plate in four directions x, −x, +y, −y a predetermined distance away from the central inserted position.

51. The apparatus of claim 50 wherein the predetermined distance is to a minimum yield point at which the component leads no longer spring back or return to the initial position.

* * * * *